(12) United States Patent
Yamazaki

(10) Patent No.: US 9,704,707 B2
(45) Date of Patent: Jul. 11, 2017

(54) OXIDE AND MANUFACTURING METHOD THEREOF

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 15/010,377

(22) Filed: Jan. 29, 2016

(65) Prior Publication Data

US 2016/0225620 A1  Aug. 4, 2016

(30) Foreign Application Priority Data

Feb. 2, 2015  (JP) ................. 2015-018610

(51) Int. Cl.
| | | |
|---|---|---|
| H01L 29/12 | (2006.01) | |
| H01L 21/02 | (2006.01) | |
| H01L 29/24 | (2006.01) | |
| H01L 29/04 | (2006.01) | |
| C23C 14/08 | (2006.01) | |
| C23C 14/34 | (2006.01) | |
| H01L 27/06 | (2006.01) | |
| H01L 27/092 | (2006.01) | |
| H01L 27/108 | (2006.01) | |
| H01L 27/1156 | (2017.01) | |
| H01L 21/8258 | (2006.01) | |

(52) U.S. Cl.
CPC ........ *H01L 21/02565* (2013.01); *C23C 14/08* (2013.01); *C23C 14/3414* (2013.01); *H01L 21/02554* (2013.01); *H01L 21/02609* (2013.01); *H01L 21/02631* (2013.01); *H01L 27/0688* (2013.01); *H01L 27/092* (2013.01); *H01L 29/045* (2013.01); *H01L 29/24* (2013.01); *H01L 21/8258* (2013.01); *H01L 27/10805* (2013.01); *H01L 27/1156* (2013.01)

(58) Field of Classification Search
CPC ................ H01L 21/02565; H01L 29/7869
See application file for complete search history.

(56) References Cited

U.S. PATENT DOCUMENTS

| | | | |
|---|---|---|---|
| 5,528,032 A | 6/1996 | Uchiyama | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,049,258 B2 | 5/2006 | Ohsato et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 9,478,603 B2 * | 10/2016 | Yamazaki | ............. H01L 29/045 |
| 9,478,668 B2 * | 10/2016 | Takahashi | ........... H01L 29/7869 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |

(Continued)

FOREIGN PATENT DOCUMENTS

| | | |
|---|---|---|
| EP | 1422208 A | 5/2004 |
| EP | 1737044 A | 12/2006 |

(Continued)

OTHER PUBLICATIONS

International Search Report (Application No. PCT/IB2016/050389) Dated Apr. 5, 2016.
Written Opinion (Application No. PCT/IB2016/050389) Dated Apr. 5, 2016.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

(Continued)

*Primary Examiner* — Dung Le
(74) *Attorney, Agent, or Firm* — Robinson Intellectual Property Law Office; Eric J. Robinson

(57) ABSTRACT

Provided is an oxide with a novel crystal structure, an oxide with high crystallinity, or an oxide with low impurity concentration. An oxide has a hexagonal atomic arrangement in the case of a single crystal. The oxide has a homologous structure of indium, an element M (aluminum, gallium, yttrium, or tin), and zinc. The oxide has a lattice point group observed through an analysis of a first region in a transmission electron microscopy image of a top surface of the oxide. In a Voronoi diagram having a plurality of Voronoi regions obtained through a Voronoi analysis of the lattice point group, a proportion of hexagonal Voronoi regions is higher than or equal to 78% and lower than or equal to 100%.

9 Claims, 64 Drawing Sheets

(56) References Cited

U.S. PATENT DOCUMENTS

| | | |
|---|---|---|
| 2004/0127038 A1 | 7/2004 | Carcia et al. |
| 2004/0242403 A1 | 12/2004 | Ohsato et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2014/0001032 A1 | 1/2014 | Yamazaki |
| 2014/0346500 A1 | 11/2014 | Yamazaki |
| 2015/0318171 A1 | 11/2015 | Yamazaki |
| 2016/0118254 A1 | 4/2016 | Yamazaki |
| 2016/0190346 A1 | 6/2016 | Kawata et al. |
| 2016/0247902 A1 | 8/2016 | Yamazaki |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2013-084735 A | 5/2013 |
| JP | 2015-005731 A | 1/2015 |
| WO | WO-03/016237 | 2/2003 |
| WO | WO-2004/114391 | 12/2004 |
| WO | WO-2014/188983 | 11/2014 |

OTHER PUBLICATIONS

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H at al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZNO Thin-Film Transistors Produced At Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

(56) References Cited

OTHER PUBLICATIONS

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission Amoled Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 As a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000 ° C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Techncial Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White TANDEM OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZNO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m <4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

(56) References Cited

OTHER PUBLICATIONS

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by PEALD Grown ZNO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2006, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Kamiya.T et al., "Electron-Beam-Induced Crystallization of Amorphous In—Ga—Zn—O Thin Films Fabricated by UHV Sputtering", IDW '13 : Proceedings of the 20th International Display Workshops, Dec. 4, 2013, pp. 280-281.
Yamazaki.S et al., "Properties of crystalline In—Ga—Zn-oxide semiconductor and its transistor characteristics", Jpn. J. Appl, Phys. (Japanese Journal of Applied Physics), Apr. 1, 2014, vol. 53, No. 4, pp. 04ED18-1-04ED18-10.
Yamazaki.S et al., "Back-channel-etched thin-film transistor using c-axis-aligned crystal In—Ga—Zn oxide", J. Soc. Inf. Display (Journal of the Society for Information Display), 2014, vol. 22, No. 1, pp. 55-67.
Yamazaki.S, "Crystalline Oxide Semiconductor Using CAAC-IGZO and its Application", ECS Transactions, Oct. 1, 2014, vol. 64, No. 10, pp. 155-164, The Electrochemical Society.
Hosemann.R, "Crystalline and Paracrystalline Order in High Polymers", J. Appl. Phys. (Journal of Applied Physics), Jan. 1963, vol. 34, No. 1, pp. 25-41.

\* cited by examiner

- In
- Ga
- Zn
- O
- bonding position

● In
○ Gd
● Zn
· O
◌ ○ bonding position 2 nm 2 nm

-Voronoi region

-Voronoi point

-lattice point

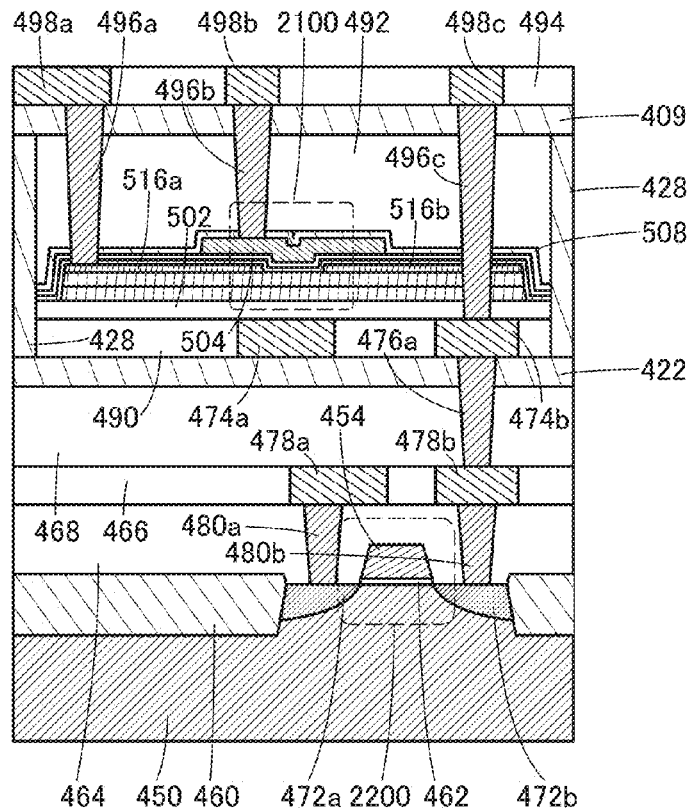
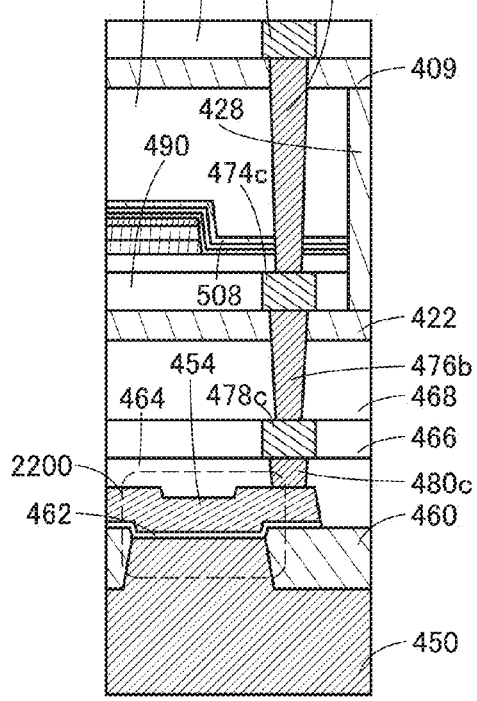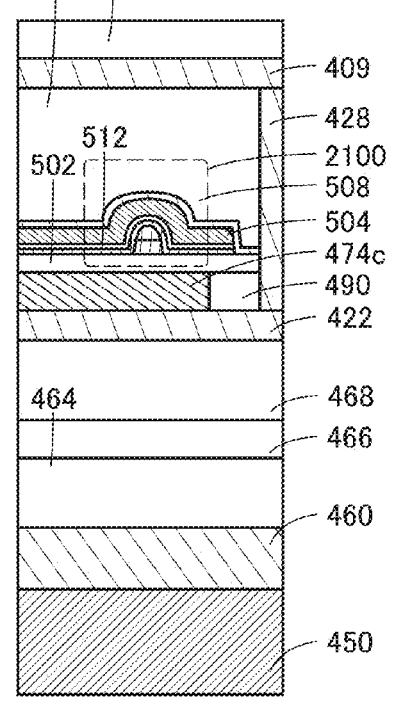
FIG. 46A
FIG. 46B
FIG. 46C

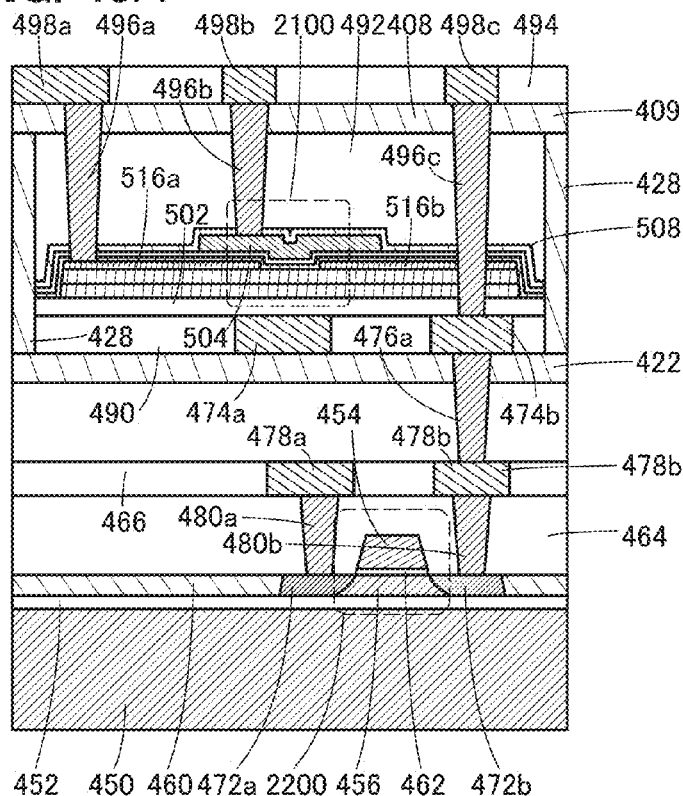
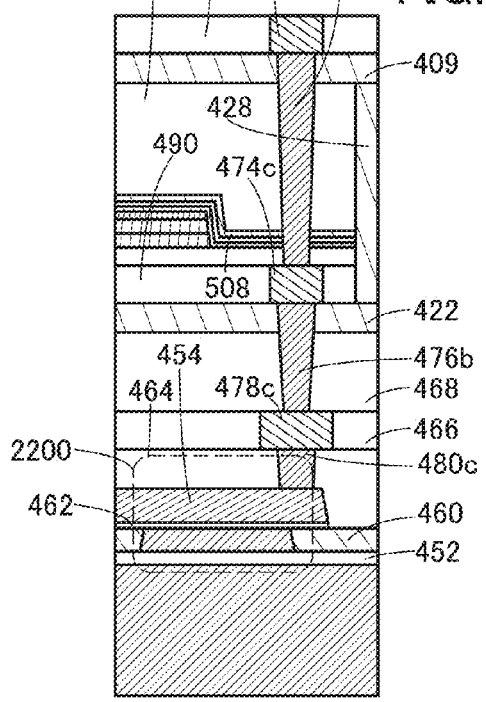
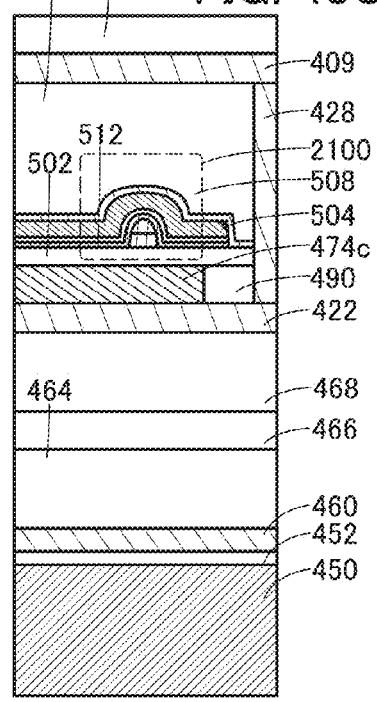

FIG. 53A
FIG. 53B
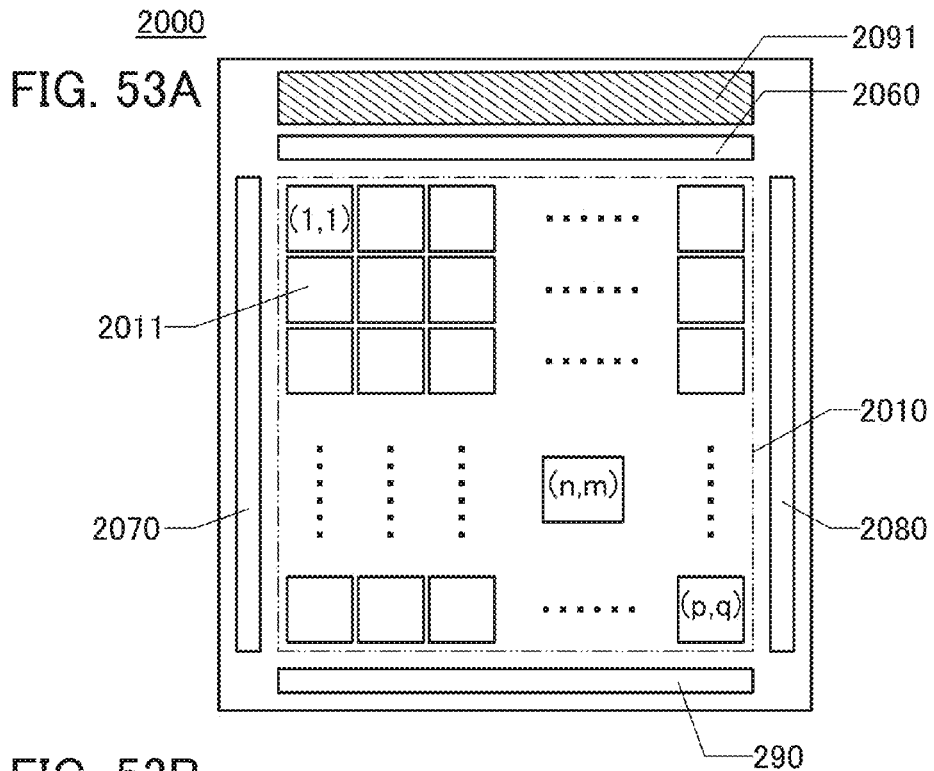
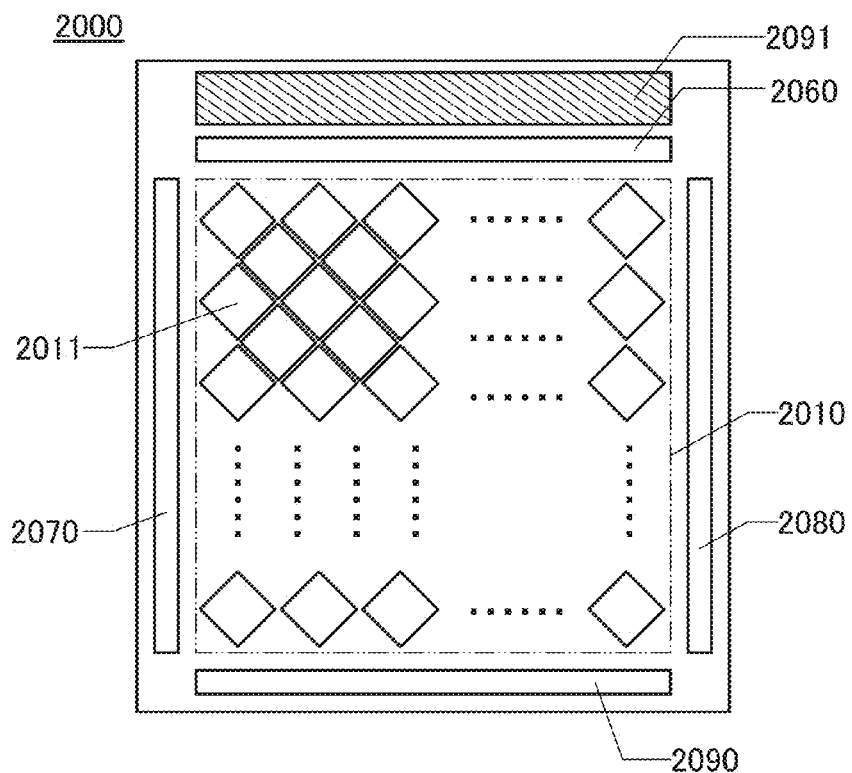

FIG. 58A1
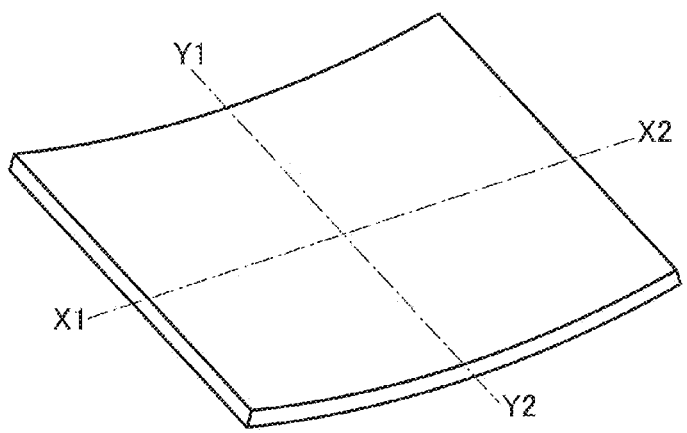
FIG. 58A2
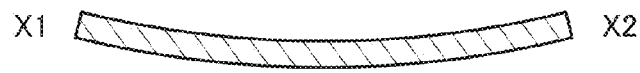
FIG. 58A3
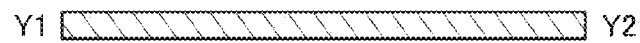
FIG. 58B1
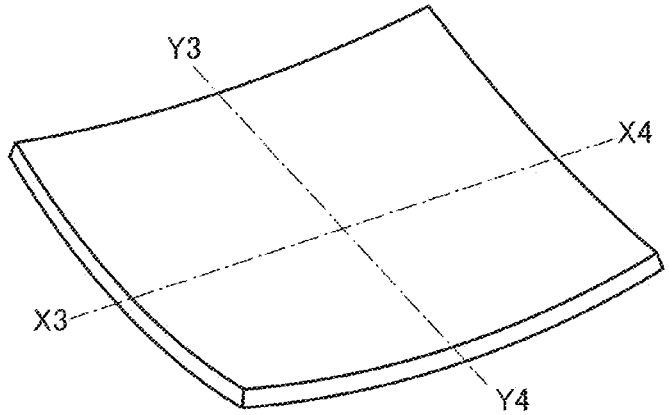
FIG. 58B2
FIG. 58B3

OXIDE AND MANUFACTURING METHOD THEREOF

TECHNICAL FIELD

One embodiment of the present invention relates to an oxide and a manufacturing method thereof.

The present invention relates to, for example, an oxide, a transistor, a semiconductor device, and manufacturing methods thereof. The present invention relates to, for example, an oxide, a display device, a light-emitting device, a lighting device, a power storage device, a memory device, an imaging device, a processor, or an electronic device. The present invention relates to a manufacturing method of an oxide, a display device, a liquid crystal display device, a light-emitting device, a memory device, an imaging device, or an electronic device. The present invention relates to a driving method of a semiconductor device, a display device, a liquid crystal display device, a light-emitting device, a memory device, or an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an imaging device, an electro-optical device, a semiconductor circuit, and an electronic device include a semiconductor device in some cases.

BACKGROUND ART

A technique for forming a transistor by using a semiconductor over a substrate having an insulating surface has attracted attention. The transistor is applied to a wide range of semiconductor devices such as an integrated circuit and a display device. Silicon is known as a semiconductor applicable to a transistor.

As silicon which is used as a semiconductor of a transistor, either amorphous silicon or polycrystalline silicon is used depending on the purpose. For example, in the case of a transistor included in a large display device, it is preferable to use amorphous silicon, which can be used to form a film on a large substrate with the established technique. In the case of a transistor included in a high-performance display device where a driver circuit and a pixel circuit are formed over the same substrate, it is preferred to use polycrystalline silicon, which can form a transistor having high field-effect mobility. It is known that polycrystalline silicon can be formed as a result of heat treatment at high temperatures or laser light treatment on amorphous silicon.

In recent years, transistors including oxide semiconductors (typified by an In—Ga—Zn oxide) have been actively developed.

Oxide semiconductors have been researched since early times. In 1988, it was disclosed to use an In—Ga—Zn oxide crystal for a semiconductor element (see Patent Document 1). In 1995, a transistor including an oxide semiconductor was invented, and its electrical characteristics were disclosed (see Patent Document 2).

In 2013, one group reported that an amorphous In—Ga—Zn oxide had an unstable structure in which crystallization is induced by irradiation with an electron beam (see Non-Patent Document 1). According to the report, no ordering was observed with a high-resolution transmission electron microscope in the amorphous In—Ga—Zn oxide formed by the group.

In 2014, a transistor including a crystalline In—Ga—Zn oxide that has more excellent electrical characteristics and higher reliability than a transistor including an amorphous In—Ga—Zn oxide was reported (see Non-Patent Document 2, Non-Patent Document 3, and Non-Patent Document 4). These documents reported that a grain boundary was not clearly observed in an In—Ga—Zn oxide including a c-axis aligned crystalline oxide semiconductor (CAAC-OS).

As a kind of polymer crystal structure, a concept of "paracrystal" is known. A paracrystal seemingly has a trace of crystal lattice; however, compared with an ideal single crystal, the paracrystal has a distorted crystal structure (see Non-Patent Document 5).

REFERENCE

Patent Documents

[Patent Document 1] Japanese Published Patent Application No. S63-239117
[Patent Document 2] Japanese Translation of PCT International Application No. H11-505377

Non-Patent Documents

[Non-Patent Document 1] T. Kamiya, K. Kimoto, N. Ohashi, K. Abe, Y. Hanyu, H. Kumomi, and H. Hosono, Proceedings of *The 20th International Display Workshops*, 2013, AMD2-5L
[Non-Patent Document 2] S. Yamazaki, H. Suzawa, K. Inoue, K. Kato, T. Hirohashi, K. Okazaki, and N. Kimizuka, *Japanese Journal of Applied Physics*, Vol. 53, 2014, 04ED18
[Non-Patent Document 3] S. Yamazaki, T. Hirohashi, M. Takahashi, S. Adachi, M. Tsubuku, J. Koezuka, K. Okazaki, Y. Kanzaki, H. Matsukizono, S. Kaneko, S. Mori, and T. Matsuo, *Journal of the Society for Information Display*, Vol. 22, Issue 1, 2014, pp. 55-67
[Non-Patent Document 4] S. Yamazaki, *The Electrochemical Society Transactions*, Vol. 64(10), 2014, pp. 155-164
[Non-Patent Document 5] Rolf Hosemann, *Journal of Applied Physics*, Vol. 34, Number 1, 1963 January, pp. 25-41

DISCLOSURE OF INVENTION

An object of one embodiment of the present invention is to provide an oxide with a novel crystal structure. Another object is to provide an oxide with high crystallinity. Another object is to provide an oxide with low impurity concentration.

Another object is to provide a semiconductor device using an oxide as a semiconductor. Another object is to provide a module including a semiconductor device using an oxide as a semiconductor. Another object is to provide an electronic device that includes a semiconductor device using an oxide as a semiconductor or includes a module including a semiconductor device using an oxide as a semiconductor.

Another object is to provide a transistor with favorable electrical characteristics. Another object is to provide a transistor with stable electrical characteristics. Another object is to provide a transistor with high frequency characteristics. Another object is to provide a transistor having low off-state current. Another object is to provide a semiconductor device including any of the above transistors. Another object is to provide a module including the semiconductor device. Another object is to provide an electronic device including the semiconductor device or the module.

Note that the descriptions of these objects do not preclude the existence of other objects. In one embodiment of the present invention, there is no need to achieve all the objects. Other objects will be apparent from and can be derived from the descriptions of the specification, the drawings, the claims, and the like.

(1) One embodiment of the present invention is an oxide having a hexagonal atomic arrangement in the case of a single crystal. The oxide has a homologous structure of indium, an element M (aluminum, gallium, yttrium, or tin), and zinc. The oxide has a lattice point group observed through an analysis of a first region in a transmission electron microscopy image of a top surface of the oxide. In a Voronoi diagram having a plurality of Voronoi regions obtained through a Voronoi analysis of the lattice point group, a proportion of hexagonal Voronoi regions is higher than or equal to 78% and lower than or equal to 100%.

(2) One embodiment of the present invention is an oxide with crystallinity having a hexagonal atomic arrangement in the case of a single crystal. The oxide has a homologous structure of indium, an element M (aluminum, gallium, yttrium, or tin), and zinc. The oxide has a lattice point group observed through an analysis of a first region in a transmission electron microscopy image of a top surface of the oxide. The lattice point group includes a plurality of lattice points. The plurality of lattice points include a first lattice point, and second to seventh lattice points adjacent to the first lattice point. In the first region, an average strain rate is less than 0.2. The strain rate is obtained in the following manner: a regular hexagon in which a distance between a center point and a vertex is an average distance between the first lattice point and each of the second to seventh lattice points is provided such that the center point overlaps with the first lattice point; the regular hexagon is rotated around the center point such that an average deviation amount between the vertex of the regular hexagon and each of the second to seventh lattice points becomes as small as possible; and the average deviation amount is divided by the distance between the center point and the vertex of the regular hexagon.

(3) One embodiment of the present invention is the oxide of (1) or (2), in which the plurality of lattice points included in the lattice point group are points with maximal luminance in a fourth image. The fourth image is obtained in the following manner: the first region is subjected to fast Fourier transform to obtain a first image; the first image is subjected to mask processing except for a range from 2.8 nm$^{-1}$ to 5.0 nm$^{-1}$ to obtain a second image; the second image is subjected to inverse fast Fourier transform to obtain a third image; and noise is removed from the third image.

(4) One embodiment of the present invention is the oxide of (3), in which luminance within a 0.05-nm radius in the third image is averaged to remove noise.

(5) One embodiment of the present invention is the oxide of (3) or (4), in which the points with maximal luminance are obtained in the following manner: a first step of extracting a second point with highest luminance within a 0.22-nm radius from a first point in the fourth image and a second step of extracting a third point with highest luminance within a 0.22-nm radius from the second point are repeated until a point with a highest luminance is fixed as one of the points with maximal luminance; and the others of the points with maximal luminance are determined in a manner similar to that for the one of the points with maximal luminance using a point more than 0.22 nm away from the one of the points with maximal luminance as the first point.

(6) One embodiment of the present invention is an oxide with a crystal structure that might have a homologous structure. The oxide contains indium, an element M (aluminum, gallium, yttrium, or tin), and zinc. The oxide includes a plurality of flat-plate-like crystal regions. C-axes of the crystal regions are approximately parallel to a normal vector of a top surface of the oxide. In a transmission electron microscopy image of a cross section of the oxide taken along a plane perpendicular to the top surface, an average size of the crystal regions in a direction parallel to the top surface of the oxide is larger than 3 nm. No clear grain boundary is observed between the crystal regions.

(7) One embodiment of the present invention is a manufacturing method of an oxide, which is a sputtering method using a deposition chamber, and a target and a substrate in the deposition chamber. The target contains indium, zinc, an element M (aluminum, gallium, yttrium, or tin), and oxygen. The target includes a region with a polycrystalline structure and a cleavage plane. In the manufacturing method, after a sputtering gas containing oxygen and/or a rare gas is supplied to the deposition chamber, a potential difference is given between the target and the substrate to generate plasma containing an ion of the sputtering gas in the vicinity of the target. The ion of the sputtering gas is accelerated toward the target because of the potential difference. The accelerated ion of the sputtering gas collides with the target, so that bond cut occurs from an end portion of the cleavage plane. The bond cut is promoted when a charge from the plasma is received. A plurality of crystalline flat-plate-like particles of a compound containing a plurality of elements, atoms contained in the target, and aggregates of the atoms contained in the target are separated from the target by the collision of the accelerated ion. The plurality of flat-plate-like particles receive negative charges from oxygen ions and have their surfaces negatively charged while flying in the plasma. One of the plurality of flat-plate-like particles with negatively charged surfaces is deposited over the substrate with its flat plane facing the substrate. Another one of the plurality of flat-plate-like particles with negatively charged surfaces is deposited over a region apart from the one of the plurality of flat-plate-like particles with negatively charged surfaces over the substrate while repelling the one of the plurality of flat-plate-like particles with negatively charged surfaces. The atoms and the aggregates of the atoms enter a gap between the one of the plurality of flat-plate-like particles with negatively charged surfaces and the another one of the plurality of flat-plate-like particles with negatively charged surfaces. The atoms and the aggregates of the atoms cause a lateral growth to fill the gap between the one of the plurality of flat-plate-like particles with negatively charged surfaces and the another one of the plurality of flat-plate-like particles with negatively charged surfaces.

(8) One embodiment of the present invention is the manufacturing method of an oxide of (7), in which a direction of an a-axis of the one of the plurality of flat-plate-like particles with negatively charged surfaces over the substrate is different from a direction of an a-axis of the another one of the plurality of flat-plate-like particles with negatively charged surfaces over the substrate.

(9) One embodiment of the present invention is the manufacturing method of an oxide of (7) or (8), in which the oxide is formed over a surface of an amorphous structure.

An oxide with a novel crystal structure can be provided. An oxide with high crystallinity can be provided. An oxide with low impurity concentration can be provided.

A semiconductor device using an oxide as a semiconductor can be provided. A module including a semiconductor device using an oxide as a semiconductor can be provided. An electronic device that includes a semiconductor device using an oxide as a semiconductor or includes a module including a semiconductor device using an oxide as a semiconductor can be provided.

A transistor with favorable electrical characteristics can be provided. A transistor with stable electrical characteristics can be provided. A transistor with high frequency characteristics can be provided. A transistor having low off-state current can be provided. A semiconductor device including any of the above transistors can be provided. A module including the semiconductor device can be provided. An electronic device including the semiconductor device or the module can be provided.

Note that the description of these effects does not preclude the existence of other effects. One embodiment of the present invention does not necessarily have all the effects listed above. Other effects will be apparent from and can be derived from the description of the specification, the drawings, the claims, and the like.

BRIEF DESCRIPTION OF DRAWINGS

FIGS. 46A to 46C are cross-sectional views illustrating a semiconductor device of one embodiment of the present invention.

FIGS. 48A to 48C are cross-sectional views illustrating a semiconductor device of one embodiment of the present invention.

FIGS. 53A and 53B are top views each illustrating a semiconductor device of one embodiment of the present invention.

FIGS. 58A1, 58A2, 58A3, 58B1, 58B2, and 58B3 are perspective views and cross-sectional views illustrating semiconductor devices of one embodiment of the present invention.

BEST MODE FOR CARRYING OUT THE INVENTION

Figure 1:
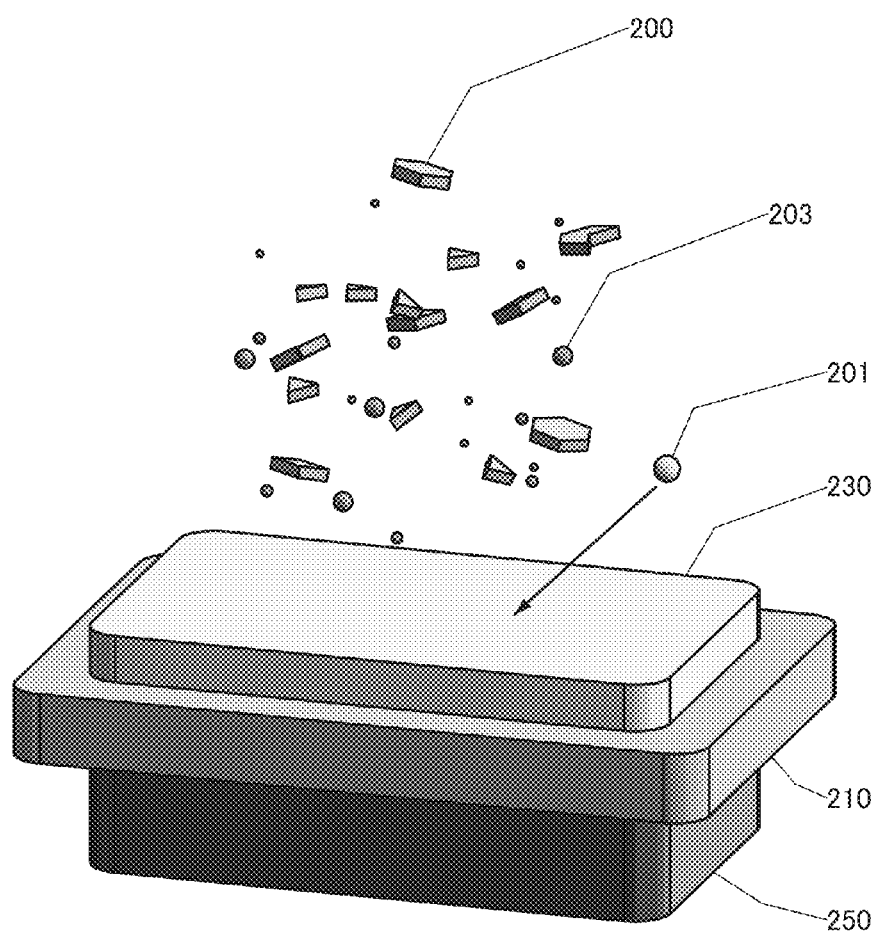
FIG. 1 illustrates a deposition method of a CAAC-OS.

Hereinafter, embodiments and examples of the present invention will be described in detail with the reference to the drawings. However, the present invention is not limited to the description below, and it is easily understood by those skilled in the art that modes and details disclosed herein can be modified in various ways. Furthermore, the present invention is not construed as being limited to description of the embodiments and the examples. In describing structures of the present invention with reference to the drawings, common reference numerals are used for the same portions in different drawings. Note that the same hatched pattern is applied to similar parts, and the similar parts are not denoted by reference numerals in some cases. In the case where the description of a component denoted by a different reference numeral is referred to, the description of the thickness, composition, structure, shape, or the like of the component can be used as appropriate.

Note that the size, the thickness of films (layers), or regions in drawings is sometimes exaggerated for simplicity.

In this specification, the terms "film" and "layer" can be interchanged with each other.

A voltage usually refers to a potential difference between a given potential and a reference potential (e.g., a source potential or a ground potential (GND)). A voltage can be referred to as a potential and vice versa. Note that in general, a potential (a voltage) is relative and is determined depending on the amount relative to a certain potential. Therefore, a potential which is represented as a "ground potential" or the like is not always 0 V. For example, the lowest potential in a circuit may be represented as a "ground potential." Alternatively, a substantially intermediate potential in a circuit may be represented as a "ground potential." In these cases, a positive potential and a negative potential are set using the potential as a reference.

The ordinal numbers such as "first" and "second" are used for convenience and do not denote the order of steps or the stacking order of layers. Therefore, for example, the term "first" can be replaced with the term "second," "third," or the like as appropriate. In addition, the ordinal numbers in this specification and the like do not correspond to the ordinal numbers which specify one embodiment of the present invention in some cases.

Note that a "semiconductor" includes characteristics of an "insulator" in some cases when, for example, the conductivity is sufficiently low. Furthermore, a "semiconductor" and an "insulator" cannot be strictly distinguished from each other in some cases because the border between the "semiconductor" and the "insulator" is not clear. Accordingly, a "semiconductor" in this specification can be called an "insulator" in some cases. Similarly, an "insulator" in this specification can be called a "semiconductor" in some cases.

Furthermore, a "semiconductor" includes characteristics of a "conductor" in some cases when, for example, the conductivity is sufficiently high. Furthermore, a "semiconductor" and a "conductor" cannot be strictly distinguished from each other in some cases because the border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of the semiconductor. For example, an element with a concentration of lower than 0.1 atomic % is regarded as an impurity. When an impurity is contained, the density of states (DOS) may be formed in a semiconductor, the carrier mobility may be decreased, or the crystallinity may be decreased. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is a silicon layer, examples of an impurity which changes characteristics of the semiconductor include oxygen, Group 1 elements except hydrogen, Group 2 elements, Group 13 elements, and Group 15 elements.

In this specification, the phrase "A has a region with a concentration B" includes, for example, "the concentration of the entire region in a region of A in the depth direction is B," "the average concentration in a region of A in the depth direction is B," "the median value of a concentration in a region of A in the depth direction is B," "the maximum value of a concentration in a region of A in the depth direction is B," "the minimum value of a concentration in a region of A in the depth direction is B," "a convergence value of a concentration in a region of A in the depth direction is B," and "a concentration in a region of A in which a probable value is obtained in measurement is B."

In this specification, the phrase "A has a region with a size B, a length B, a thickness B, a width B, or a distance B" includes, for example, "the size, the length, the thickness, the width, or the distance of the entire region in a region of A is B," "the average value of the size, the length, the thickness, the width, or the distance of a region of A is B," "the median value of the size, the length, the thickness, the width, or the distance of a region of A is B," "the maximum value of the size, the length, the thickness, the width, or the distance of a region of A is B," "the minimum value of the size, the length, the thickness, the width, or the distance of a region of A is B," "a convergence value of the size, the length, the thickness, the width, or the distance of a region of A is B," and "the size, the length, the thickness, the width, or the distance of a region of A in which a probable value is obtained in measurement is B."

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel formation region formed in a side surface of a semiconductor is increased in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

Note that in this specification, the description "A has a shape such that an end portion extends beyond an end portion of B" may indicate, for example, the case where at least one of end portions of A is positioned on an outer side than at least one of end portions of B in a top view or a cross-sectional view. Thus, the description "A has a shape such that an end portion extends beyond an end portion of B" can be read as the description "one end portion of A is positioned on an outer side than one end portion of B in a top view," for example.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

In this specification, a term "semiconductor" can be referred to as an "oxide semiconductor." As the semiconductor, a Group 14 semiconductor such as silicon or germanium; a compound semiconductor such as silicon carbide, germanium silicide, gallium arsenide, indium phosphide, zinc selenide, cadmium sulfide, or an oxide semiconductor; or an organic semiconductor can be used.

In this specification, a term "oxide" can be referred to as an "oxide semiconductor," an "oxide insulator," or an "oxide conductor."

<Deposition Method>

An example of a deposition model of a CAAC-OS using a sputtering method will be described below.

A target 230 is provided in a deposition chamber as illustrated in FIG. 1. The target 230 is attached to a backing plate 210. A magnet 250 is placed to overlap with the target 230 with the backing plate 210 positioned therebetween. The deposition chamber is mostly filled with a deposition gas (e.g., oxygen, argon, or a mixed gas containing oxygen at 5 volume % or higher) and the pressure in the deposition chamber is controlled to be higher than or equal to 0.01 Pa and lower than or equal to 100 Pa, and preferably higher than or equal to 0.1 Pa and lower than or equal to 10 Pa. Here, discharge starts by voltage application at a certain value or higher to the target 230, and plasma can be observed. A magnetic field of the magnet 250 forms a high-density plasma region in the vicinity of the target 230. In the high-density plasma region, the deposition gas is ionized, so that an ion 201 is generated. A sputtering method in which the deposition rate is increased by utilizing a magnetic field of a magnet is referred to as a magnetron sputtering method. Examples of the ion 201 include an oxygen cation ($O^+$) and an argon cation ($Ar^+$).

Figure 2A:
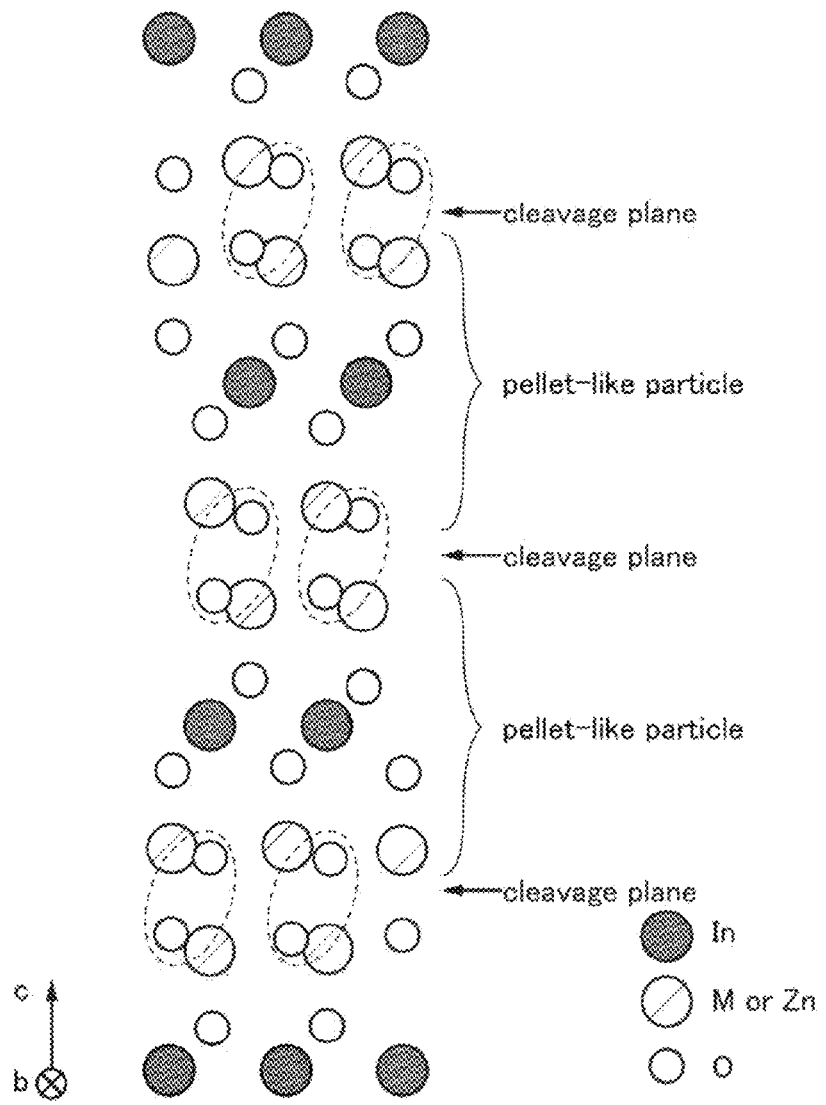
FIGS. 2A to 2C illustrate an $InMZnO_4$ crystal and a pellet.

Here, the target 230 has a polycrystalline structure which includes a plurality of crystal grains. A cleavage plane exists in any of the crystal grains. FIG. 2A shows a crystal structure of $InMZnO_4$ (M is an element such as aluminum, gallium, yttrium, or tin) included in the target 230 as an example. Note that FIG. 2A illustrates the crystal structure of $InMZnO_4$ observed from a direction parallel to the b-axis. In the crystal of $InMZnO_4$, oxygen atoms are negatively charged, whereby a repulsive force is generated between two adjacent M-Zn—O layers. Thus, the $InMZnO_4$ crystal has a cleavage plane between two adjacent M-Zn—O layers.

The ion 201 generated in the high-density plasma region is accelerated toward the target 230 side by an electric field, and then collides with the target 230. At this time, a pellet 200, which is a flat-plate-like or pellet-like sputtered particle, is separated from the cleavage plane. Note that along with the separation of the pellet 200, particles 203 are sputtered from the target 230. The particles 203 each have an atom or an aggregate of several atoms. Thus, the particles 203 can be referred to as atomic particles.

Figure 2B:
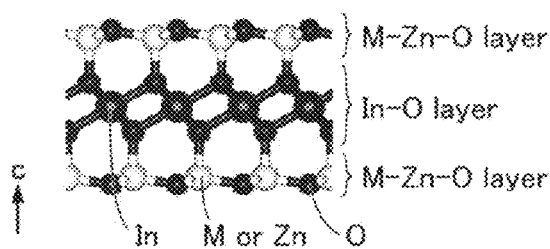
Figure 2C:
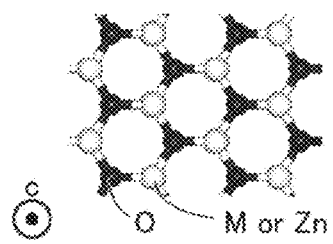
Figure 3A:
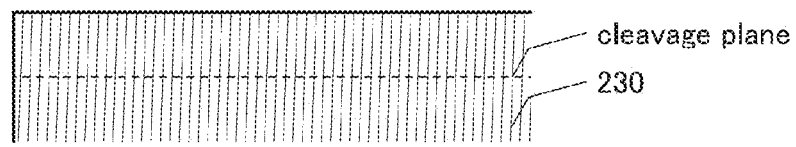
FIGS. 3A to 3D illustrate a deposition method of a CAAC-OS.
Figure 3B:
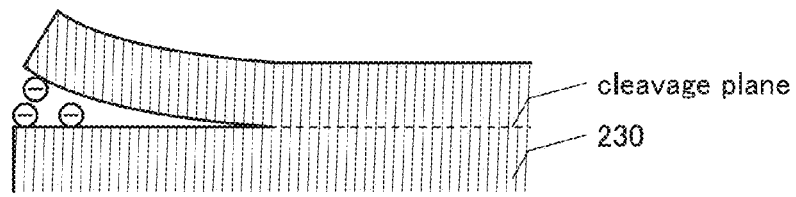
Figure 3C:
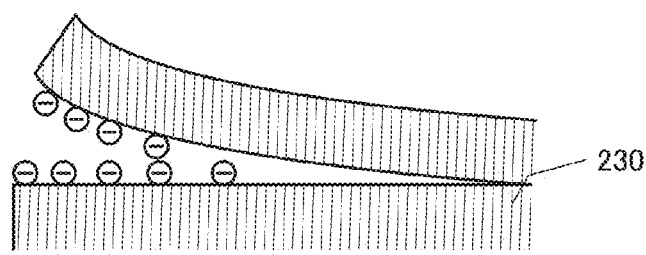
Figure 3D:
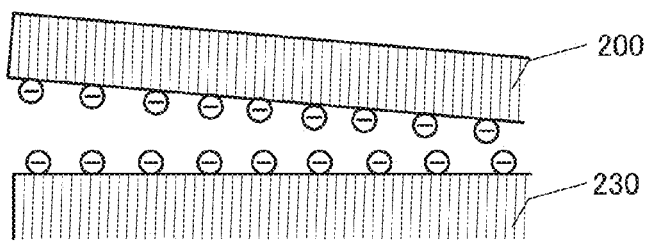

Cleavage at a surface of the target is described with reference to cross-sectional views in FIGS. 3A to 3D. FIG. 3A is a cross-sectional view of the target 230 having a cleavage plane (indicated by a dashed line). When the ion 201 collides with the target 230, bonds are sequentially cut from an end portion of the cleavage plane (see FIG. 3B). The cleaved surfaces repel each other because of the existence of charges with the same polarity. For this reason, rebinding does not occur once the bond is cut. As repellency due to charges proceeds, a region where bonds are cut gradually expands (see FIG. 3C). In the end, the pellet 200 is separated from the target 230 (see FIG. 3D). The pellet 200 corresponds to a portion between any two adjacent cleavage planes illustrated in FIG. 2A. Thus, when the pellet 200 is observed, the cross-section thereof is as illustrated in FIG. 2B, and the top surface thereof is as illustrated in FIG. 2C. Note that the structure of the pellet 200 may be distorted by an impact of collision with the ion 201.

The pellet 200 is a flat-plate-like (pellet-like) sputtered particle having a triangle plane, e.g., a regular triangle plane. Alternatively, the pellet 200 is a flat-plate-like (pellet-like) sputtered particle having a hexagon plane, e.g., regular hexagon plane. However, the shape of a flat plane of the pellet 200 is not limited to a triangle or a hexagon. For example, the flat plane may have a shape formed by combining two or more triangles. For example, the flat plane may be a quadrangle (e.g., rhombus) formed by combining two triangles (e.g., regular triangles).

The thickness of the pellet 200 is determined in accordance with the kind of the deposition gas and the like. The thickness of the pellet 200 is, for example, greater than or equal to 0.4 nm and less than or equal to 1 nm, and preferably greater than or equal to 0.6 nm and less than or equal to 0.8 nm. In addition, the width of the pellet 200 is, for example, greater than or equal to 1 nm and less than or equal to 100 nm, preferably greater than or equal to 2 nm and less than or equal to 50 nm, and further preferably greater than or equal to 3 nm and less than or equal to 30 nm.

A surface of the pellet 200 might be negatively or positively charged when the pellet 200 receives a charge from plasma. In the case where the pellet 200 receives a negative charge from $O^{2-}$ in plasma, for example, an oxygen atom on the surface of the pellet 200 is negatively charged. A lateral growth might occur when the particles 203 are attached and bonded to a side surface of the pellet 200 in plasma.

The pellet 200 and the particles 203 that have passed through plasma reach a surface of a substrate 220. Note that some of the particles 203 are discharged to the outside by a vacuum pump or the like because of their smallness in mass.

Here, deposition of the pellets 200 and the particles 203 on the surface of the substrate 220 will be described with reference to FIGS. 4A to 4F.

First, a first pellet 200 is deposited on the substrate 220. Since the pellet 200 has a flat-plate-like shape, it is deposited with its flat plane facing the surface of the substrate 220. At this time, a charge on a surface of the pellet 200 on the substrate 220 side is lost through the substrate 220.

Next, a second pellet 200 reaches the substrate 220. Since a surface of the first pellet 200 and a surface of the second pellet 200 are charged, they repel each other. As a result, the second pellet 200 avoids being deposited over the first pellet 200, and is deposited with its flat plane facing the surface of the substrate 220 so as to be a little distance away from the first pellet 200. With repetition of this, millions of the pellets 200 are deposited on the surface of the substrate 220 to have a thickness of one layer. A region where no pellet 200 is deposited is generated between adjacent pellets 200 (see FIG. 4A).

Then, the particles 203 that have received energy from plasma reach the surface of the substrate 220. The particles 203 cannot be deposited on an active region such as the surfaces of the pellets 200. For this reason, the particles 203 move to regions where no pellet 200 is deposited and are attached to side surfaces of the pellets 200. Since available bonds of the particles 203 are activated by energy received from plasma, the particles 203 are chemically bonded to the pellets 200 to form lateral growth portions 202 (see FIG. 4B). The lateral growth portions 202 then promote a lateral growth so that the pellets 200 are anchored to each other (see FIG. 4C). In this manner, the lateral growth portions 202 are formed until they fill regions where no pellet 200 is deposited. This mechanism is similar to a deposition mechanism for an atomic layer deposition (ALD) method.

Even when the deposited pellets 200 are oriented in different directions, the particles 203 cause a lateral growth to fill gaps between the pellets 200; thus, no clear grain boundary is formed. In addition, as the particles 203 make a smooth connection between the pellets 200, a crystal structure different from single crystal and polycrystal structures is formed. In other words, a crystal structure including distortion between minute crystal regions (pellets 200) is formed. Regions filling the gaps between the crystal regions are distorted crystal regions, and thus, it will be not appropriate to say that the regions have an amorphous structure.

Figure 4A:
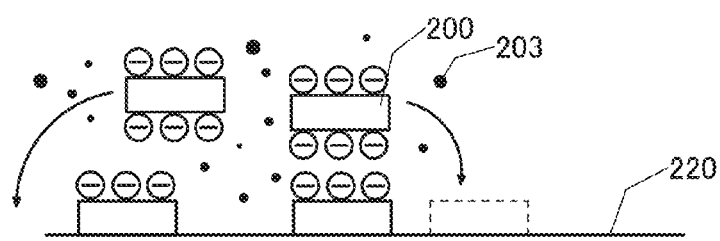
FIGS. 4A to 4F illustrate a deposition method of a CAAC-OS.
Figure 4B:
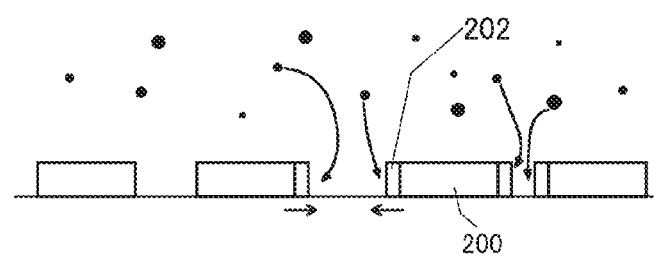
Figure 4C:
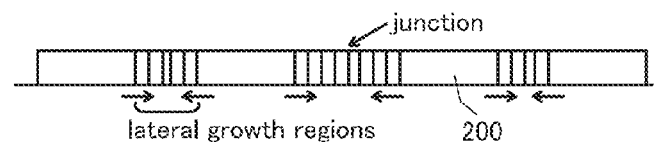
Figure 4D:
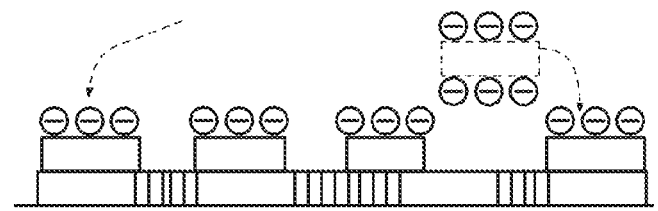
Figure 4E:
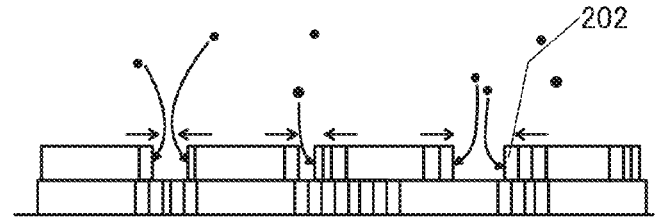
Figure 4F:
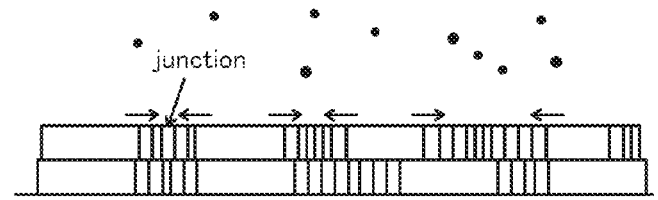

Next, new pellets 200 are deposited with their flat planes facing the surface of the substrate 220 (see FIG. 4D). After that, the particles 203 are deposited so as to fill regions where no pellet 200 is deposited, thereby forming the lateral growth portions 202 (see FIG. 4E). In such a manner, the particles 203 are attached to side surfaces of the pellets 200 and the lateral growth portions 202 cause a lateral growth so that the pellets 200 in the second layer are anchored to each other (see FIG. 4F). Deposition continues until the m-th layer (m is an integer of two or more) is formed; as a result, a stacked-layer thin film structure is formed.

A deposition way of the pellets 200 changes according to the surface temperature of the substrate 220 or the like. For example, if the surface temperature of the substrate 220 is high, migration of the pellets 200 occurs on the surface of the substrate 220. As a result, a proportion of the pellets 200 that are directly connected to each other without the particles 203 increases, whereby a CAAC-OS with higher orientation is made. The surface temperature of the substrate 220 for deposition of the CAAC-OS is higher than or equal to 100° C. and lower than 500° C., preferably higher than or equal to 140° C. and lower than 450° C., and further preferably higher than or equal to 170° C. and lower than 400° C. Therefore, even when a large-sized substrate of the 8th generation or more is used as the substrate 220, a warp or the like due to the deposition of the CAAC-OS hardly occurs.

In contrast, if the surface temperature of the substrate 220 is low, the migration of the pellets 200 does not easily occur on the substrate 220. As a result, the pellets 200 are stacked to form a nanocrystalline oxide semiconductor (nc-OS) or the like with low orientation. In the nc-OS, the pellets 200 are possibly deposited with certain gaps because the pellets 200 are negatively charged. Therefore, the nc-OS has low orientation but some regularity, and thus has a denser structure than an amorphous oxide semiconductor.

When gaps between pellets are extremely small in a CAAC-OS, the pellets may form a large pellet. The inside of the large pellet has a single crystal structure. the size of the pellet when seen from the above may be, for example, greater than or equal to 10 nm and less than or equal to 200 nm, greater than or equal to 15 nm and less than or equal to 100 nm, or greater than or equal to 20 nm and less than or equal to 50 nm.

The pellets are considered to be deposited on a surface of a substrate according to such a deposition model. A CAAC-OS can be deposited even when a formation surface does not have a crystal structure. This indicates that the above-described deposition model, which is a growth mechanism different from an epitaxial growth, has high validity. In addition, with the above-described deposition model, a uniform film of a CAAC-OS or an nc-OS can be formed even over a large-sized glass substrate or the like. Even when the surface of the substrate (formation surface) has an amorphous structure (e.g., amorphous silicon oxide), for example, a CAAC-OS can be formed.

In addition, even when the surface of the substrate (formation surface) has an uneven shape, the pellets are aligned along the shape.

The above-described deposition model suggests that a CAAC-OS with high crystallinity can be formed in the following manner: deposition is performed in high vacuum to have a long mean free path, plasma energy is weakened to reduce damage around a substrate, and thermal energy is applied to a formation surface to repair damage due to plasma during deposition.

The above is the description of the case of a flat plate pellet. In contrast, in the case of a cubic pellet or a columnar pellet that has a small width, for example, pellets that reached a surface of a substrate are oriented in various directions. Then, particles are attached to side surfaces of the deposited pellets while the orientations of the pellets are varied, and lateral growth portions cause a lateral growth. The crystal orientation in the resulting thin film might not be uniform.

The above-described deposition model can be used not only for the case where a target has a polycrystalline structure of a composite oxide (such as an In-M-Zn oxide) with a plurality of crystal grains, and any of the crystal grains have a cleavage plane; but also for the case where, for example, a target of a mixture containing indium oxide, an oxide of the element M, and zinc oxide is used.

Since there is no cleavage plane in a target of a mixture, atomic particles are separated from the target by sputtering. During deposition, a high electric field region of plasma is formed around a target. Because of the high electric field region of plasma, atomic particles separated from the target are anchored to each other to cause a lateral growth. For example, indium atoms, which are atomic particles, are anchored to each other and cause a lateral growth to be a nanocrystal formed of an In—O layer, and then an M-Zn—O layer is bonded above and below the nanocrystalline In—O layer so as to complement the nanocrystalline In—O layer. In this manner, a pellet can be formed even when a target of a mixture is used. Accordingly, the above-described deposition model can also be applied to the case of using a target of a mixture.

Note that in the case where a high electric field region of plasma is not formed around a target, only atomic particles separated from the target are deposited on a substrate surface. In that case, a lateral growth of an atomic particle might occur on the substrate surface. However, since the orientations of atomic particles are not the same, the crystal orientation in the resulting thin film is not uniform. As a result, an nc-OS or the like is obtained.

<Lateral Growth>

The following description explains that a lateral growth occurs when the particles 203 are attached to (bonded to or adsorbed on) the pellet 200 laterally.

Figure 5A:
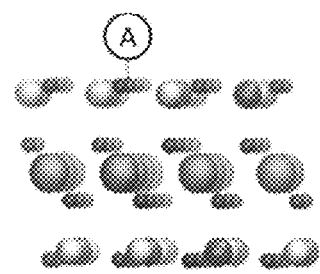
FIGS. 5A to 5G illustrate positions to which particles can be attached in a pellet.
Figure 5B:
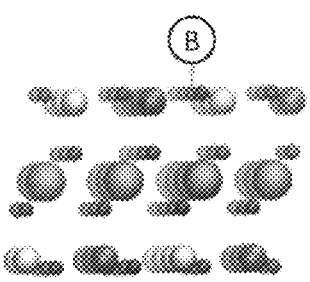
Figure 5C:
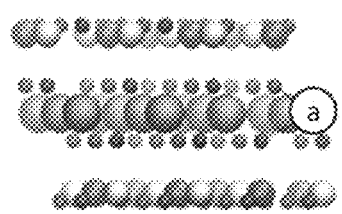
Figure 5D:
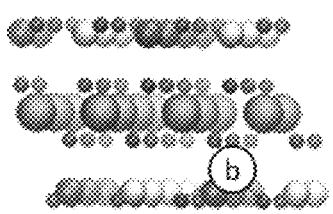
Figure 5E:
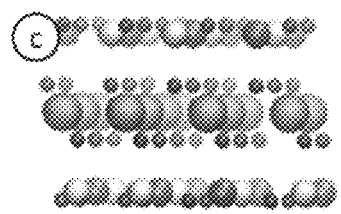
Figure 5F:
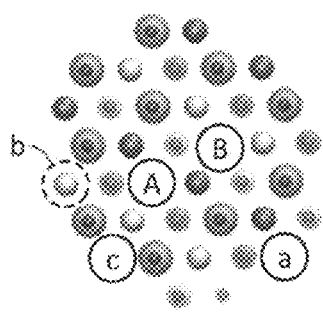
Figure 5G:
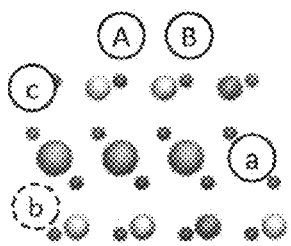

FIGS. 5A to 5E each illustrate a structure of the pellet 200 and a position to which a metal ion can be attached. A model assumed as the pellet 200 is a cluster model with 84 atoms extracted from an $InMZnO_4$ crystal structure with a constant stoichiometric composition. Note that the following description is made on the assumption that the element M is gallium. FIG. 5F illustrates a structure of the pellet 200 seen in the direction parallel to the c-axis. FIG. 5G illustrates a structure of the pellet 200 seen in the direction parallel to the a-axis.

The positions to which metal ions can be attached are represented as a position A, a position B, a position a, a position b, and a position c. The position A is an upper part of an interstitial site surrounded by one gallium atom and two zinc atoms on the top surface of the pellet 200. The position B is an upper part of an interstitial site surrounded by two gallium atoms and one zinc atom on the top surface of the pellet 200. The position a is in an indium site on a side surface of the pellet 200. The position b is in an interstitial site between an In—O layer and a Ga—Zn—O layer on a side surface of the pellet 200. The position c is in a gallium site on a side surface of the pellet 200.

The relative energy was estimated from first principles calculation in each case where a metal ion was located in the assumed position (the position A, the position B, the position a, the position b, or the position c). In the calculation, first principles calculation software VASP (Vienna Ab initio Simulation Package) was used. For the exchange-correlation potential, Perdew-Burke-Ernzerhof (PBE) type generalized gradient approximation (GGA) was used, and for the ion potential, a projector augmented wave (PAW) method was used. The cut-off energy was 400 eV, and Γ-only k-point sampling was used. The table below shows the relative energies in the case where an indium ion ($In^{3+}$), a gallium ion ($Ga^{3+}$), and a zinc ion ($Zn^{2+}$) are located at the position A, the position B, the position a, the position b, and the position c. Note that the relative energy is a relative value under the condition where the energy of the model with the lowest energy among the calculated models is set to 0 eV.

TABLE 1

| | Relative Energy [eV] | | | | |
|---|---|---|---|---|---|
| | Top surface of pellet | | Side surface of pellet | | |
| Ion | A | B | a | b | c |
| $In^{3+}$ | 2.1 | 1.5 | 0.0 | 1.8 | 1.9 |
| $Ga^{3+}$ | 3.7 | 3.0 | 0.6 | 0.0 | 3.5 |
| $Zn^{2+}$ | 2.3 | 1.8 | 0.0 | 0.6 | 2.9 |

It is found that any metal ion is more likely to be attached to the side surface of the pellet 200 than to the top surface thereof. It is also found that a zinc ion as well as an indium ion is most likely to be attached to the indium site at the position a.

Figure 6A:
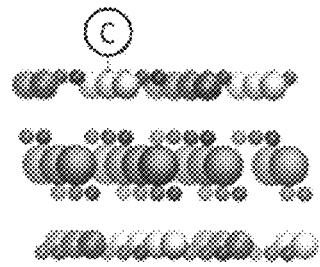
FIGS. 6A to 6G illustrate positions to which particles can be attached in a pellet.
Figure 6B:
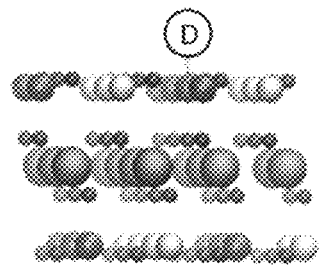
Figure 6C:
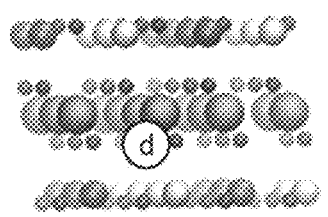
Figure 6D:
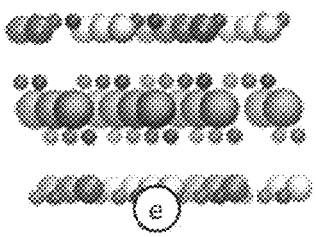
Figure 6E:
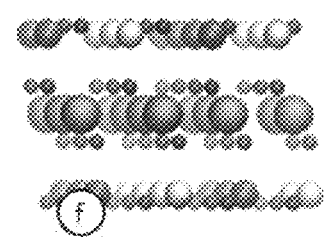
Figure 6F:
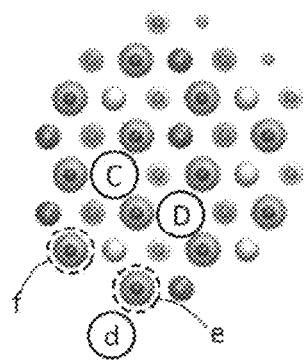
Figure 6G:
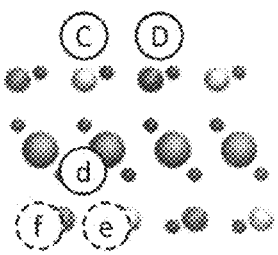

Ease of oxygen ion ($O^{2-}$) attachment to the pellet 200 was examined. FIGS. 6A to 6E each illustrate a structure of the pellet 200 and a position to which an oxygen ion can be attached. FIG. 6F illustrates a structure of the pellet 200 seen in the direction parallel to the c-axis. FIG. 6G illustrates a structure of the pellet 200 seen in the direction parallel to the b-axis.

The positions to which oxygen ions can be attached are represented as a position C, a position D, a position d, a position e, and a position f. In the position C, an oxygen ion is bonded to gallium on the top surface of the pellet 200. In the position D, an oxygen ion is bonded to zinc on the top surface of the pellet 200. In the position d, an oxygen ion is bonded to indium on a side surface of the pellet 200. In the position e, an oxygen ion is bonded to gallium on a side surface of the pellet 200. In the position f, an oxygen ion is bonded to zinc on a side surface of the pellet 200.

The relative energy was estimated from first principles calculation in each case where an oxygen ion was located in the assumed position (the position C, the position D, the position d, the position e, or the position f). The table below shows the relative energies in the case where oxygen ions ($O^{2-}$) are located at the position C, the position D, the position d, the position e, and the position f.

TABLE 2

| | Relative Energy [eV] | | | | |
|---|---|---|---|---|---|
| | Top surface of pellet | | Side surface of pellet | | |
| Ion | C | D | d | e | f |
| $O^{2-}$ | 3.9 | 3.6 | 0.0 | 0.5 | 1.5 |

It is found that the oxygen ion is also likely to be attached to the side surface of the pellet 200 than to the top surface thereof.

According to the above, the particle 203 that has approached the pellet 200 is preferentially attached to the side surface of the pellet 200. This suggests that the deposition model in which a lateral growth of the pellet 200 occurs when the particles 203 are attached to the side surface of the pellet 200 has high validity.

<Composition>

The composition of an In-M-Zn oxide is described below. The element M is aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, and the like.

Figure 7:
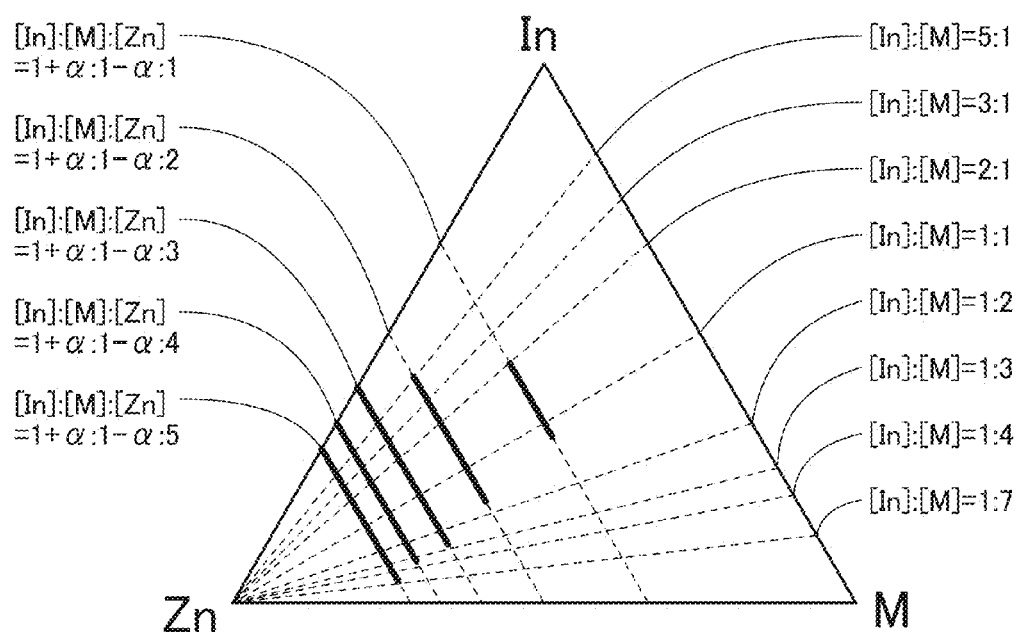
FIG. 7 is a triangular diagram for explaining composition of an In-M-Zn oxide.

FIG. 7 is a ternary diagram whose vertices represent In, M, and Zn. In the diagram, [In] means the atomic concentration of In, [M] means the atomic concentration of the element M, and [Zn] means the atomic concentration of Zn.

A crystal of an In-M-Zn oxide is known to have a homologous structure and is represented by $InMO_3(ZnO)_m$ (m is a natural number). Since In and M can be interchanged, the crystal can also be represented by $In_{1+\alpha}M_{1-\alpha}O_3(ZnO)_m$. This composition is represented by any of the dashed lines denoted as [In]:[M]:[Zn]=1+α:1−α:1, [In]:[M]:[Zn]=1+α:1−α:2, [In]:M:[Zn]=1+α:1−α:3, [In]:[M]:[Zn]=1+α:1−α:4, and [In]:[M]:[Zn]=1+α:1−α:5. Note that the bold line on the dashed line represents, for example, the composition that allows an oxide as a raw material mixed and subjected to baking at 1350° C. to be a solid solution.

Thus, when an oxide has a composition close to the above composition that allows the oxide to be a solid solution, the crystallinity can be increased. When an In-M-Zn oxide is deposited by a sputtering method, the composition of a target might be different from the composition of a deposited film. For example, using an In-M-Zn oxide in which an atomic ratio is 1:1:1, 1:1:1.2, 3:1:2, 4:2:4.1, 1:3:2, 1:3:4, or 1:4:5 as a target results in a film having an atomic ratio of 1:1:0.7 (approximately 1:1:0.5 to 1:1:0.9), 1:1:0.9 (approximately 1:1:0.8 to 1:1:1.1), 3:1:1.5 (approximately 3:1:1 to 3:1:1.8), 4:2:3 (approximately 4:2:2.6 to 4:2:3.6), 1:3:1.5 (approximately 1:3:1 to 1:3:1.8), 1:3:3 (approximately 1:3:2.5 to 1:3:3.5), or 1:4:4 (approximately 1:4:3.4 to 1:4:4.4). Thus, in order to obtain a film with a desired composition, a composition of a target may be selected in consideration of a change in the composition. The sputtering apparatus described in this embodiment can reduce a difference between the composition of the target and the composition of the film to be deposited.

<Sputtering Apparatus>

A parallel-plate-type sputtering apparatus and a facing-targets sputtering apparatus of one embodiment of the present invention will be described below. As will be described later, deposition using a facing-targets sputtering apparatus causes less damage to a formation surface and thus facilitates the formation of a film with high crystallinity. For this reason, a facing-targets sputtering apparatus is preferably used for the deposition of the CAAC-OS in some cases. The following descriptions of the sputtering apparatuses are made for easy understanding or the explanation of the operation during deposition, on the assumption that a substrate, a target, and the like are provided. Note that the substrate, the target, and the like are provided by a user; thus, the sputtering apparatus of one embodiment of the present invention does not necessarily include the substrate and the target.

Deposition using a parallel-plate-type sputtering apparatus can also be referred to as parallel electrode sputtering (PESP), and deposition using a facing-targets sputtering apparatus can also be referred to as vapor deposition sputtering (VDSP).

Figure 8A:
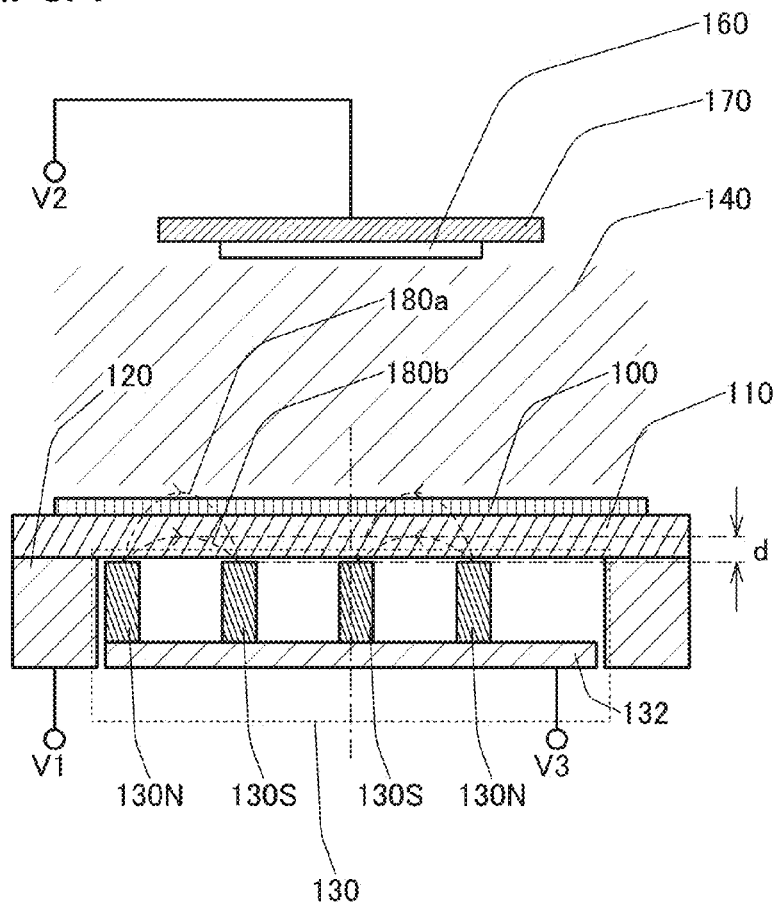
FIGS. 8A and 8B illustrate a sputtering apparatus.

FIG. 8A is a cross-sectional view of a deposition chamber 101 of a parallel-plate-type sputtering apparatus. The deposition chamber 101 in FIG. 8A includes a target holder 120, a backing plate 110, a target 100, a magnet unit 130, and a substrate holder 170. Note that the target 100 is placed over the backing plate 110. The backing plate 110 is placed over the target holder 120. The magnet unit 130 is placed under the target 100 with the backing plate 110 positioned therebetween. The substrate holder 170 faces the target 100. Note that in this specification, a magnet unit means a group of magnets. The magnet unit can be replaced with "cathode," "cathode magnet," "magnetic member," "magnetic part," or the like. The magnet unit 130 includes a magnet 130N, a magnet 130S, and a magnet holder 132. Note that in the magnet unit 130, the magnet 130N and the magnet 130S are placed over the magnet holder 132. The magnet 130N and the magnet 130S are spaced. When a substrate 160 is transferred into the deposition chamber 101, the substrate 160 is placed on the substrate holder 170.

The target holder 120 and the backing plate 110 are fixed to each other with a bolt and have the same potential. The target holder 120 has a function of supporting the target 100 with the backing plate 110 positioned therebetween.

The target 100 is fixed to the backing plate 110. The target 100 can be fixed to the backing plate 110 using a bonding agent containing a low-melting-point metal such as indium, for example.

FIG. 8A illustrates a magnetic force line 180a and a magnetic force line 180b formed by the magnet unit 130.

The magnetic force line 180a is one of magnetic force lines that form a horizontal magnetic field in the vicinity of the top surface of the target 100. The vicinity of the top surface of the target 100 corresponds to a region in which the vertical distance from the target 100 is, for example, greater than or equal to 0 mm and less than or equal to 10 mm, in particular, greater than or equal to 0 mm and less than or equal to 5 mm.

The magnetic force line 180b is one of magnetic force lines that form a horizontal magnetic field in a plane apart from the top surface of the magnet unit 130 by a vertical distance d. The vertical distance d is, for example, greater than or equal to 0 mm and less than or equal to 20 mm or greater than or equal to 5 mm and less than or equal to 15 mm.

Here, with the use of the strong magnet 130N and the strong magnet 130S, an intense magnetic field can be generated in the vicinity of the top surface of the substrate 160. Specifically, the intensity of the horizontal magnetic field on the top surface of the substrate 160 can be greater than or equal to 10 G and less than or equal to 100 G, preferably greater than or equal to 15 G and less than or equal to 60 G, further preferably greater than or equal to 20 G and less than or equal to 40 G.

Note that the intensity of the horizontal magnetic field may be measured when the intensity of the vertical magnetic field is 0 G.

By setting the intensity of the magnetic field in the deposition chamber 101 to be in the above range, an oxide with high density and high crystallinity can be deposited. The deposited oxide hardly includes plural kinds of crystal phases and is a substantially-single crystalline phase.

Figure 8B:
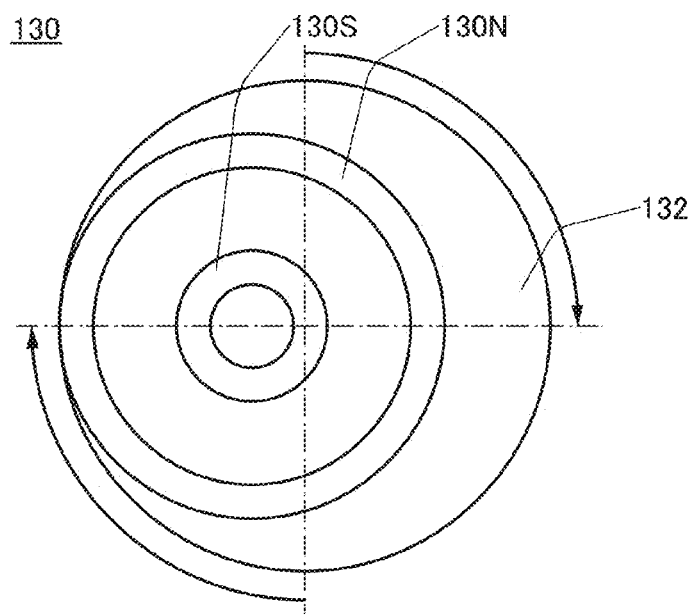

FIG. 8B is a top view of the magnet unit 130. In the magnet unit 130, the circular or substantially circular magnet 130N and the circular or substantially circular magnet 130S are fixed to the magnet holder 132. The magnet unit 130 can be rotated about a normal vector at the center of the top surface of the magnet unit 130 or a normal vector substantially at the center of the top surface of the magnet unit 130. For example, the magnet unit 130 may be rotated with a beat (also referred to as rhythm, pulse, frequency, period, cycle, or the like) of greater than or equal to 0.1 Hz and less than or equal to 1 kHz.

Thus, a region with a high magnetic field on the target 100 changes as the magnet unit 130 is rotated. The region with a high magnetic field is a high-density plasma region; thus, sputtering of the target 100 easily occurs in the vicinity of the region. For example, when the region with a high magnetic field is fixed, only a specific region of the target 100 is used. In contrast, when the magnet unit 130 is rotated as illustrated in FIG. 8B, plasma 140 is generated between the target 100 and the substrate 160, and the target 100 can be uniformly used. In addition, when the magnet unit 130 is rotated, a film with a uniform thickness and uniform quality can be deposited.

By rotating the magnet unit 130, the direction of the magnetic force line on the top surface of the substrate 160 can also be changed.

Although the magnet unit 130 is rotated in this example, one embodiment of the present invention is not limited to this example. For example, the magnet unit 130 may be oscillated vertically or horizontally. For example, the magnet unit 130 may be oscillated with a beat of greater than or equal to 0.1 Hz and less than or equal to 1 kHz. Alternatively, the target 100 may be rotated or moved. For example, the target 100 may be rotated or oscillated with a beat of greater than or equal to 0.1 Hz and less than or equal to 1 kHz. Further alternatively, the direction of a magnetic force line on the top surface of the substrate 160 may be changed relatively by rotating the substrate 160. These methods may be combined.

The deposition chamber 101 may have a water channel inside or under the backing plate 110. By making fluid (air, nitrogen, a rare gas, water, oil, or the like) flow through the water channel, discharge anomaly due to an increase in the temperature of the target 100 or damage to the deposition chamber 101 due to deformation of a component can be prevented in the sputtering. In that case, the backing plate 110 and the target 100 are preferably adhered to each other with a bonding agent because the cooling capability is increased.

A gasket is preferably provided between the target holder 120 and the backing plate 110, in which case an impurity is less likely to enter the deposition chamber 101 from the outside or the water channel.

In the magnet unit 130, the magnet 130N and the magnet 130S are placed such that their surfaces on the target 100 side have opposite polarities. Here, the case where the pole of the magnet 130N on the target 100 side is the north pole and the pole of the magnet 130S on the target 100 side is the south pole is described. Note that the layout of the magnets and the poles in the magnet unit 130 are not limited to those described here or those illustrated in FIG. 8A.

In the deposition, a potential V1 applied to a terminal V1 connected to the target holder 120 is, for example, lower than a potential V2 applied to a terminal V2 connected to the substrate holder 170. The potential V2 applied to the terminal V2 connected to the substrate holder 170 is, for example, the ground potential. A potential V3 applied to a terminal V3 connected to the magnet holder 132 is, for example, the ground potential. Note that the potentials applied to the terminals V1, V2, and V3 are not limited to the above description. Not all the target holder 120, the substrate holder 170, and the magnet holder 132 are necessarily supplied with potentials. For example, the substrate holder 170 may be electrically floating. Note that although the potential V1 is applied to the terminal V1 connected to the target holder 120 (i.e., a DC sputtering method is employed) in the example illustrated in FIG. 8A, one embodiment of the present invention is not limited thereto. For example, it is possible to employ what is called an RF sputtering method, in which case a high-frequency power supply with a frequency of 13.56 MHz or 27.12 MHz, for example, is connected to the target holder 120.

FIG. 8A illustrates an example where the backing plate 110 and the target holder 120 are not electrically connected to the magnet unit 130 and the magnet holder 132, but electrical connection is not limited thereto. For example, the backing plate 110 and the target holder 120 may be electrically connected to the magnet unit 130 and the magnet holder 132, and the backing plate 110, the target holder 120, the magnet unit 130, and the magnet holder 132 may have the same potential.

To increase the crystallinity of the formed oxide, the temperature of the substrate 160 may be set high. By setting the temperature of the substrate 160 high, migration of sputtered particles at the top surface of the substrate 160 can be promoted. Thus, an oxide with higher density and higher crystallinity can be deposited. Note that the temperature of the substrate 160 is, for example, higher than or equal to 100° C. and lower than or equal to 450° C., preferably higher than or equal to 150° C. and lower than or equal to 400° C., more preferably higher than or equal to 170° C. and lower than or equal to 350° C.

When the partial pressure of oxygen in the deposition gas is too high, an oxide including plural kinds of crystal phases is likely to be deposited; therefore, a mixed gas of oxygen and a rare gas such as argon (other examples of the rare gas are helium, neon, krypton, and xenon) is preferably used as the deposition gas. For example, the proportion of oxygen in the whole deposition gas is less than 50 vol %, preferably less than or equal to 33 vol %, further preferably less than or equal to 20 vol %, and still further preferably less than or equal to 15 vol %.

The vertical distance between the target 100 and the substrate 160 is greater than or equal to 10 mm and less than or equal to 600 mm, preferably greater than or equal to 20 mm and less than or equal to 400 mm, more preferably greater than or equal to 30 mm and less than or equal to 200 mm, further more preferably greater than or equal to 40 mm and less than or equal to 100 mm. Within the above range, the vertical distance between the target 100 and the substrate 160 is small enough to suppress a decrease in the energy of the sputtered particles until the sputtered particles reach the substrate 160 in some cases. Within the above range, the vertical distance between the target 100 and the substrate 160 is large enough to make the incident direction of the sputtered particle approximately vertical to the substrate 160, so that damage to the substrate 160 caused by collision of the sputtered particles can be reduced in some cases.

Figure 9A:
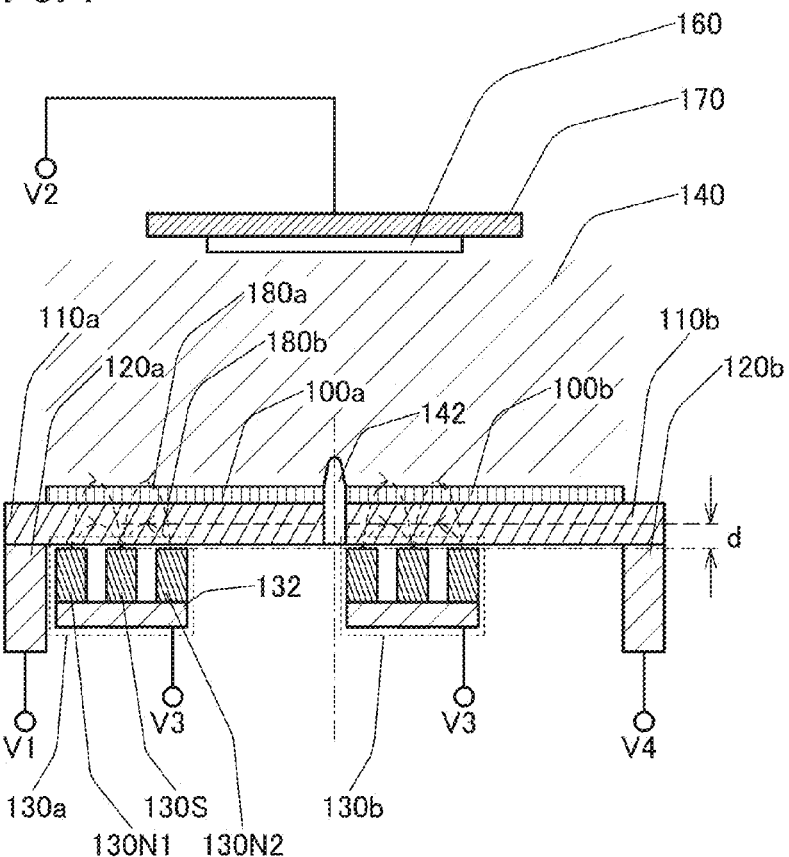
FIGS. 9A and 9B illustrate a sputtering apparatus.

FIG. 9A illustrates an example of a deposition chamber different from that in FIG. 8A.

The deposition chamber 101 in FIG. 9A includes a target holder 120a, a target holder 120b, a backing plate 110a, a backing plate 110b, a target 100a, a target 100b, a magnet unit 130a, a magnet unit 130b, a member 142, and the substrate holder 170. Note that the target 100a is placed over the backing plate 110a. The backing plate 110a is placed over the target holder 120a. The magnet unit 130a is placed under the target 100a with the backing plate 110a positioned therebetween. The target 100b is placed over the backing plate 110b. The backing plate 110b is placed over the target holder 120b. The magnet unit 130b is placed under the target 100b with the backing plate 110b positioned therebetween.

The magnet unit 130a includes a magnet 130N1, a magnet 130N2, the magnet 130S, and the magnet holder 132. Note that in the magnet unit 130a, the magnet 130N1, the magnet 130N2, and the magnet 130S are placed over the magnet holder 132. The magnet 130N1, the magnet 130N2, and the magnet 130S are spaced. Note that the magnet unit 130b has a structure similar to that of the magnet unit 130a. When the substrate 160 is transferred into the deposition chamber 101, the substrate 160 is placed on the substrate holder 170.

The target 100a, the backing plate 110a, and the target holder 120a are separated from the target 100b, the backing plate 110b, and the target holder 120b by the member 142. Note that the member 142 is preferably an insulator. The member 142 may be a conductor or a semiconductor. The member 142 may be a conductor or a semiconductor whose surface is covered with an insulator.

The target holder 120a and the backing plate 110a are fixed to each other with a bolt and have the same potential. The target holder 120a has a function of supporting the target 100a with the backing plate 110a positioned therebetween. The target holder 120b and the backing plate 110b are fixed to each other with a bolt and have the same potential. The target holder 120b has a function of supporting the target 100b with the backing plate 110b positioned therebetween.

The backing plate 110a has a function of fixing the target 100a. The backing plate 110b has a function of fixing the target 100b.

FIG. 9A illustrates the magnetic force line 180a and the magnetic force line 180b formed by the magnet unit 130a.

The magnetic force line 180a is one of magnetic force lines that form a horizontal magnetic field in the vicinity of a top surface of the target 100a. The vicinity of the top surface of the target 100a corresponds to a region in which the vertical distance from the target 100a is, for example, greater than or equal to 0 mm and less than or equal to 10 mm, in particular, greater than or equal to 0 mm and less than or equal to 5 mm.

The magnetic force line 180b is one of magnetic force lines that form a horizontal magnetic field in a plane apart from the top surface of the magnet unit 130a by a vertical distance d. The vertical distance d is, for example, greater than or equal to 0 mm and less than or equal to 20 mm or greater than or equal to 5 mm and less than or equal to 15 mm.

Here, with the use of the strong magnet 130N1, the strong magnet 130N2, and the strong magnet 130S, an intense magnetic field can be generated in the vicinity of the top surface of the substrate 160. Specifically, the intensity of the horizontal magnetic field on the top surface of the substrate 160 can be greater than or equal to 10 G and less than or equal to 100 G, preferably greater than or equal to 15 G and less than or equal to 60 G, and further preferably greater than or equal to 20 G and less than or equal to 40 G.

By setting the intensity of the magnetic field in the deposition chamber 101 to be in the above range, an oxide with high density and high crystallinity can be deposited. The deposited oxide hardly includes plural kinds of crystal phases and is a substantially-single crystalline phase.

Note that the magnet unit 130b forms a magnetic force line similar to that formed by the magnet unit 130a.

Figure 9B:
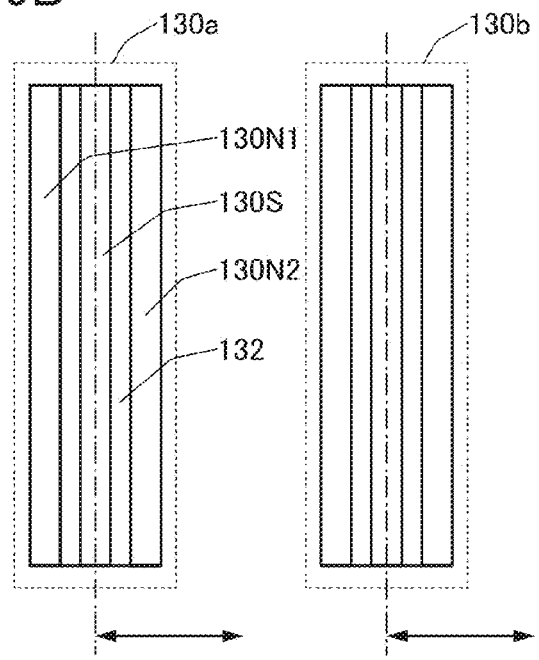

FIG. 9B is a top view of the magnet units 130a and 130b. In the magnet unit 130a, the rectangular or substantially rectangular magnet 130N1, the rectangular or substantially rectangular magnet 130N2, and the rectangular or substantially rectangular magnet 130S are fixed to the magnet holder 132. The magnet unit 130a can be oscillated horizontally as shown in FIG. 9B. For example, the magnet unit 130a may be oscillated with a beat of greater than or equal to 0.1 Hz and less than or equal to 1 kHz.

Thus, a region where a magnetic field on the target 100a is intense changes as the magnet unit 130a is oscillated. The region with an intense magnetic field is a high-density plasma region; thus, sputtering of the target 100a easily occurs in the vicinity of the region. For example, when the region with an intense magnetic field is fixed, only a specific region of the target 100a is used. In contrast, when the magnet unit 130a is oscillated as shown in FIG. 9B, the plasma 140 is generated between the target 100a and the substrate 160, and the target 100a can be uniformly used. By oscillating the magnet unit 130a, a film with a uniform thickness and uniform quality can be deposited.

By oscillating the magnet unit 130a, the state of the magnetic force line on the top surface of the substrate 160 can also be changed. The same applies to the magnet unit 130b.

Although the magnet unit 130a and the magnet unit 130b are oscillated in this example, one embodiment of the present invention is not limited to this example. For example, the magnet unit 130a and the magnet unit 130b may be rotated. For example, the magnet unit 130a and the magnet unit 130b may be rotated with a beat of greater than or equal to 0.1 Hz and less than or equal to 1 kHz. Alternatively, the target 100 may be rotated or moved. For example, the target 100 may be rotated or oscillated with a beat of greater than or equal to 0.1 Hz and less than or equal to 1 kHz. Further alternatively, the state of a magnetic force line on the top surface of the substrate 160 may be changed relatively by rotating the substrate 160. These methods may be combined.

The deposition chamber 101 may have a water channel inside or under the backing plate 110a and the backing plate 110b. By making fluid (air, nitrogen, a rare gas, water, oil, or the like) flow through the water channel, discharge anomaly due to an increase in the temperature of the target 100a and the target 100b or damage to the deposition chamber 101 due to deformation of a component can be prevented in the sputtering. In that case, the backing plate 110a and the target 100a are preferably adhered to each other with a bonding agent because the cooling capability is increased. Furthermore, the backing plate 110b and the target 100b are preferably adhered to each other with a bonding agent because the cooling capability is increased.

A gasket is preferably provided between the target holder 120a and the backing plate 110a, in which case an impurity is less likely to enter the deposition chamber 101 from the outside or the water channel. A gasket is preferably provided between the target holder 120b and the backing plate 110b, in which case an impurity is less likely to enter the deposition chamber 101 from the outside or the water channel.

In the magnet unit 130a, the magnets 130N1 and 130N2 and the magnet 130S are placed such that their surfaces on the target 100a side have opposite polarities. Here, the case where the pole of each of the magnets 130N1 and 130N2 on the target 100a side is the north pole and the pole of the magnet 130S on the target 100a side is the south pole is described. Note that the layout of the magnets and the poles in the magnet unit 130a are not limited to those described here or those illustrated in FIG. 9A. The same applies to the magnet unit 103b.

In the deposition, a potential whose level is varied between a high level and a low level is applied to the terminal V1 connected to the target holder 120a and a terminal V4 connected to the target holder 120b. The potential V2 applied to the terminal V2 connected to the substrate holder 170 is, for example, the ground potential. A potential V3 applied to a terminal V3 connected to the magnet holder 132 is, for example, the ground potential. Note that the potentials applied to the terminals V1, V2, V3, and V4 are not limited to the above description. Not all the target holder 120a, the target holder 120b, the substrate holder 170, and the magnet holder 132 are necessarily supplied with potentials. For example, the substrate holder 170 may be electrically floating. Note that the potential whose level is varied between the high level and the low level is applied to the terminal V1 connected to the target holder 120a and the terminal V4 connected to the target holder 120b (i.e., an AC sputtering method is employed) in the example illustrated in FIG. 9A; however, one embodiment of the present invention is not limited thereto.

FIG. 9A illustrates an example where the backing plate 110a and the target holder 120a are not electrically connected to the magnet unit 130a and the magnet holder 132, but electrical connection is not limited thereto. For example, the backing plate 110a and the target holder 120a may be electrically connected to the magnet unit 130a and the magnet holder 132, and the backing plate 110a, the target holder 120a, the magnet unit 130a, and the magnet holder 132 may have the same potential. The backing plate 110b and the target holder 120b are not electrically connected to the magnet unit 130b and the magnet holder 132 in the example, but electrical connection is not limited thereto. For example, the backing plate 110b and the target holder 120b may be electrically connected to the magnet unit 130b and the magnet holder 132, and the backing plate 110b, the target holder 120b, the magnet unit 130b, and the magnet holder 132 may have the same potential.

To increase the crystallinity of the formed oxide, the temperature of the substrate 160 may be set high. By setting the temperature of the substrate 160 high, migration of sputtered particles at the top surface of the substrate 160 can be promoted. Thus, an oxide with higher density and higher crystallinity can be deposited. Note that the temperature of the substrate 160 is, for example, higher than or equal to 100° C. and lower than or equal to 450° C., preferably higher than or equal to 150° C. and lower than or equal to 400° C., more preferably higher than or equal to 170° C. and lower than or equal to 350° C.

When the partial pressure of oxygen in the deposition gas is too high, an oxide including plural kinds of crystal phases is likely to be deposited; therefore, a mixed gas of oxygen and a rare gas such as argon (other examples of the rare gas are helium, neon, krypton, and xenon) is preferably used as the deposition gas. For example, the proportion of oxygen in the whole deposition gas is less than 50 vol %, preferably less than or equal to 33 vol %, further preferably less than or equal to 20 vol %, and still further preferably less than or equal to 15 vol %.

The vertical distance between the target 100a and the substrate 160 is greater than or equal to 10 mm and less than or equal to 600 mm, preferably greater than or equal to 20 mm and less than or equal to 400 mm, more preferably greater than or equal to 30 mm and less than or equal to 200 mm, further more preferably greater than or equal to 40 mm and less than or equal to 100 mm. Within the above range, the vertical distance between the target 100a and the substrate 160 is small enough to suppress a decrease in the energy of the sputtered particles until the sputtered particles reach the substrate 160 in some cases. Within the above range, the vertical distance between the target 100a and the substrate 160 is large enough to make the incident direction of the sputtered particle approximately vertical to the substrate 160, so that damage to the substrate 160 caused by collision of the sputtered particles can be reduced in some cases.

The vertical distance between the target 100b and the substrate 160 is greater than or equal to 10 mm and less than or equal to 600 mm, preferably greater than or equal to 20 mm and less than or equal to 400 mm, more preferably greater than or equal to 30 mm and less than or equal to 200 mm, further more preferably greater than or equal to 40 mm and less than or equal to 100 mm. Within the above range, the vertical distance between the target 100b and the substrate 160 is small enough to suppress a decrease in the energy of the sputtered particles until the sputtered particles reach the substrate 160 in some cases. Within the above range, the vertical distance between the target 100b and the substrate 160 is large enough to make the incident direction of the sputtered particle approximately vertical to the substrate 160, so that damage to the substrate 160 caused by collision of the sputtered particles can be reduced in some cases.

Figure 10A:
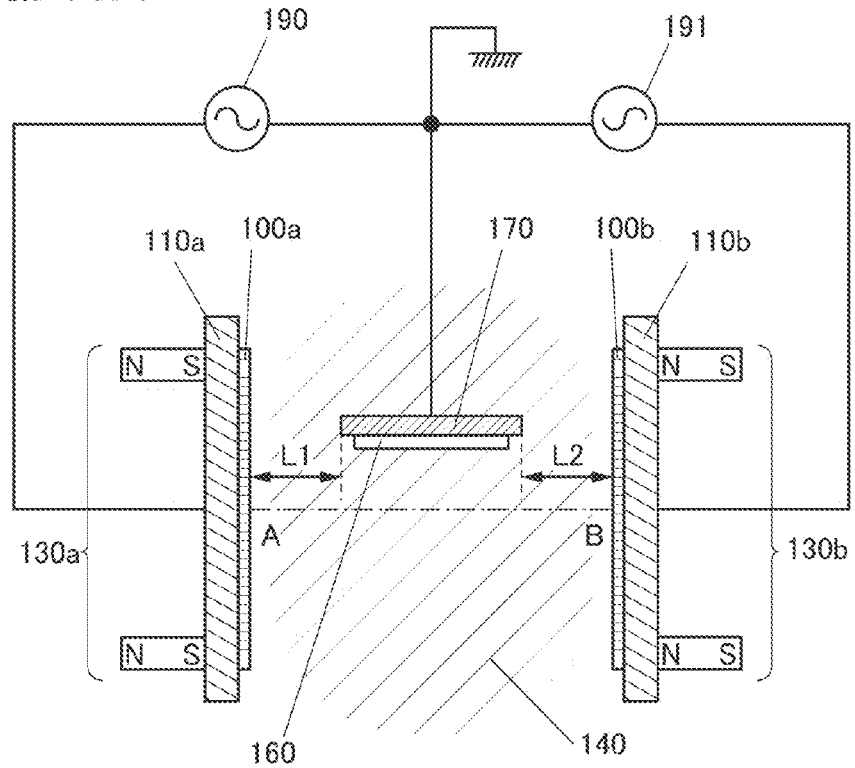
FIGS. 10A to 10C illustrate a sputtering apparatus.

FIG. 10A illustrates an example of a cross-sectional view of a deposition chamber different from those in FIG. 8A and FIG. 9A. FIG. 10A illustrates a facing-targets sputtering apparatus.

FIG. 10A is a schematic cross-sectional view of a deposition chamber of the sputtering apparatus. In the deposition chamber illustrated in FIG. 10A, the target 100a, the target 100b, the backing plate 110a for holding the target 100a, the backing plate 110b for holding the target 100b, the magnet unit 130a placed on a back side of the target 100a with the backing plate 110a positioned therebetween, and the magnet unit 130b placed on a back side of the target 100b with the backing plate 110b positioned therebetween. The substrate holder 170 is placed between the target 100a and the target 100b. When the substrate 160 is transferred into the deposition chamber, the substrate 160 is fixed with the substrate holder 170.

As illustrated in FIG. 10A, a power source 190 and a power source 191 for applying potentials are connected to the backing plates 110a and 110b. It is preferable to use AC power sources, which inversely apply alternate high and low potentials, as the power source 190 connected to the backing plate 110a and the power source 191 connected to the backing plate 110b. Although AC power sources are used as the power sources 190 and 191 illustrated in FIG. 10A, one embodiment of the present invention is not limited thereto. For example, RF power sources, DC power sources, or the like can be used as the power sources 190 and 191. Alternatively, different kinds of power sources may be used as the power sources 190 and 191.

The substrate holder 170 is preferably connected to GND. The substrate holder 170 may be in a floating state.

Figure 10B:
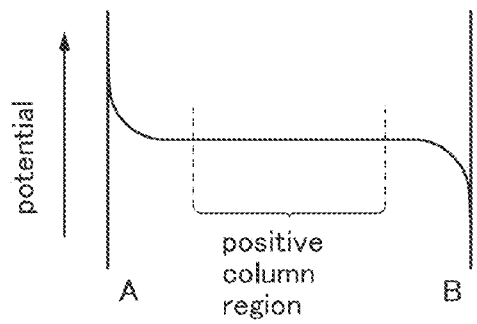
Figure 10C:
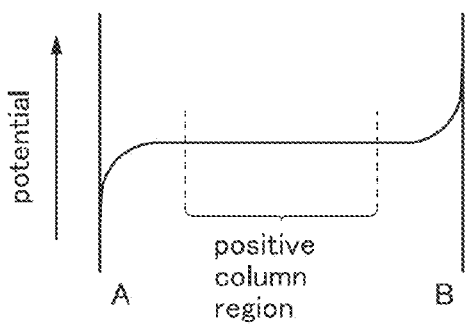

FIGS. 10B and 10C each show potential distribution of the plasma 140 along dashed-dotted line A-B in FIG. 10A. FIG. 10B shows the potential distribution in the case where a high potential is applied to the backing plate 110a and a low potential is applied to the backing plate 110b. In that case, a cation is accelerated toward the target 100b. FIG. 10C shows the potential distribution in the case where a low potential is applied to the backing plate 110a and a high potential is applied to the backing plate 110b. In that case, a cation is accelerated toward the target 100a. For the deposition, the state in FIG. 10B and the state in FIG. 10C can be alternated.

The deposition is preferably performed while the plasma 140 completely reaches the surface of the substrate 160. For example, the substrate holder 170 and the substrate 160 are preferably placed in the plasma 140 as illustrated in FIG. 10A. It is particularly preferable that the substrate holder 170 and the substrate 160 be placed in a positive column of the plasma 140. The positive column of the plasma 140 is, in each of FIGS. 10B and 10C, a region where the gradient of the potential distribution is small. When the substrate 160 is placed in the positive column of the plasma 140 as illustrated in FIG. 10A, the substrate 160 is not exposed to a high electric field portion in the plasma 140; thus, the substrate 160 has less damage due to the plasma 140 and has few defects.

It is preferable to place the substrate holder 170 and the substrate 160 in the plasma 140 during deposition as illustrated in FIG. 10A also because utilization efficiencies of the targets 100a and 100b are increased.

As illustrated in FIG. 10A, the horizontal distance between the substrate holder 170 and the target 100a is referred to as L1 and the horizontal distance between the substrate holder 170 and the target 100b is referred to as L2. The distance L1 and the distance L2 are preferably the same length. In addition, it is preferable that the distances L1 and L2 be adjusted as appropriate so that the substrate 160 is placed in the positive column of the plasma 140, as described above. The distances L1 and L2 can each be, for example, greater than or equal to 10 mm and less than or equal to 200 mm.

In FIG. 10A, the target 100a and the target 100b are parallel to each other. Moreover, the magnet unit 130a and the magnet unit 130b are placed so that opposite poles of magnets face each other. In that case, magnetic force lines are from the magnet unit 130b toward the magnet unit 130a. Thus, the plasma 140 is confined by magnetic fields formed by the magnet unit 130a and the magnet unit 130b during deposition. The substrate holder 170 and the substrate 160 are placed in a region where the target 100a and the target 100b face each other (region between targets). Note that although the substrate holder 170 and the substrate 160 are placed parallel to the direction in which the target 100a and the target 100b face each other in FIG. 10A, the substrate holder 170 and the substrate 160 may be inclined to the direction. By inclination of the substrate holder 170 and the substrate 160 at 30° or more and 60° or less (typified by 45°), for example, the proportion of sputtered particles that perpendicularly reach the substrate 160 during deposition can be increased.

Figure 11:
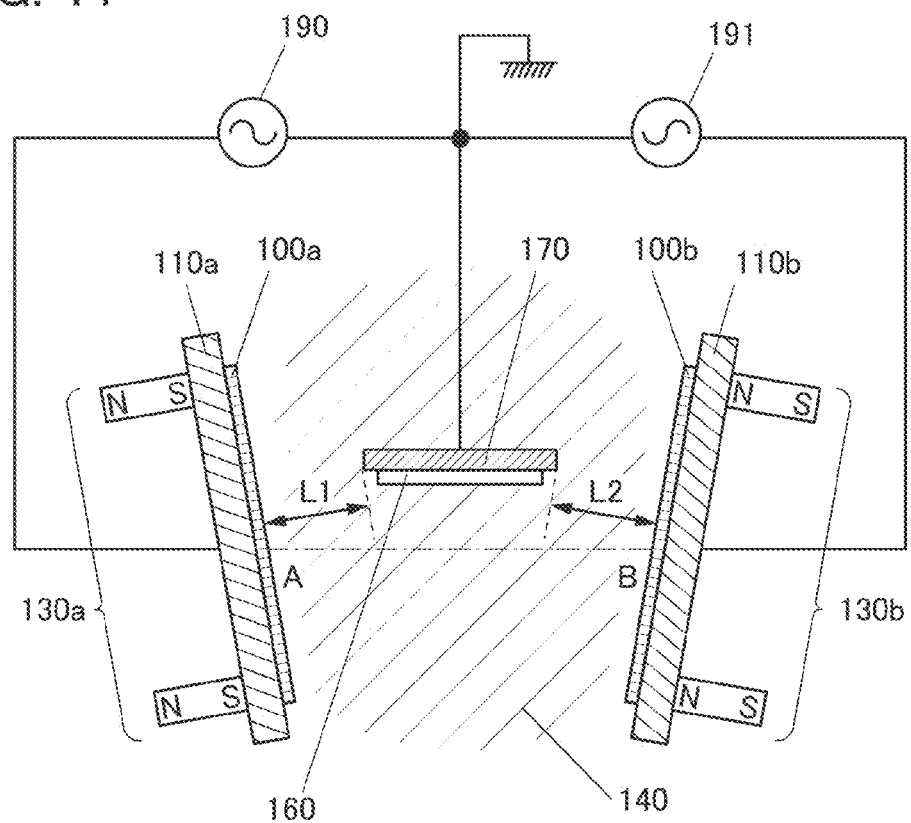
FIG. 11 illustrates a sputtering apparatus.

A structure illustrated in FIG. 11 is different from that illustrated in FIG. 10A in that the target 100a and the target 100b that face each other are not parallel but inclined to each other. Thus, the description for FIG. 10A is referred to for the description except for the positions of the targets. The magnet unit 130a and the magnet unit 130b are placed so that opposite poles of magnets face each other. The substrate holder 170 and the substrate 160 are placed in a region between targets. With the targets 100a and 100b placed as illustrated in FIG. 11, the proportion of sputtered particles that reach the substrate 160 can be increased; accordingly, the deposition rate can be increased.

Figure 12:
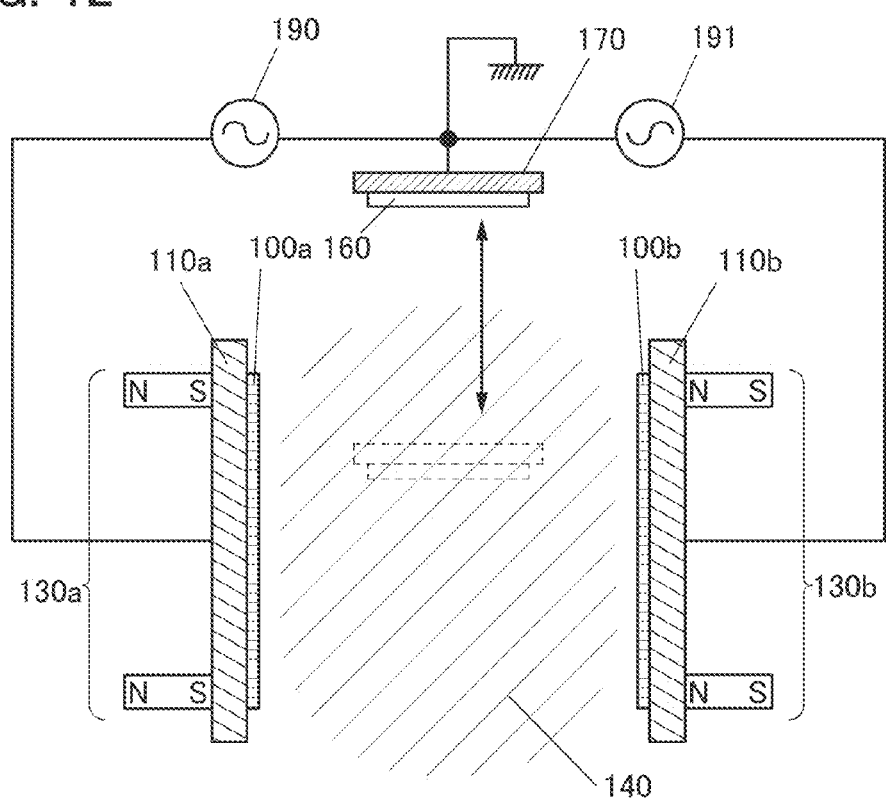
FIG. 12 illustrates a sputtering apparatus.

The positions of the substrate holder 170 and the substrate 160 are not limited to in the plasma 140 as illustrated in FIG. 10A. The substrate holder 170 and the substrate 160 may be placed outside the plasma 140 as illustrated in FIG. 12, for example. In that case, the substrate 160 is not exposed to a high electric field region of the plasma 140, leading to a reduction in damage due to the plasma 140. Note that the utilization efficiencies of the targets 100a and 100b are decreased as the distance between the plasma 140 and the substrate 160 are increased. It is preferable that the position of the substrate holder 170 be adjustable as illustrated in FIG. 12.

The substrate holder 170 may be placed above a region between targets, or may be placed below the region. Alternatively, the substrate holders 170 may be placed above and below the region. When the substrate holders 170 are provided above and below the region, deposition on two or more substrates can be performed at once, leading to an increase in productivity. Note that the position above or below the region where the target 100a and the target 100b face each other can also be referred to as the side of the region where the target 100a and the target 100b face each other.

The facing-targets sputtering apparatus can stably generate plasma even in high vacuum. Thus, deposition can be performed at a pressure higher than or equal to 0.005 Pa and lower than or equal to 0.09 Pa, for example. As a result, the concentration of impurities contained during deposition can be reduced.

The use of the facing-targets sputtering apparatus allows deposition in high vacuum or deposition with less plasma damage and thus can provide a film with high crystallinity even when the temperature of the substrate 160 is low (e.g., higher than or equal to 10° C. and lower than 100° C.).

Figure 13A:
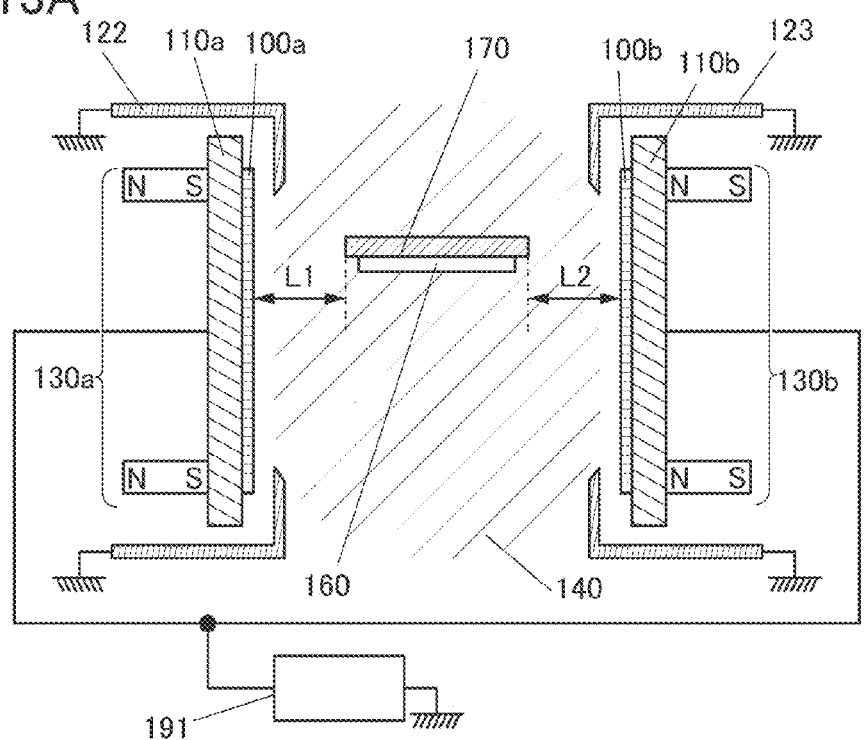
FIGS. 13A and 13B illustrate a sputtering apparatus.

FIG. 13A illustrates another example of a facing-targets sputtering apparatus.

FIG. 13A is a schematic cross-sectional view of a deposition chamber of a facing-targets sputtering apparatus. Unlike in the deposition chamber illustrated in FIG. 10A, a target shield 122 and a target shield 123 are provided. The power source 191 connected to the backing plates 110a and 110b is also provided.

The target shields 122 and 123 are connected to GND as illustrated in FIG. 13A. This means that the plasma 140 is generated by a potential difference between the backing plates 110a and 110b to which a potential of the power source 191 is applied and the target shields 122 and 123 to which GND is applied.

The deposition is preferably performed while the plasma 140 completely reaches the surface of the substrate 160. For example, the substrate holder 170 and the substrate 160 are preferably placed in the plasma 140 as illustrated in FIG. 13A. It is particularly preferable that the substrate holder 170 and the substrate 160 be placed in a positive column of the plasma 140. The positive column of the plasma is a region where the gradient of the potential distribution is small. When the substrate 160 is placed in the positive column of the plasma 140 as illustrated in FIG. 13A, the substrate 160 is not exposed to a high electric field portion in the plasma 140; thus, damage to the substrate 160 due to the plasma 140 can be reduced and an oxide with a favorable film quality can be obtained.

It is preferable to place the substrate holder 170 and the substrate 160 in the plasma 140 during deposition as illustrated in FIG. 13A also because utilization efficiencies of the targets 100a and 100b are increased.

As illustrated in FIG. 13A, the horizontal distance between the substrate holder 170 and the target 100a is referred to as L1 and the horizontal distance between the substrate holder 170 and the target 100b is referred to as L2. The distance L1 and the distance L2 are each preferably as long as the length of the substrate 160 in the horizontal direction in FIG. 13A. In addition, it is preferable that the distances L1 and L2 be adjusted as appropriate so that the substrate 160 is placed in the positive column of the plasma 140 as described above.

Figure 13B:
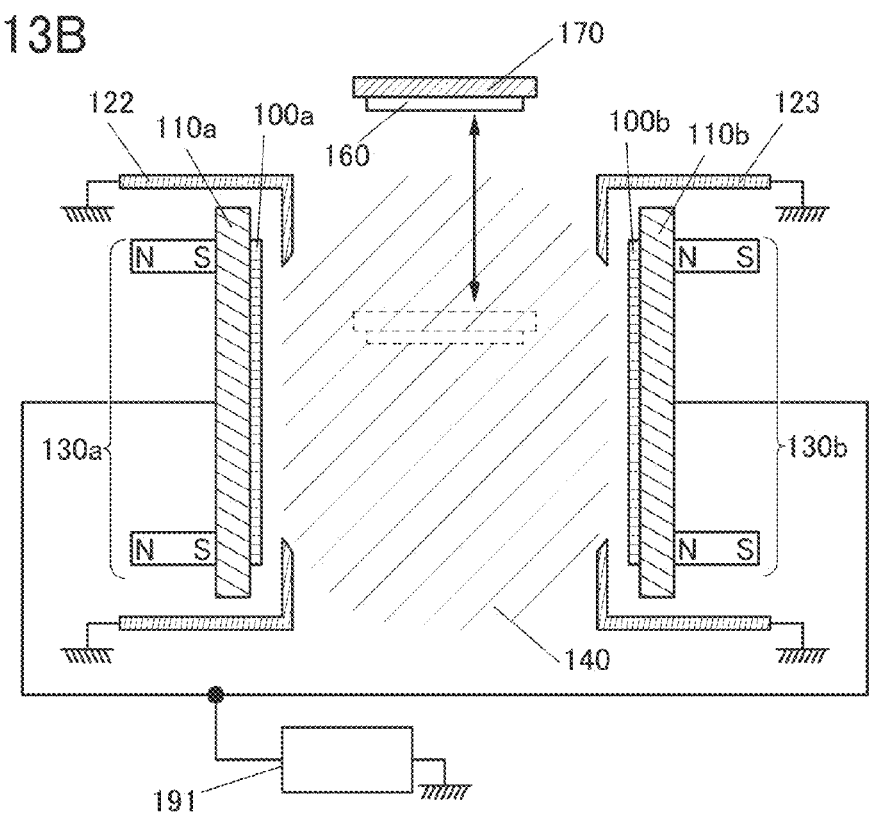

The positions of the substrate holder 170 and the substrate 160 are not limited to in the plasma 140 as illustrated in FIG. 13A. The substrate holder 170 and the substrate 160 may be placed outside the plasma 140 as illustrated in FIG. 13B, for example. In that case, the substrate 160 is not exposed to a high electric field region of the plasma 140, leading to a reduction in damage due to the plasma 140. Note that the utilization efficiencies of the targets 100a and 100b are decreased as the distance between the plasma 140 and the substrate 160 are increased. It is preferable that the position of the substrate holder 170 be adjustable as in FIG. 13B.

The substrate holder 170 may be placed above a region where the target 100a and the target 100b face each other as illustrated in FIG. 13B, or may be placed below the region. Alternatively, the substrate holders 170 may be placed above and below the region. Providing the substrate holders 170 above and below the region allows deposition on two or more substrates at once, leading to an increase in productivity.

In the above-described facing-targets sputtering apparatuses, plasma is confined by magnetic fields between targets; thus, plasma damage to a substrate can be reduced. Furthermore, a deposited film can have improved step coverage because an incident angle of a sputtered particle to a substrate can be made smaller by the inclination of the target. Moreover, deposition in high vacuum enables the concentration of impurities contained in the film to be reduced.

Note that a parallel-plate-type sputtering apparatus or an ion beam sputtering apparatus may be provided in the deposition chamber.

<Deposition Apparatus>

A deposition apparatus of one embodiment of the present invention including a deposition chamber in which a sputtering target can be placed will be described below.

First, a structure of a deposition apparatus which allows the entry of few impurities into a film at the time of the deposition or the like is described with reference to FIG. 14 and FIGS. 15A to 15C.

Figure 14:
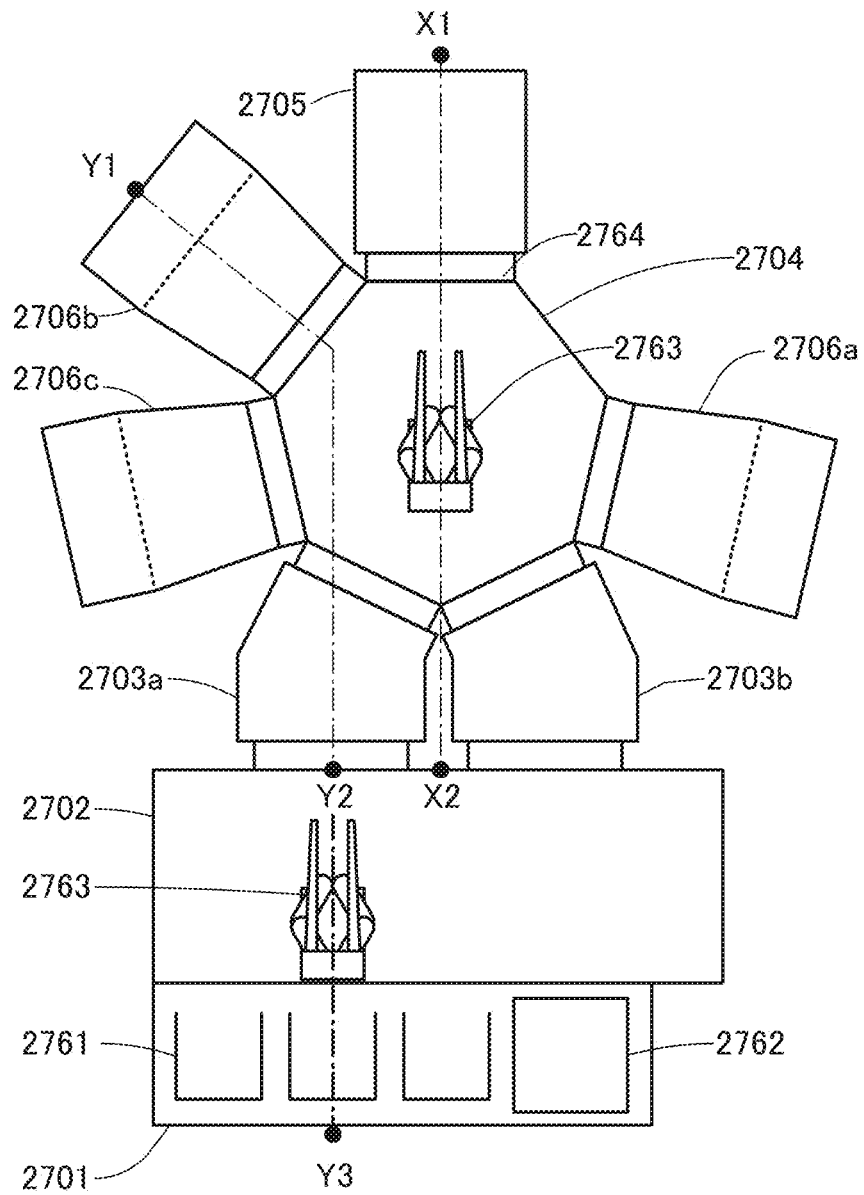
FIG. 14 is a top view illustrating an example of a deposition apparatus.

FIG. 14 is a top view schematically illustrating a single wafer multi-chamber deposition apparatus 2700. The deposition apparatus 2700 includes an atmosphere-side substrate supply chamber 2701 including a cassette port 2761 for holding a substrate and an alignment port 2762 for performing alignment of a substrate, an atmosphere-side substrate transfer chamber 2702 through which a substrate is transferred from the atmosphere-side substrate supply chamber 2701, a load lock chamber 2703a where a substrate is carried and the pressure inside the chamber is switched from atmospheric pressure to reduced pressure or from reduced pressure to atmospheric pressure, an unload lock chamber 2703b where a substrate is carried out and the pressure inside the chamber is switched from reduced pressure to atmospheric pressure or from atmospheric pressure to reduced pressure, a transfer chamber 2704 through which a substrate is transferred in a vacuum, a substrate heating chamber 2705 where a substrate is heated, and deposition chambers 2706a, 2706b, and 2706c in each of which a target is placed for deposition. Note that the deposition chambers 2706a, 2706b, and 2706c each have a structure similar to the structure of any of the above-described deposition chambers.

The atmosphere-side substrate transfer chamber 2702 is connected to the load lock chamber 2703a and the unload lock chamber 2703b, the load lock chamber 2703a and the unload lock chamber 2703b are connected to the transfer chamber 2704, and the transfer chamber 2704 is connected to the substrate heating chamber 2705 and the deposition chambers 2706a, 2706b, and 2706c.

Gate valves 2764 are provided for connecting portions between chambers so that each chamber except the atmosphere-side substrate supply chamber 2701 and the atmosphere-side substrate transfer chamber 2702 can be independently kept under vacuum. Moreover, the atmosphere-side substrate transfer chamber 2702 and the transfer chamber 2704 each include a transfer robot 2763, with which a substrate can be transferred.

Furthermore, it is preferable that the substrate heating chamber 2705 also serve as a plasma treatment chamber. In the deposition apparatus 2700, it is possible to transfer a substrate without exposure to the air between treatment and treatment; therefore, adsorption of impurities on a substrate can be suppressed. In addition, the order of deposition, heat treatment, or the like can be freely determined. Note that the number of the transfer chambers, the number of the deposition chambers, the number of the load lock chambers, the number of the unload lock chambers, and the number of the substrate heating chambers are not limited to the above, and the numbers thereof can be set as appropriate depending on the space for placement or the process conditions.

Figure 15A:
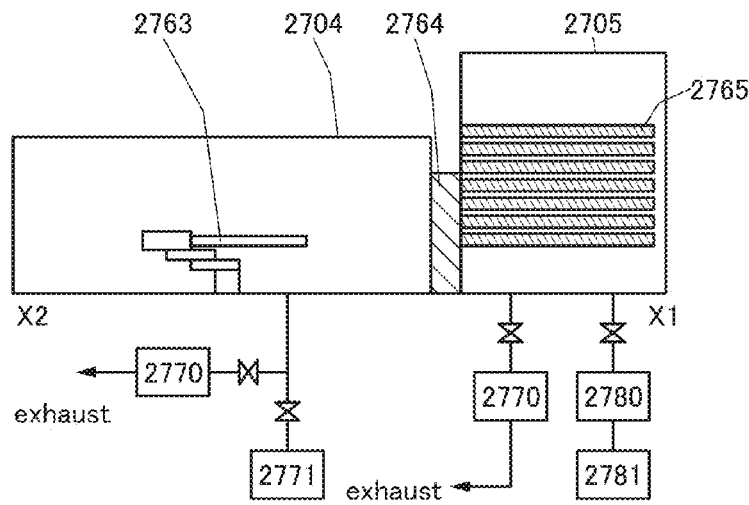
FIGS. 15A to 15C are cross-sectional views each illustrating an example of a deposition apparatus.
Figure 15B:
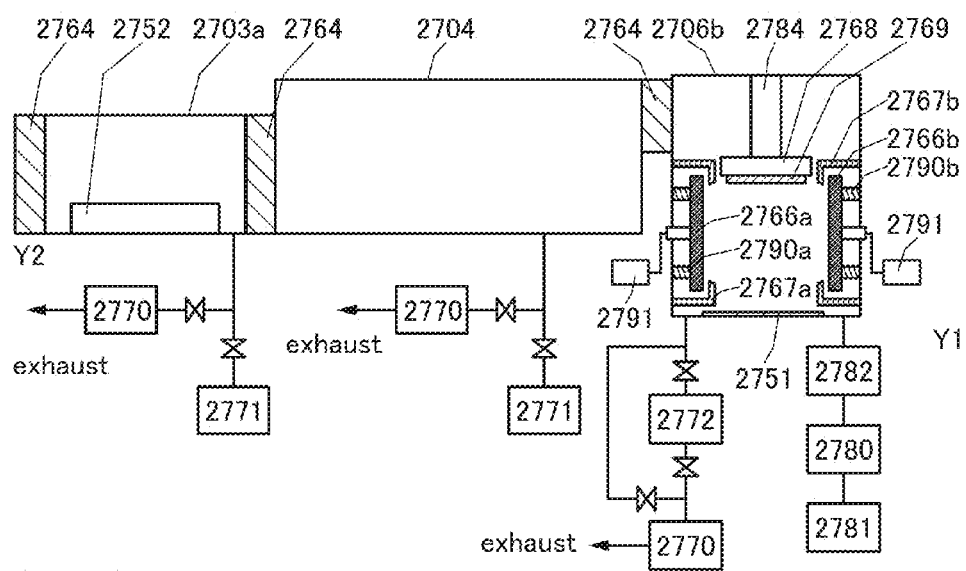
Figure 15C:
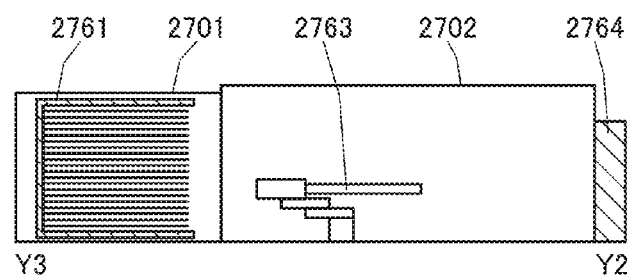

Next, FIG. 15A, FIG. 15B, and FIG. 15C are a cross-sectional view taken along dashed-dotted line X1-X2, a cross-sectional view taken along dashed-dotted line Y1-Y2, and a cross-sectional view taken along dashed-dotted line Y2-Y3, respectively, in the deposition apparatus 2700 illustrated in FIG. 14.

FIG. 15A is a cross section of the substrate heating chamber 2705 and the transfer chamber 2704, and the substrate heating chamber 2705 includes a plurality of heating stages 2765 which can hold a substrate. Furthermore, the substrate heating chamber 2705 is connected to a vacuum pump 2770 through a valve. As the vacuum pump 2770, a dry pump and a mechanical booster pump can be used, for example.

As heating mechanism which can be used for the substrate heating chamber 2705, a resistance heater may be used for heating, for example. Alternatively, heat conduction or heat radiation from a medium such as a heated gas may be used as the heating mechanism. For example, rapid thermal annealing (RTA) such as gas rapid thermal annealing (GRTA) or lamp rapid thermal annealing (LRTA) can be used. The LRTA is a method for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA, heat treatment is performed using a high-temperature gas. An inert gas is used as the gas.

Moreover, the substrate heating chamber 2705 is connected to a refiner 2781 through a mass flow controller 2780. Note that although the mass flow controller 2780 and the refiner 2781 can be provided for each of a plurality of kinds of gases, only one mass flow controller 2780 and one refiner 2781 are provided for easy understanding. As the gas introduced to the substrate heating chamber 2705, a gas whose dew point is −80° C. or lower, preferably −100° C. or lower can be used; for example, an oxygen gas, a nitrogen gas, and a rare gas (e.g., an argon gas) are used.

The transfer chamber 2704 includes the transfer robot 2763. The transfer robot 2763 can transfer a substrate to each chamber. Furthermore, the transfer chamber 2704 is connected to the vacuum pump 2770 and a cryopump 2771 through valves. Owing to such a structure, exhaust is performed using the vacuum pump 2770 until the pressure inside the transfer chamber 2704 becomes in the range of atmospheric pressure to low or medium vacuum (approximately 0.1 Pa to several hundred pascals) and then the valves are switched so that exhaust is performed using the cryopump 2771 until the pressure inside the transfer chamber 2704 becomes in the range of middle vacuum to high or ultra-high vacuum (0.1 Pa to $1 \times 10^{-7}$ Pa).

Alternatively, two or more cryopumps 2771 may be connected in parallel to the transfer chamber 2704. With such a structure, even when one of the cryopumps is in regeneration, exhaust can be performed using any of the other cryopumps. Note that the above regeneration refers to treatment for discharging molecules (or atoms) entrapped in the cryopump. When molecules (or atoms) are entrapped too much in a cryopump, the exhaust capability of the cryopump is lowered; therefore, regeneration is performed regularly.

FIG. 15B is a cross section of the deposition chamber 2706b, the transfer chamber 2704, and the load lock chamber 2703a.

Here, the details of the deposition chamber (sputtering chamber) are described with reference to FIG. 15B. The deposition chamber 2706b illustrated in FIG. 15B includes a target 2766a, a target 2766b, a target shield 2767a, a target shield 2767b, a magnet unit 2790a, a magnet unit 2790b, a substrate holder 2768, and power sources 2791. Although not illustrated, each of the target 2766a and the target 2766b is fixed to a target holder with a backing plate provided therebetween. The power source 2791 is electrically connected to each of the target 2766a and the target 2766b. The magnet unit 2790a is placed on a back side of the target 2766a and the magnet unit 2790b is placed on a back side of the target 2766b. The target shield 2767a is provided so as to surround an end portion of the target 2766a and the target shield 2767b is provided so as to surround an end portion of target 2766b. Note that here, a substrate 2769 is supported by the substrate holder 2768. The substrate holder 2768 is fixed to the deposition chamber 2706b by an adjustment member 2784. Owing to the adjustment member 2784, the substrate holder 2768 can move to a region between the target 2766a and the target 2766b (region between targets). Providing the substrate holder 2768 supporting the substrate 2769 in the region between targets can reduce damage due to plasma in some cases, for example. Although not illustrated, the substrate holder 2768 may include a substrate holding mechanism which holds the substrate 2769, a heater which heats the substrate 2769 from the back side, or the like.

The target shields 2767 can suppress deposition of a particle which is sputtered from the target 2766 on a region where deposition is not needed. Moreover, the target shields 2767 are preferably processed to prevent accumulated sputtered particles from being separated. For example, blasting treatment which increases surface roughness may be performed, or roughness may be formed on the surfaces of the target shields 2767.

The deposition chamber 2706b is connected to the mass flow controller 2780 through a gas heating system 2782, and the gas heating system 2782 is connected to the refiner 2781 through the mass flow controller 2780. With the gas heating system 2782, a gas which is introduced to the deposition chamber 2706b can be heated to a temperature higher than or equal to 40° C. and lower than or equal to 400° C., preferably higher than or equal to 50° C. and lower than or equal to 200° C. Note that although the gas heating system 2782, the mass flow controller 2780, and the refiner 2781 can be provided for each of a plurality of kinds of gases, only one gas heating system 2782, one mass flow controller 2780, and one refiner 2781 are provided for easy understanding. As the gas introduced to the deposition chamber 2706b, a gas whose dew point is −80° C. or lower, preferably −100° C. or lower can be used; for example, an oxygen gas, a nitrogen gas, and a rare gas (e.g., an argon gas) are used.

In the case where the refiner is provided near a gas inlet, the length of a pipe between the refiner and the deposition chamber 2706b is less than or equal to 10 m, preferably less than or equal to 5 m, and further preferably less than or equal to 1 m. When the length of the pipe is less than or equal to 10 m, less than or equal to 5 m, or less than or equal to 1 m, the effect of the release of gas from the pipe can be reduced accordingly. As the pipe for the gas, a metal pipe the inside of which is covered with iron fluoride, aluminum oxide, chromium oxide, or the like can be used. With the above pipe, the amount of released gas containing impurities is made small and the entry of impurities into the gas can be reduced as compared with a SUS316L-EP pipe, for example. Furthermore, a high-performance ultra-compact metal gasket joint (UPG joint) may be used as a joint of the pipe. A structure where all the materials of the pipe are metals is preferable because the effect of the generated released gas or the external leakage can be reduced as compared with a structure where a resin or the like is used.

The deposition chamber 2706b is connected to a turbo molecular pump 2772 and the vacuum pump 2770 through valves.

In addition, the deposition chamber 2706b is provided with a cryotrap 2751.

The cryotrap 2751 is a mechanism which can adsorb a molecule (or an atom) having a relatively high melting point, such as water. The turbo molecular pump 2772 is capable of stably removing a large-sized molecule (or atom), needs low frequency of maintenance, and thus enables high productivity, whereas it has a low capability in removing hydrogen and water. Hence, the cryotrap 2751 is connected to the deposition chamber 2706b so as to have a high capability in removing water or the like. The temperature of a refrigerator of the cryotrap 2751 is set to be lower than or equal to 100 K, preferably lower than or equal to 80 K. In the case where the cryotrap 2751 includes a plurality of refrigerators, it is preferable to set the temperatures of the refrigerators at different temperatures because efficient exhaust is possible. For example, the temperature of a first-stage refrigerator may be set to be lower than or equal to 100 K and the temperature of a second-stage refrigerator may be set to be lower than or equal to 20 K. Note that when a titanium sublimation pump is used instead of the cryotrap, a higher vacuum can be achieved in some cases. Using an ion pump instead of a cryopump or a turbo molecular pump can also achieve higher vacuum in some cases.

Note that the exhaust method of the deposition chamber 2706b is not limited to the above, and a structure similar to that in the exhaust method described above for the transfer chamber 2704 (the exhaust method using the cryopump and the vacuum pump) may be employed. Needless to say, the exhaust method of the transfer chamber 2704 may have a structure similar to that of the deposition chamber 2706b (the exhaust method using the turbo molecular pump and the vacuum pump).

Note that in each of the transfer chamber 2704, the substrate heating chamber 2705, and the deposition chamber 2706b which are described above, the back pressure (total pressure) and the partial pressure of each gas molecule (atom) are preferably set as follows. In particular, the back pressure and the partial pressure of each gas molecule (atom) in the deposition chamber 2706b need to be noted because impurities might enter a film to be formed.

In each of the above chambers, the back pressure (total pressure) is less than or equal to $1\times10^{-4}$ Pa, preferably less than or equal to $3\times10^{-5}$ Pa, and further preferably less than or equal to $1\times10^{-5}$ Pa. In each of the above chambers, the partial pressure of a gas molecule (atom) having a mass-to-charge ratio (m/z) of 18 is less than or equal to $3\times10^{-5}$ Pa, preferably less than or equal to $1\times10^{-5}$ Pa, and further preferably less than or equal to $3\times10^{-6}$ Pa. Moreover, in each of the above chambers, the partial pressure of a gas molecule (atom) having a mass-to-charge ratio (m/z) of 28 is less than or equal to $3\times10^{-5}$ Pa, preferably less than or equal to $1\times10^{-5}$ Pa, and further preferably less than or equal to $3\times10^{-6}$ Pa. Furthermore, in each of the above chambers, the partial pressure of a gas molecule (atom) having a mass-to-charge ratio (m/z) of 44 is less than or equal to $3\times10^{-5}$ Pa, preferably less than or equal to $1\times10^{-5}$ Pa, and further preferably less than or equal to $3\times10^{-6}$ Pa.

Note that a total pressure and a partial pressure in a vacuum chamber can be measured using a mass analyzer. For example, Qulee CGM-051, a quadrupole mass analyzer (also referred to as Q-mass) manufactured by ULVAC, Inc. may be used.

Moreover, the transfer chamber 2704, the substrate heating chamber 2705, and the deposition chamber 2706b which are described above preferably have a small amount of external leakage or internal leakage.

For example, in each of the transfer chamber 2704, the substrate heating chamber 2705, and the deposition chamber 2706b which are described above, the leakage rate is less than or equal to $3\times10^{-6}$ Pa·m$^3$/s, and preferably less than or equal to $1\times10^{-6}$ Pa·m$^3$/s. The leakage rate of a gas molecule (atom) having a mass-to-charge ratio (m/z) of 18 is less than or equal to $1\times10^{-7}$ Pa·m$^3$/s, and preferably less than or equal to $3\times10^{-8}$ Pa·m$^3$/s. The leakage rate of a gas molecule (atom) having a mass-to-charge ratio (m/z) of 28 is less than or equal to $1\times10^{-5}$ Pa·m$^3$/s, and preferably less than or equal to $1\times10^{-6}$ Pa·m$^3$/s. The leakage rate of a gas molecule (atom) having a mass-to-charge ratio (m/z) of 44 is less than or equal to $3\times10^{-6}$ Pa·m$^3$/s, and preferably less than or equal to $1\times10^{-6}$ Pa·m$^3$/s.

Note that a leakage rate can be derived from the total pressure and partial pressure measured using the mass analyzer.

The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate can be set to be less than or equal to the above value.

For example, an open/close portion of the deposition chamber 2706b can be sealed with a metal gasket. For the metal gasket, metal covered with iron fluoride, aluminum oxide, or chromium oxide is preferably used. The metal gasket realizes higher adhesion than an O-ring, and can reduce the external leakage. Furthermore, with the use of the metal covered with iron fluoride, aluminum oxide, chromium oxide, or the like, which is in the passive state, the release of gas containing impurities released from the metal gasket is suppressed, so that the internal leakage can be reduced.

For a member of the deposition apparatus 2700, aluminum, chromium, titanium, zirconium, nickel, or vanadium, which releases a smaller amount of gas containing impurities, is used. Alternatively, for the above member, an alloy containing iron, chromium, nickel, and the like covered with the above material may be used. The alloy containing iron, chromium, nickel, and the like is rigid, resistant to heat, and suitable for processing. Here, when surface unevenness of the member is decreased by polishing or the like to reduce the surface area, the release of gas can be reduced.

Alternatively, the above member of the deposition apparatus 2700 may be covered with iron fluoride, aluminum oxide, chromium oxide, or the like.

The member of the deposition apparatus 2700 is preferably formed using only metal when possible. For example, in the case where a viewing window formed with quartz or the like is provided, it is preferable that the surface of the viewing window be thinly covered with iron fluoride, aluminum oxide, chromium oxide, or the like so as to suppress release of gas.

When an adsorbed substance is present in the deposition chamber, the adsorbed substance does not affect the pressure in the deposition chamber because it is adsorbed onto an inner wall or the like; however, the adsorbed substance causes gas to be released when the inside of the deposition chamber is evacuated. Therefore, although there is no correlation between the leakage rate and the exhaust rate, it is important that the adsorbed substance present in the deposition chamber be desorbed as much as possible and exhaust be performed in advance with the use of a pump with high exhaust capability. Note that the deposition chamber may be subjected to baking to promote desorption of the adsorbed substance. By the baking, the desorption rate of the adsorbed substance can be increased about tenfold. The baking can be performed at a temperature in the range of 100° C. to 450° C. At this time, when the adsorbed substance is removed while an inert gas is introduced to the deposition chamber, the desorption rate of water or the like, which is difficult to be desorbed simply by exhaust, can be further increased. Note that when the inert gas which is introduced is heated to substantially the same temperature as the baking temperature, the desorption rate of the adsorbed substance can be further increased. Here, a rare gas is preferably used as an inert gas. Depending on the kind of a film to be deposited, oxygen or the like may be used instead of an inert gas. For example, in deposition of an oxide, the use of oxygen which is the main component of the oxide is preferable in some cases. The baking is preferably performed using a lamp.

Alternatively, treatment for evacuating the inside of the deposition chamber is preferably performed a certain period of time after heated oxygen, a heated inert gas such as a heated rare gas, or the like is introduced to increase a pressure in the deposition chamber. The introduction of the heated gas can desorb the adsorbed substance in the deposition chamber, and the impurities present in the deposition chamber can be reduced. Note that an advantageous effect can be achieved when this treatment is repeated more than or equal to 2 times and less than or equal to 30 times, preferably more than or equal to 5 times and less than or equal to 15 times. Specifically, an inert gas, oxygen, or the like with a temperature higher than or equal to 40° C. and lower than or equal to 400° C., preferably higher than or equal to 50° C. and lower than or equal to 200° C. is introduced to the deposition chamber, so that the pressure therein can be kept to be greater than or equal to 0.1 Pa and less than or equal to 10 kPa, preferably greater than or equal to 1 Pa and less than or equal to 1 kPa, further preferably greater than or equal to 5 Pa and less than or equal to 100 Pa in the time range of 1 minute to 300 minutes, preferably 5 minutes to 120 minutes. After that, the inside of the deposition chamber is evacuated in the time range of 5 minutes to 300 minutes, preferably 10 minutes to 120 minutes.

The desorption rate of the adsorbed substance can be further increased also by dummy deposition. Here, the dummy deposition refers to deposition on a dummy substrate by a sputtering method or the like, in which a film is deposited on the dummy substrate and the inner wall of the deposition chamber so that impurities in the deposition chamber and an adsorbed substance on the inner wall of the deposition chamber are confined in the film. For a dummy substrate, a substrate which releases a smaller amount of gas is preferably used. By performing dummy deposition, the concentration of impurities in a film to be formed later can be reduced. Note that the dummy deposition may be performed at the same time as the baking of the deposition chamber.

Next, the details of the transfer chamber 2704 and the load lock chamber 2703a illustrated in FIG. 15B and the atmosphere-side substrate transfer chamber 2702 and the atmosphere-side substrate supply chamber 2701 illustrated in FIG. 15C are described. Note that FIG. 15C is a cross section of the atmosphere-side substrate transfer chamber 2702 and the atmosphere-side substrate supply chamber 2701.

For the transfer chamber 2704 illustrated in FIG. 15B, the description of the transfer chamber 2704 illustrated in FIG. 15A can be referred to.

The load lock chamber 2703a includes a substrate delivery stage 2752. When a pressure in the load lock chamber 2703a becomes atmospheric pressure by being increased from reduced pressure, the substrate delivery stage 2752 receives a substrate from the transfer robot 2763 provided in the atmosphere-side substrate transfer chamber 2702. After that, the load lock chamber 2703a is evacuated into vacuum so that the pressure therein becomes reduced pressure and then the transfer robot 2763 provided in the transfer chamber 2704 receives the substrate from the substrate delivery stage 2752.

Furthermore, the load lock chamber 2703a is connected to the vacuum pump 2770 and the cryopump 2771 through valves. For a method for connecting exhaust systems such as the vacuum pump 2770 and the cryopump 2771, the description of the method for connecting the transfer chamber 2704 can be referred to, and the description thereof is omitted here. Note that the unload lock chamber 2703b illustrated in FIG. 14 can have a structure similar to that in the load lock chamber 2703a.

The atmosphere-side substrate transfer chamber 2702 includes the transfer robot 2763. The transfer robot 2763 can deliver a substrate from the cassette port 2761 to the load lock chamber 2703a or deliver a substrate from the load lock chamber 2703a to the cassette port 2761. Furthermore, a mechanism for suppressing entry of dust or a particle, such as high efficiency particulate air (HEPA) filter, may be provided above the atmosphere-side substrate transfer chamber 2702 and the atmosphere-side substrate supply chamber 2701.

The atmosphere-side substrate supply chamber 2701 includes a plurality of cassette ports 2761. The cassette port 2761 can hold a plurality of substrates.

The surface temperature of the target is set to be lower than or equal to 100° C., preferably lower than or equal to 50° C., and further preferably about room temperature (typified by 25° C.). In a sputtering apparatus for a large substrate, a large target is often used. However, it is difficult to form a target for a large substrate without a juncture. In reality, a plurality of targets are tightly arranged to obtain a large target; however, a slight space inevitably exists. When the surface temperature of the target increases, in some cases, zinc or the like is volatilized from such a slight space and the space might gradually expand. When the space expands, a metal of a backing plate or a metal contained in a bonding agent used for adhesion of the backing plate to a target might be sputtered and might cause an increase in impurity concentration. Thus, it is preferable that the target be cooled sufficiently.

To efficiently cool the target, a metal having high conductivity and a high heat dissipation property (specifically copper) is used for the backing plate, or a sufficient amount of cooling water is made to flow through a water channel formed in the backing plate.

Note that in the case where the target contains zinc, plasma damage is alleviated by deposition in an oxygen gas atmosphere; thus, an oxide semiconductor in which zinc is unlikely to be volatilized can be obtained.

The above-described deposition apparatus enables deposition of an oxide semiconductor whose hydrogen concentration measured by secondary ion mass spectrometry (SIMS) is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, and still further preferably lower than or equal to $5\times10^{18}$ atoms/cm$^3$.

Furthermore, an oxide semiconductor whose nitrogen concentration measured by SIMS is lower than $5\times10^{19}$ atoms/cm$^3$, preferably lower than or equal to $1\times10^{19}$ atoms/cm$^3$, further preferably lower than or equal to $5\times10^{18}$ atoms/cm$^3$, and still further preferably lower than or equal to $1\times10^{18}$ atoms/cm$^3$ can be deposited.

Moreover, an oxide semiconductor whose carbon concentration measured by SIMS is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$ can be deposited.

The oxide semiconductor having small amounts of impurities and oxygen vacancies has low carrier density (specifically, lower than $8\times10^{11}$/cm$^3$, preferably lower than $1\times10^{11}$/cm$^3$, further preferably lower than $1\times10^{10}$/cm$^3$, and is higher than or equal to $1\times10^{-9}$/cm$^3$). Such an oxide semiconductor is referred to as a highly purified intrinsic or substantially highly purified intrinsic oxide semiconductor. In particular, a CAAC-OS that has a low impurity concentration and a low density of defect states can be referred to as a substantially highly purified intrinsic oxide semiconductor having stable characteristics.

Furthermore, an oxide semiconductor can be deposited in which the released amount of each of the following gas molecules (atoms) measured by thermal desorption spectroscopy (TDS) is less than or equal to $1\times10^{19}$/cm$^3$ and preferably less than or equal to $1\times10^{18}$/cm$^3$: a gas molecule (atom) having a mass-to-charge ratio (m/z) of 2 (e.g., a hydrogen molecule), a gas molecule (atom) having a mass-to-charge ratio (m/z) of 18, a gas molecule (atom) having a mass-to-charge ratio (m/z) of 28, and a gas molecule (atom) having a mass-to-charge ratio (m/z) of 44.

With the above deposition apparatus, entry of impurities into the oxide semiconductor can be suppressed. Furthermore, when a film in contact with the oxide semiconductor is formed with the use of the above deposition apparatus, the entry of impurities into the oxide semiconductor from the film in contact therewith can be suppressed.

<Structure of Oxide Semiconductor>

An oxide semiconductor is classified into a single crystal oxide semiconductor and a non-single-crystal oxide semiconductor. Examples of a non-single-crystal oxide semiconductor include a CAAC-OS, a polycrystalline oxide semiconductor, an nc-OS, an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak indicating a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below. Growth of the crystal part in the a-like OS might be induced by electron irradiation, for example. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure as described below. For this reason, an a-like OS has physical properties similar to those of an amorphous oxide semiconductor.

Even when an amorphous oxide semiconductor having an unstable structure as one of definitions can be used for a channel formation region of a transistor, the transistor may be insufficient for practical use as a product. The same matter applies to an a-like OS. Thus, it is preferable that components of an amorphous oxide semiconductor and an a-like OS be rarely included or be not included at all in products.

A single crystalline oxide semiconductor has high crystallinity but at the same time requires high process temperature for formation; thus, it might not be practical for use in terms of productivity. A polycrystalline oxide semiconductor has high crystallinity in crystal grains but at the same time has a grain boundary; thus, it is likely to have variation or the like.

In contrast, a CAAC-OS and an nc-OS have high stability and can be deposited at a substrate temperature lower than 500° C. by the above-described deposition method. In addition, they have no clear grain boundaries; thus, they are uniform and less likely to have variation or the like. For example, they can be deposited uniformly even over a large-sized substrate of the 8th generation or more, and accordingly can be regarded to have structures with high reliability and high practical utility.

<Analysis with Electron Microscope>

A CAAC-OS and an nc-OS are analyzed with a transmission electron microscope (TEM).

First, samples for the analysis will be described.

Sample X1 includes a 100-nm-thick In—Ga—Zn oxide that is deposited by PESP over a quartz glass substrate under the following conditions: an In—Ga—Zn oxide target (circular target whose diameter is 101.6 mm and atomic ratio of In to Ga and Zn is 1:4:5) is used; a deposition power (DC) is 200 W; a deposition pressure is 0.4 Pa; a target-substrate distance (distance between the target and a substrate holder) is 130 mm; an argon gas at a flow rate of 30 sccm and an oxygen gas at a flow rate of 10 sccm are used as a deposition gas; and the substrate is not heated.

Sample X2 includes a 100-nm-thick In—Ga—Zn oxide that is deposited by PESP over a quartz glass substrate under the following conditions: an In—Ga—Zn oxide target (circular target whose diameter is 101.6 mm and atomic ratio of In to Ga and Zn is 1:4:5) is used; a deposition power (DC) is 200 W; a deposition pressure is 0.4 Pa; a target-substrate distance (distance between the target and a substrate holder) is 130 mm; an argon gas at a flow rate of 30 sccm and an oxygen gas at a flow rate of 10 sccm are used as a deposition gas; and the substrate is heated (substrate temperature is 200° C.).

Sample X3 includes a 100-nm-thick In—Ga—Zn oxide that is deposited by VDSP over a quartz glass substrate under the following conditions: two In—Ga—Zn oxide targets (125 mm×190 mm rectangular targets whose atomic ratio of In to Ga and Zn is 1:4:5) are used; a deposition power (DC) is 1200 W; a deposition pressure is 0.3 Pa; a target-substrate distance (distance from a line connecting the centers of the pair of two targets to a substrate holder) is 250 mm; an argon gas at a flow rate of 30 sccm and an oxygen gas at a flow rate of 10 sccm are used as a deposition gas; and the substrate is not heated.

Sample X4 includes a 100-nm-thick In—Ga—Zn oxide that is deposited by VDSP over a quartz glass substrate under the following conditions: two In—Ga—Zn oxide targets (125 mm×190 mm rectangular targets whose atomic ratio of In to Ga and Zn is 1:4:5) are used; a deposition power (DC) is 1200 W; a deposition pressure is 0.05 Pa; a target-substrate distance (distance from a line connecting the centers of the two targets to a substrate holder) is 250 mm; an argon gas at a flow rate of 30 sccm and an oxygen gas at a flow rate of 10 sccm are used as a deposition gas; and the substrate is not heated.

<Cross-Sectional TEM>

Characteristics of a CAAC-OS and an nc-OS observed in cross-sectional TEM images will be described below.

First, cross-sectional views obtained with a TEM (also referred to as a cross-sectional TEM images) are analyzed. To obtain the cross-sectional TEM images, an atomic resolution analytical electron microscope JEM-ARM200F manufactured by JEOL Ltd. with a spherical aberration corrector function is used. Note that each region between two white arrows in the cross-sectional TEM images corresponds to one pellet.

Figure 16A:
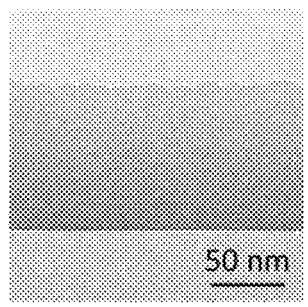
FIGS. 16A and 16B are cross-sectional TEM images of an nc-OS.
Figure 16B:

FIG. 16A is a cross-sectional TEM image of Sample X1 which is observed in a direction substantially parallel to the sample surface. In observation of the cross-sectional TEM image, a spherical aberration corrector function is used. A cross-sectional TEM image in FIG. 16B is an enlarged view of FIG. 16A. Pellets can be observed in FIG. 16B. The pellets are randomly oriented, indicating that Sample X1 is an nc-OS.

Figure 17A:
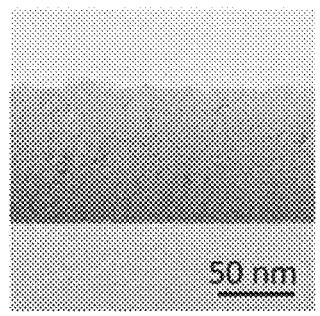
FIGS. 17A and 17B are cross-sectional TEM images of a CAAC-OS.
Figure 17B:
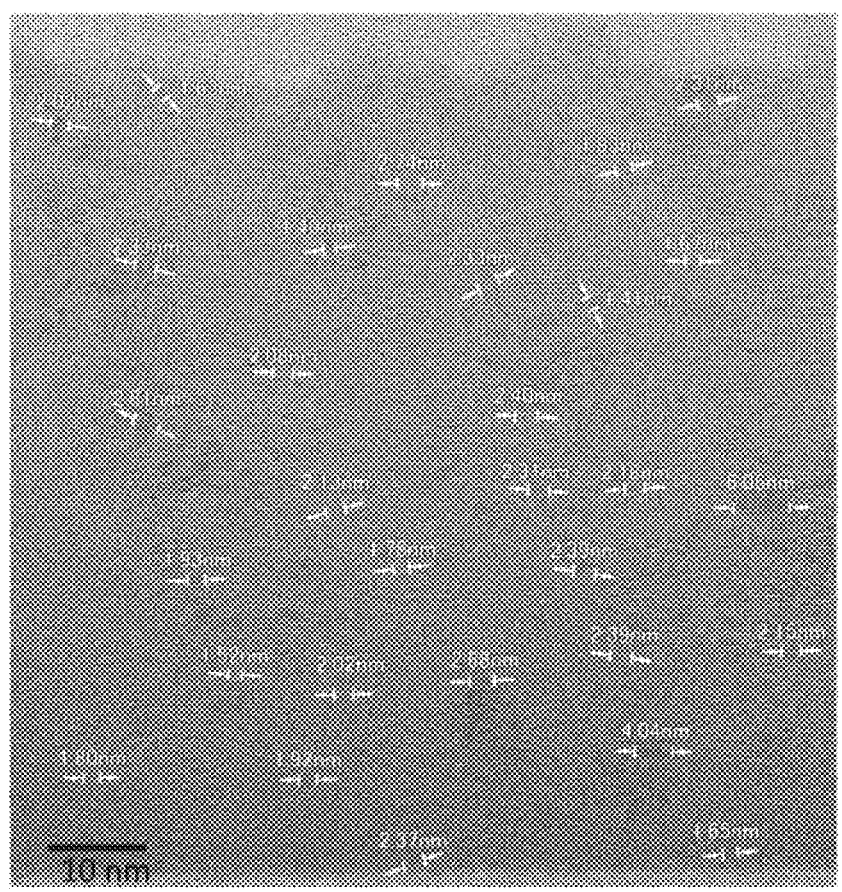

FIG. 17A is a cross-sectional TEM image of Sample X2 which is observed in a direction substantially parallel to the sample surface. In observation of the cross-sectional TEM image, a spherical aberration corrector function is used. A cross-sectional TEM image in FIG. 17B is an enlarged view of FIG. 17A. Pellets can be observed in FIG. 17B. The pellets reflect unevenness of a surface over which the oxide is formed (formation surface) or the top surface of the oxide, and are parallel to the formation surface or the top surface. Crystal distortion can be observed in the cross-sectional TEM image of Sample X2. Because the pellets have c-axis alignment, Sample X2 is a CAAC-OS.

Figure 18A:
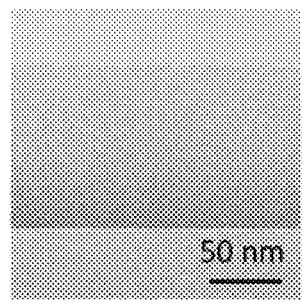
FIGS. 18A and 18B are cross-sectional TEM images of an nc-OS.
Figure 18B:
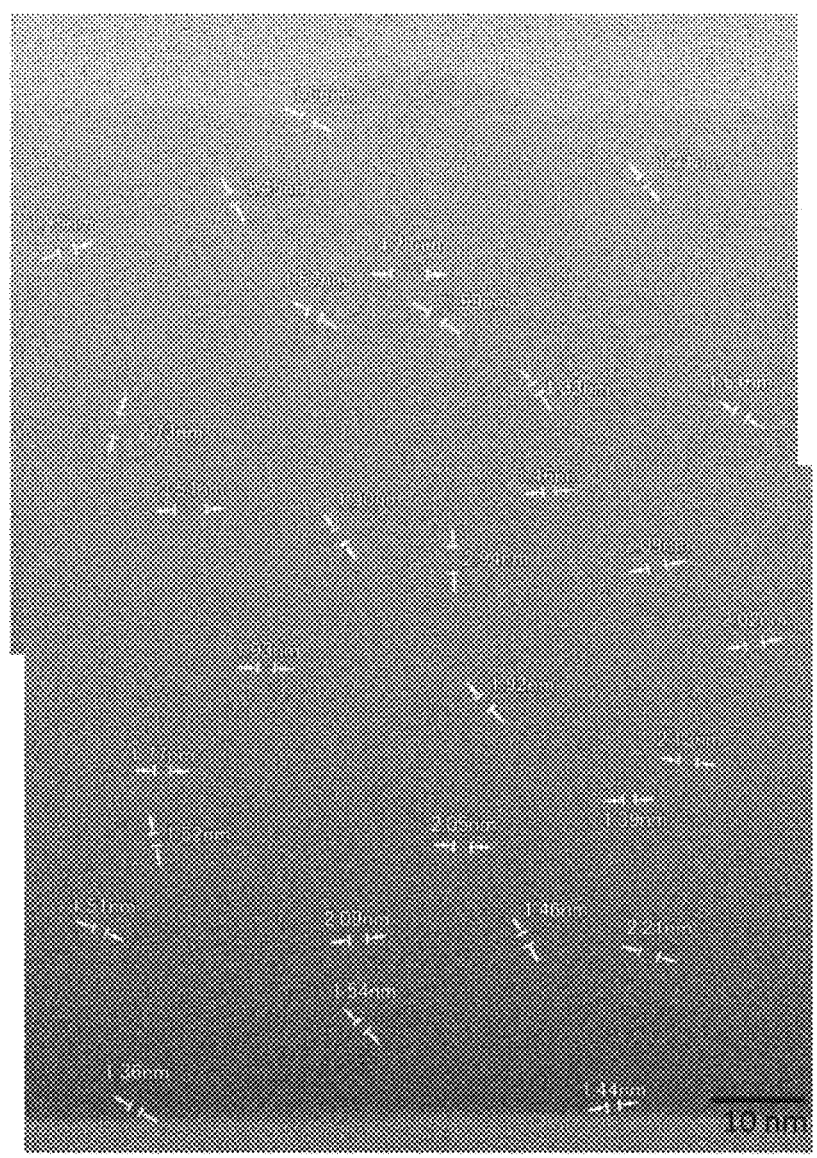

FIG. 18A is a cross-sectional TEM image of Sample X3 which is observed in a direction substantially parallel to the sample surface. In observation of the cross-sectional TEM image, a spherical aberration corrector function is used. A cross-sectional TEM image in FIG. 18B is an enlarged view of FIG. 18A. Pellets can be observed in FIG. 18B. The pellets are randomly oriented, indicating that Sample X3 is an nc-OS.

Figure 19A:
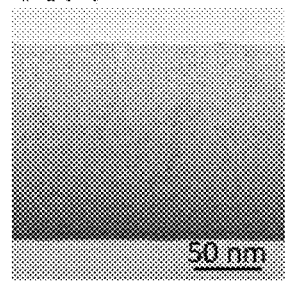
FIGS. 19A and 19B are cross-sectional TEM images of a CAAC-OS.
Figure 19B:
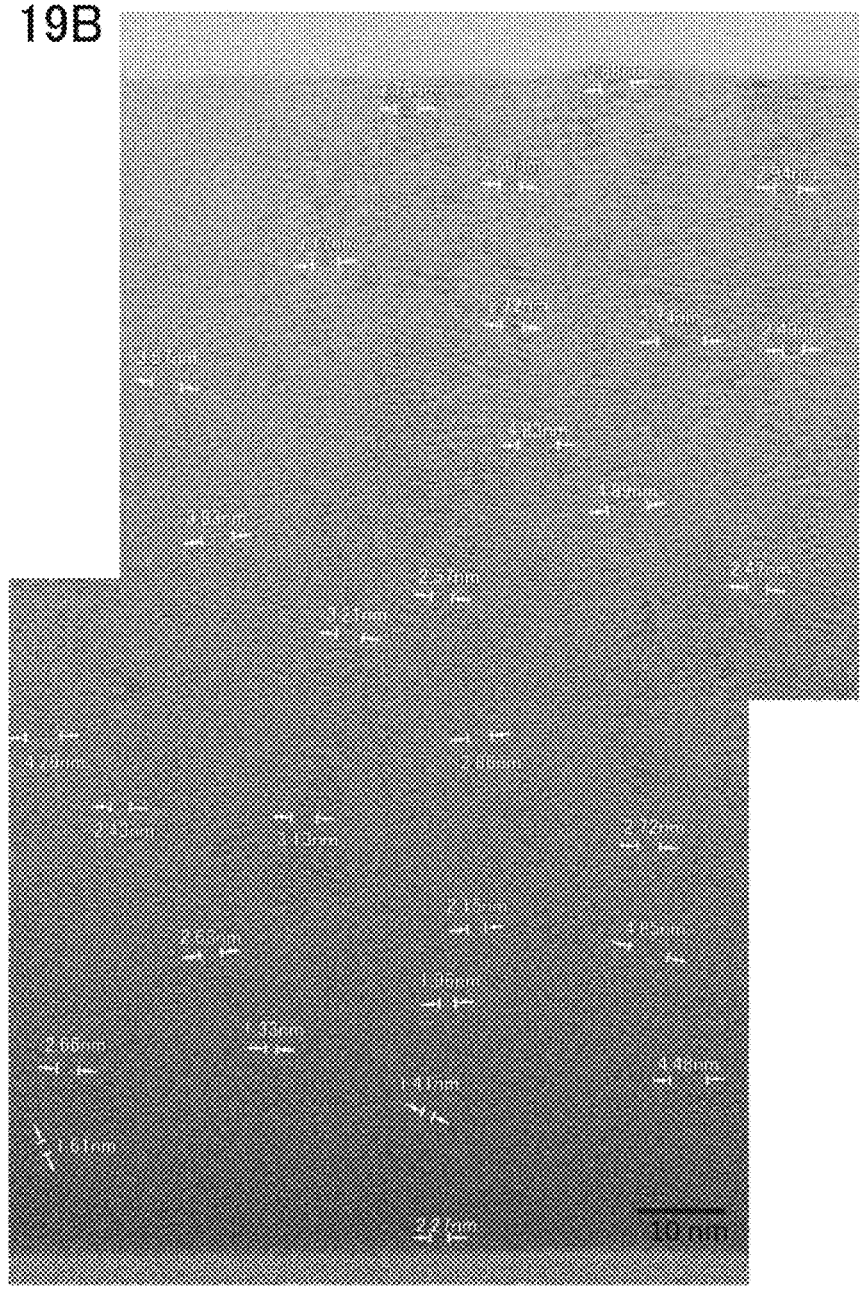
Figure 20A:
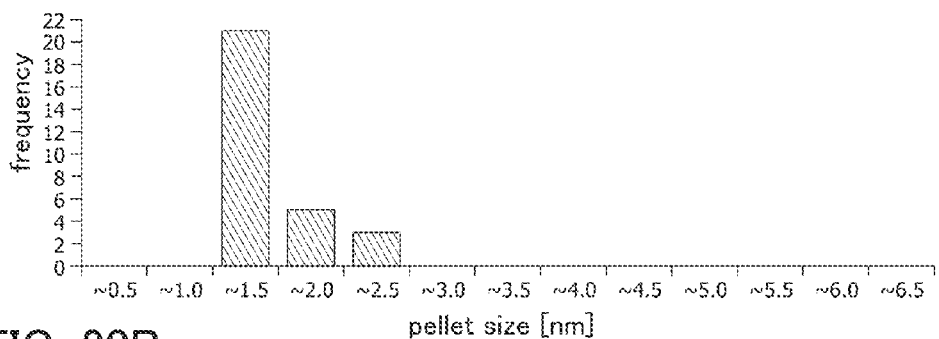
FIGS. 20A to 20D each show pellet size distribution.
Figure 20B:
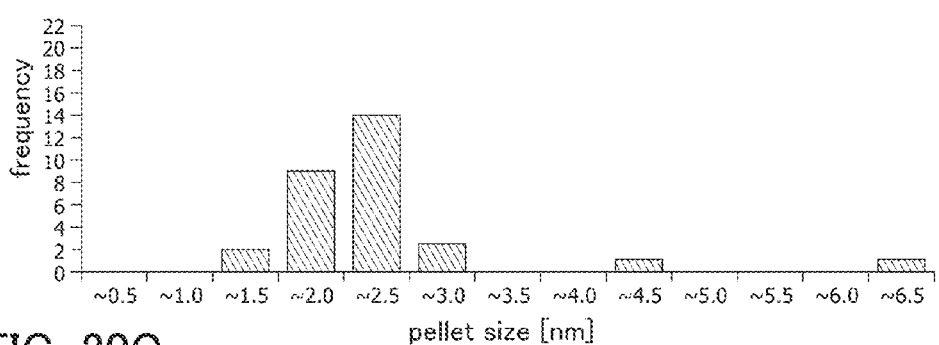
Figure 20C:
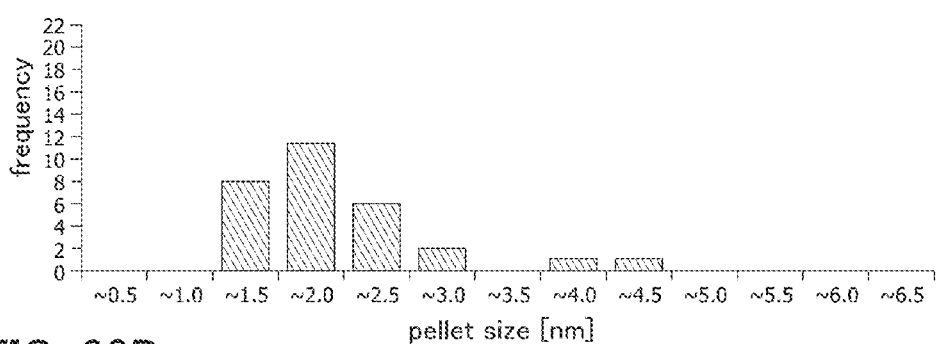
Figure 20D:
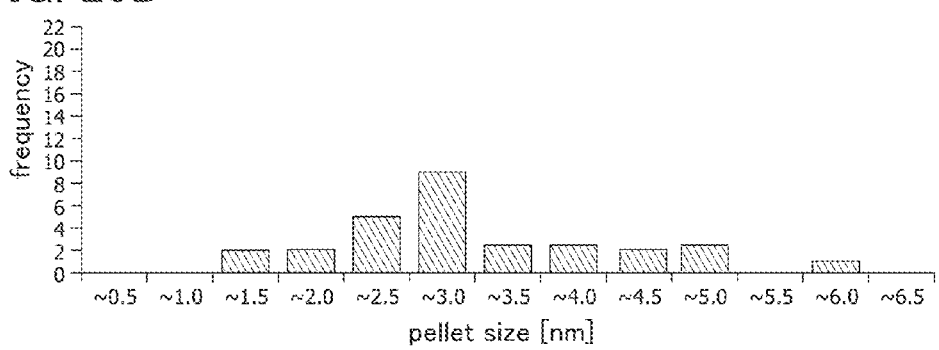

FIG. 19A is a cross-sectional TEM image of Sample X4 which is observed in a direction substantially parallel to the sample surface. In observation of the cross-sectional TEM image, a spherical aberration corrector function is used. A cross-sectional TEM image in FIG. 19B is an enlarged view of FIG. 19A. Pellets can be observed in FIG. 19B. The pellets reflect unevenness of a surface over which the oxide is formed (formation surface) or the top surface of the oxide, and are parallel to the formation surface or the top surface. Crystal distortion can be observed in the cross-sectional TEM image of Sample X4. Because the pellets have c-axis alignment, Sample X4 is a CAAC-OS.

Table 3 lists the average, standard deviation σ, maximum, and minimum of pellet size (length of a pellet in a plane direction) and distribution of angles of the pellets in each of Sample X1, Sample X2, Sample X3, and Sample X4. Note that an angle between a plane of the pellet and the quartz glass substrate surface is regarded as the angle of the pellet. FIG. 20A, FIG. 20B, FIG. 20C, and FIG. 20D show distribution of the pellet sizes in Sample X1, Sample X2, Sample X3, and Sample X4, respectively.

TABLE 3

| | Pellet Size [nm] | | | | Angle of Pellet | | |
|---|---|---|---|---|---|---|---|
| Sample | Average | Standard Deviation | Maximum | Minimum | 0°-30° | 30°-60° | 60°-90° |
| X1 | 1.49 | 0.35 | 2.54 | 1.02 | 40% | 40% | 20% |
| X2 | 2.28 | 0.87 | 6.06 | 1.04 | 90% | 7% | 3% |
| X3 | 1.93 | 0.65 | 4.20 | 1.21 | 53% | 30% | 17% |
| X4 | 3.08 | 1.07 | 5.74 | 1.33 | 97% | 0% | 3% |

Table 3 and the like indicate that the In—Ga—Zn oxide deposited by PESP can be a CAAC-OS or an nc-OS, depending on whether or not the substrate is heated. Meanwhile, the In—Ga—Zn oxide deposited by VDSP becomes a CAAC-OS even without the substrate heating as long as the deposition is performed at low pressure in high vacuum. The comparison of the nc-OSs and the comparison of the CAAC-OSs reveal that the average and standard deviation of pellet size are larger in the In—Ga—Zn oxide deposited by VDSP than in the In—Ga—Zn oxide deposited by PESP. The average pellet size in Sample X4 (3 nm or more) and the standard deviation of pellet size are particularly large.

As shown in FIG. 17B and FIG. 19B, the CAAC-OS has a characteristic atomic arrangement. In addition, FIGS. 20A to 20D show that most pellets have a size of approximately 1 nm to 10 nm. In view of these characteristics, the pellet can also be referred to as a nanocrystal (nc). Furthermore, the CAAC-OS can also be referred to as an oxide semiconductor including c-axis aligned nanocrystals (CANC).

FIG. 16B and FIG. 18B indicate that the nc-OS do not have a layered atomic arrangement. Thus, the nc-OS can also be referred to as an oxide semiconductor including nanocrystals not aligned in a particular direction (random aligned nanocrystals: RANC, or non-aligned nanocrystals: NANC).

<Plan-View TEM>

Besides the cross-sectional TEM observation, a plurality of methods can be used to specify a structure more exactly. In the following descriptions, plan-view images obtained with a TEM (also referred to as a plan-view TEM images) are analyzed. To obtain the plan-view TEM images, an atomic resolution analytical electron microscope JEM-ARM200F manufactured by JEOL Ltd. with a spherical aberration corrector function is used.

Figure 21A:
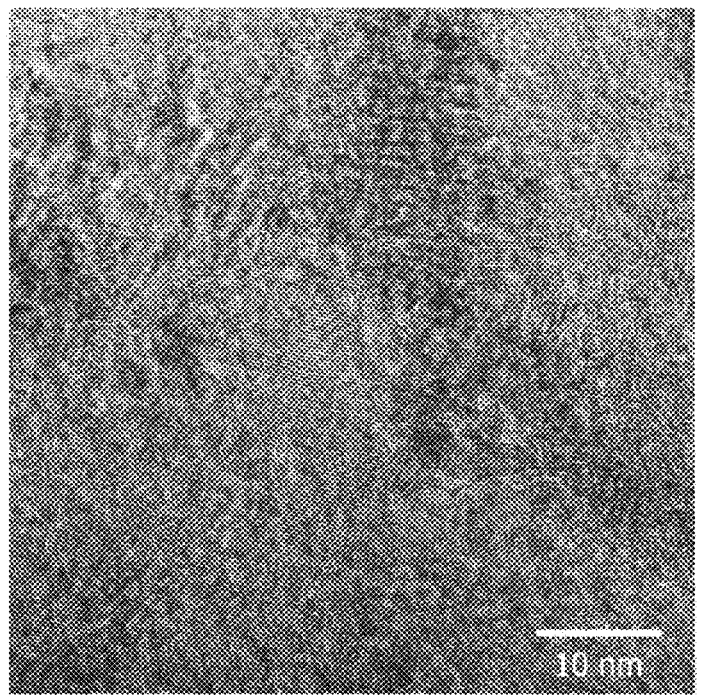
FIGS. 21A and 21B are a plan-view TEM image of a CAAC-OS and an image obtained through an analysis thereof.
Figure 21B:
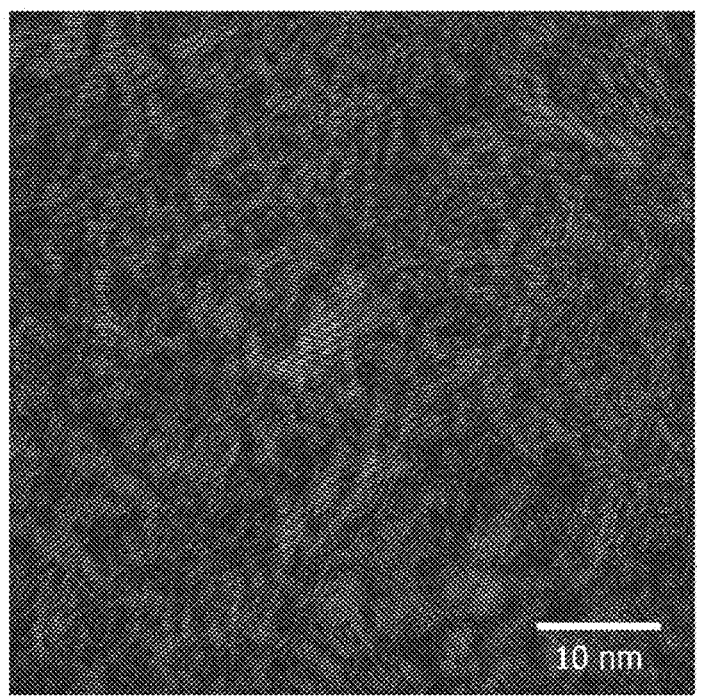

FIG. 21A is a plan-view TEM image of Sample X4. FIG. 21B is an image obtained through image processing of FIG. 21A. To perform image processing, first, FIG. 21A is subjected to fast Fourier transform (FFT) to obtain an FFT image. Then, the obtained FFT image is subjected to mask processing except for a range from 2.8 nm$^{-1}$ to 5.0 nm$^{-1}$. After that, the FFT image subjected to mask processing is subjected to inverse fast Fourier transform (IFFT) to obtain an FFT filtering image. FIG. 21B is an FFT filtering image of FIG. 21A. FIGS. 21A and 21B indicate that Sample X4 has hexagonal and triangular atomic arrangements and no clear boundary between regions with different crystal orientations. Accordingly, it is also understood from the plan-view TEM image that Sample X4 exhibits characteristics of a CAAC-OS.

Figure 22A:
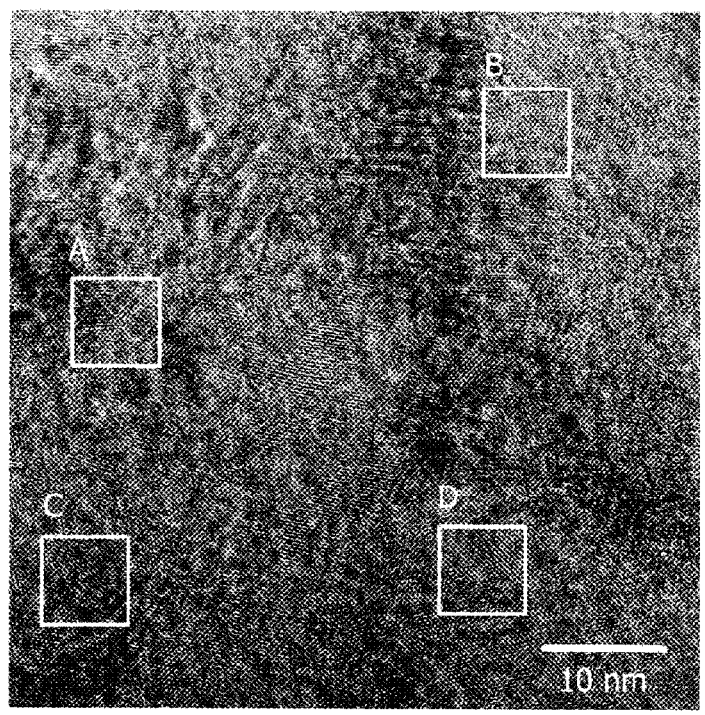
FIGS. 22A and 22B are a plan-view TEM image of a CAAC-OS and an image obtained through an analysis thereof.
Figure 22B:
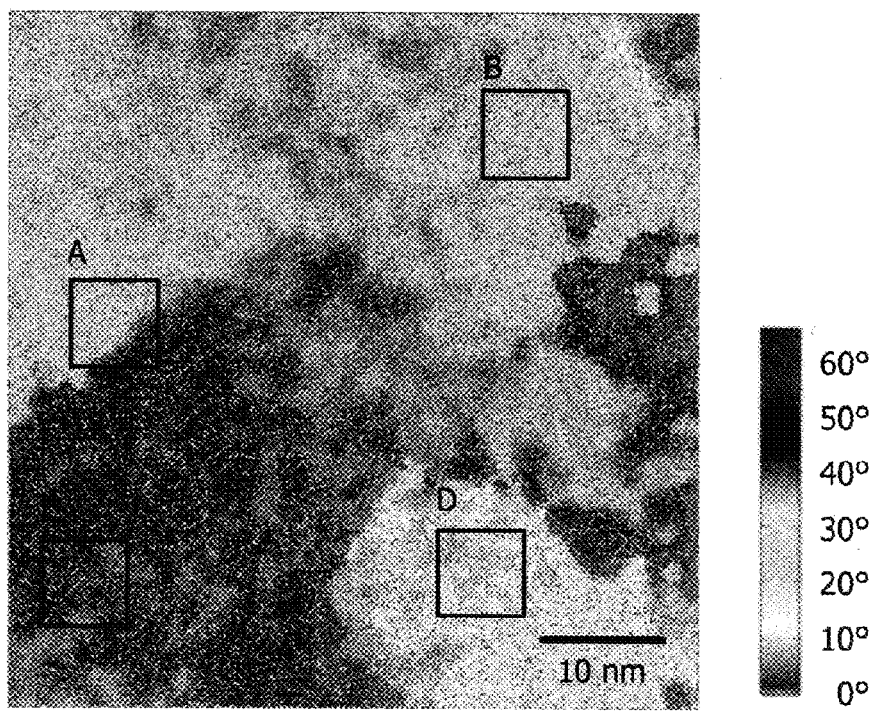

FIG. 22A is the plan-view TEM image in FIG. 21A showing Region A, Region B, Region C, and Region D. FIG. 22B is an image obtained through an analysis of FIG. 21B, and Region A, Region B, Region C, and Region D are shown at the same positions as in FIG. 22A.

To conduct the analysis, first, lattice points are extracted from the FFT filtering image in the following manner. First, noise in the FFT filtering image is removed. To remove the noise, the luminance of a region within a 0.05-nm radius is smoothed using Formula 1.

[Formula 1]

$$S\_Int(x, y) = \sum_{r \leq 0.05} \frac{Int(x', y')}{r} \quad (1)$$

Note that S_Int(x, y) represents the smoothed luminance at the coordinates (x, y), r represents the distance between the coordinates (x, y) and the coordinates (x', y'), and Int(x', y') represents the luminance at the coordinates (x', y'). In the calculation, r is regarded as 1 when it is 0.

Then, a search for lattice points is conducted. The coordinates with the highest luminance within a 0.22-nm radius are regarded as a lattice point. At this point, a candidate lattice point is extracted. Within a 0.22-nm radius, detection errors of lattice points due to noise can be less frequent. Note that adjacent lattice points are a certain distance away from each other in the TEM image; thus, two or more lattice points are unlikely to be observed within a 0.22-nm radius.

Subsequently, coordinates with the highest luminance within a 0.22-nm radius from the extracted candidate lattice point are extracted to redetermine a candidate lattice point. The extraction of a candidate lattice point is repeated in this manner until no new candidate lattice point appears; the coordinates at that point are determined as a lattice point. Similarly, determination of another lattice point is performed at a position more than 0.22 nm away from the determined lattice point. In this manner, lattice points are determined in the entire region. The determined lattice points are collectively called a lattice point group.

Figure 23A:
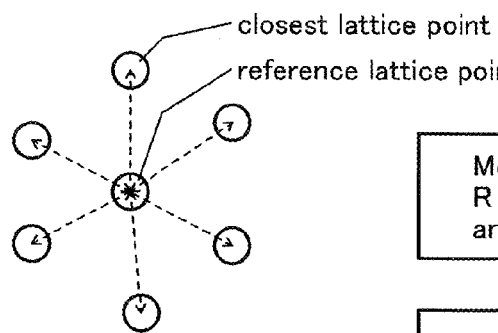
FIGS. 23A to 23D illustrate a method for deriving a rotation angle of a hexagon.
Figure 23B:
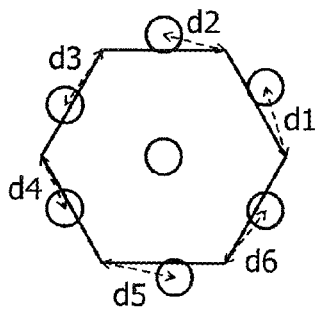
Figure 23C:
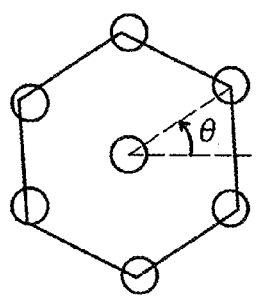
Figure 23D:
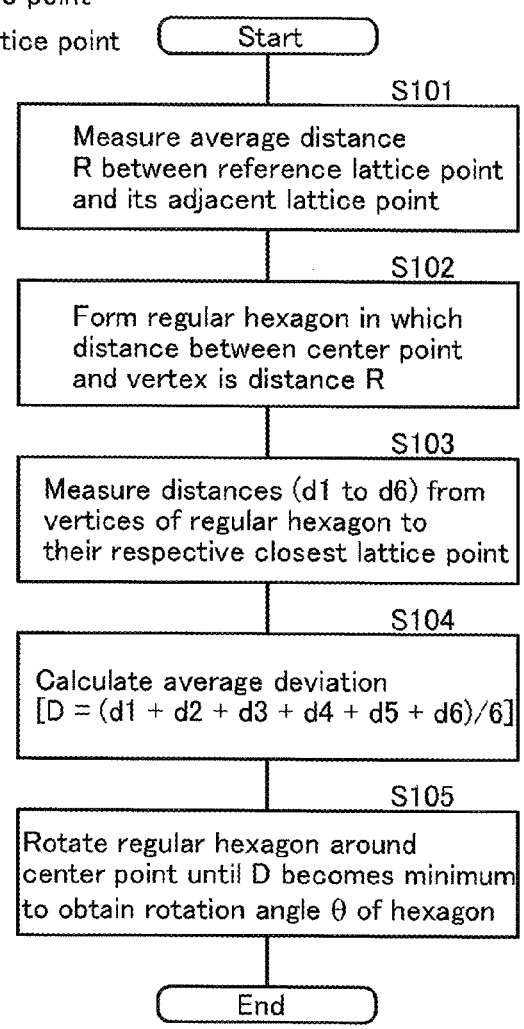

Here, a method for deriving an angle of a hexagonal lattice from the extracted lattice point group is described with reference to schematic diagrams in FIGS. 23A to 23C and a flow chart in FIG. 23D. First, a reference lattice point is determined and the six closest lattice points to the reference lattice point are connected to form a hexagonal lattice (FIG. 23A and Step S101 in FIG. 23D). After that, an average distance R between the reference lattice point, which is the center point of the hexagonal lattice, and each of the lattice points, which is a vertex, is calculated. Then, a regular hexagon is formed with the use of the reference lattice point as the center point and the calculated distance R as the distance from the center point to each vertex (Step S102 in FIG. 23D). The distances from the vertices of the regular hexagon to their respective closest lattice points are regarded as a distance d1, a distance d2, a distance d3, a distance d4, a distance d5, and a distance d6 (Step S103 in FIG. 23D). Next, the regular hexagon is rotated around the center point through 60° by 0.1°, and the average deviation between the hexagonal lattice and the rotated regular hexagon [D=(d1+d2+d3+d4+d5+d6)/6] is calculated (Step S104 in FIG. 23D). Then, a rotation angle θ of the regular hexagon when the average deviation D becomes minimum is calculated as the angle of the hexagonal lattice (Step S105 in FIG. 23D).

Next, an observation area of the plan-view TEM image is adjusted so that hexagonal lattices whose angles are 30° account for the highest percentage. In such a condition, the average angle of hexagonal lattice within a 1-nm radius is calculated. The thus obtained analysis result of the plan-view TEM image can be shown in colors or gradation depending on the angle of the hexagonal lattice. FIG. 22B is an image which is obtained through the analysis of FIG. 22A in the above manner and shows the gradation depending on the angle of the hexagonal lattice.

Figure 24A:
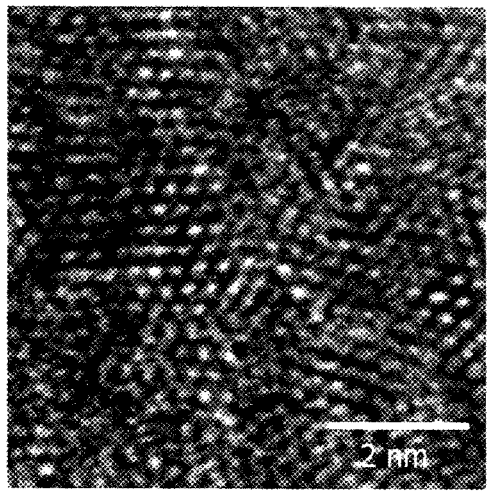
FIGS. 24A to 24E are plan-view TEM images of a CAAC-OS and images obtained through analyses thereof.
Figure 24B:
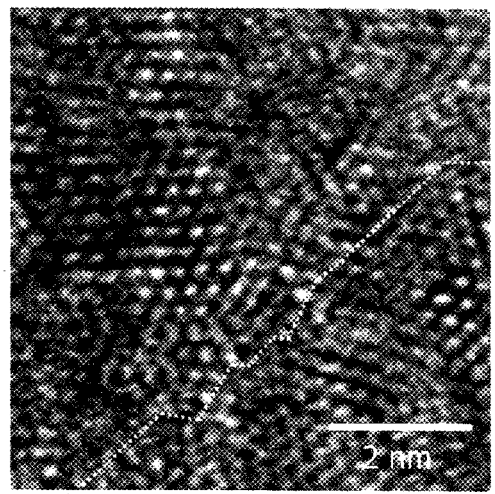
Figure 24C:
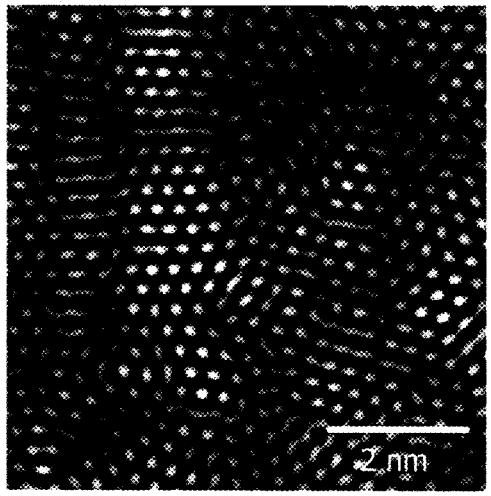
Figure 24D:
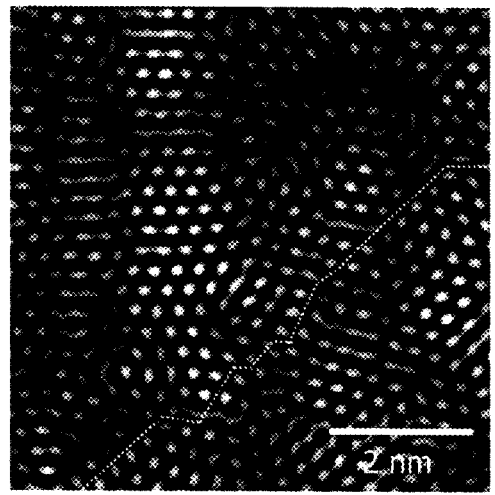
Figure 24E:
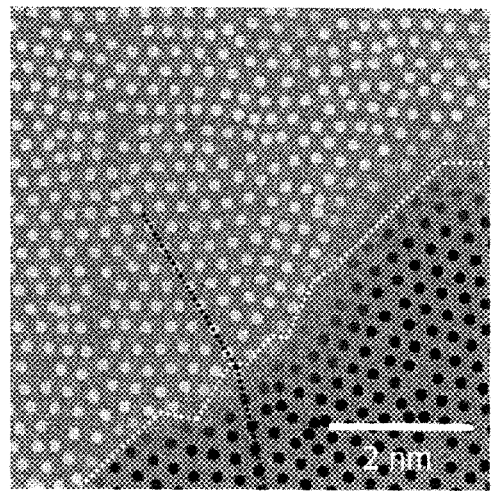

FIG. 22B indicates that Sample X4 has a plurality of regions where angles of hexagonal lattices are uniform. FIG. 24A is an enlarged plan-view TEM image of Region A. FIG. 24B is a plan-view TEM image of Region A in which a boundary portion where the angles of hexagonal lattices change is indicated by a white dotted line. FIG. 24C is an FFT filtering image of Region A. FIG. 24D is the FFT filtering image of Region A in which the boundary portion where the angles of hexagonal lattices change is indicated by a white dotted line. FIG. 24E is an image of Region A showing the gradation depending on the angle of the hexagonal lattice. In FIG. 24E, a white dotted line indicates a boundary portion where the angles of hexagonal lattices change, and a black dotted line indicates a change in arrangement direction of hexagonal lattices. FIG. 24E shows that lattice points are continuously arranged at the boundary portion where the angles of hexagonal lattices change.

Figure 25A:
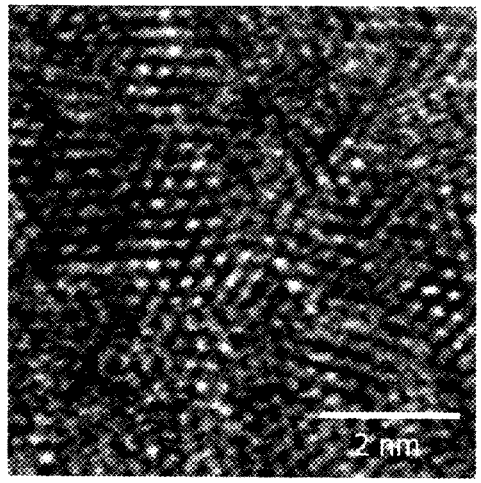
FIGS. 25A to 25E are plan-view TEM images of a CAAC-OS and images obtained through analyses thereof.
Figure 25B:
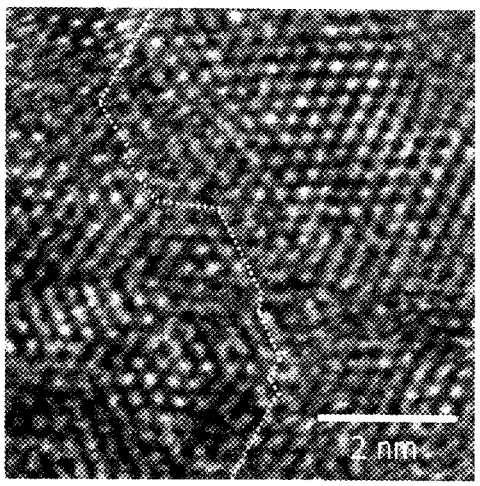
Figure 25C:
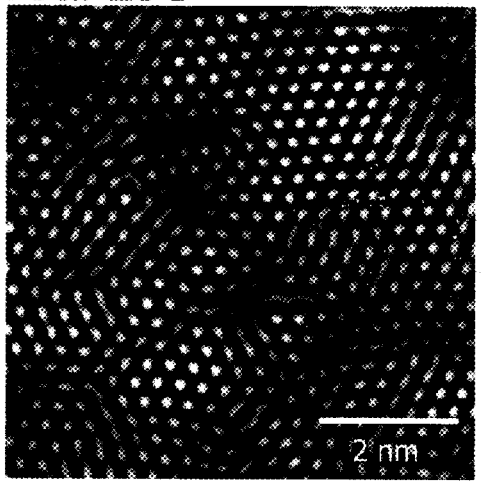
Figure 25D:
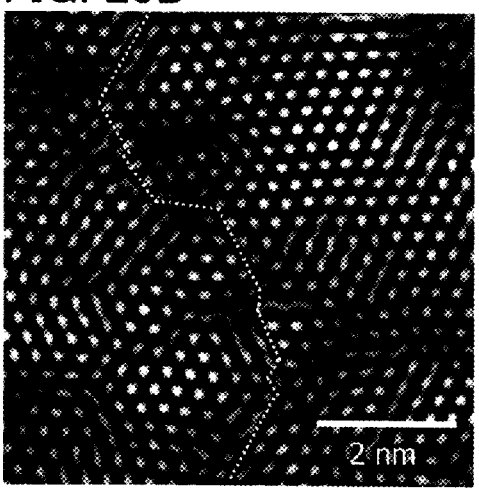
Figure 25E:
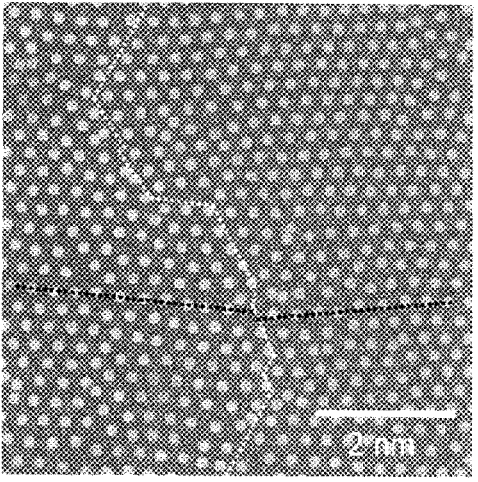

FIG. 25A is an enlarged plan-view TEM image of Region B. FIG. 25B is a plan-view TEM image of Region B in which a boundary portion where the angles of hexagonal lattices change is indicated by a white dotted line. FIG. 25C is an FFT filtering image of Region B. FIG. 25D is the FFT filtering image of Region B in which the boundary portion where the angles of hexagonal lattices change is indicated by a white dotted line. FIG. 25E is an image of Region B showing the gradation depending on the angle of the hexagonal lattice. In FIG. 25E, a white dotted line indicates the boundary portion where the angles of hexagonal lattices change, and a black dotted line indicates a change in arrangement direction of hexagonal lattices. FIG. 25E shows that lattice points are continuously arranged at a boundary portion where the angles of hexagonal lattices change.

Figure 26A:
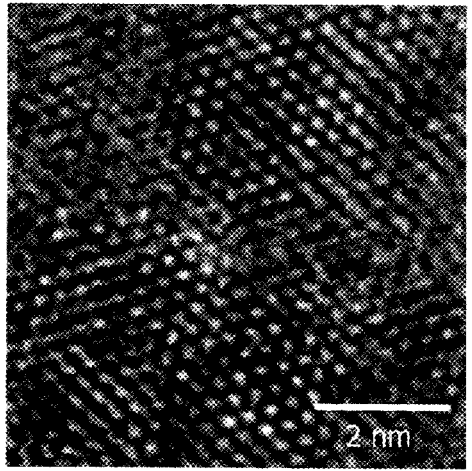
FIGS. 26A to 26E are plan-view TEM images of a CAAC-OS and images obtained through analyses thereof.
Figure 26B:
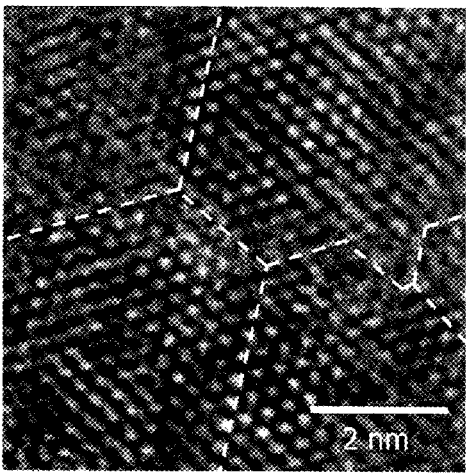
Figure 26C:
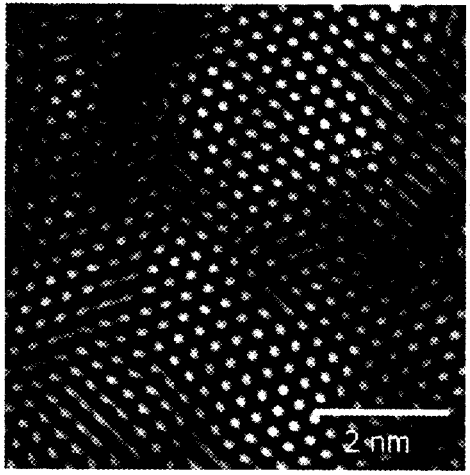
Figure 26D:
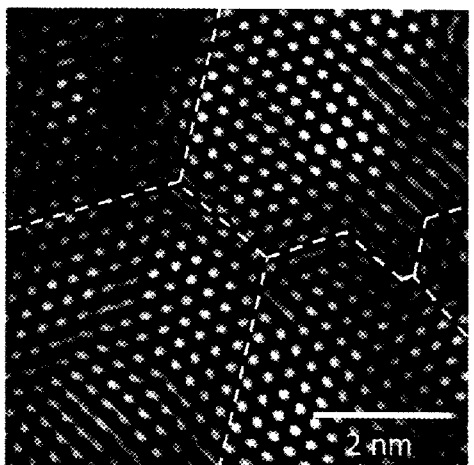
Figure 26E:
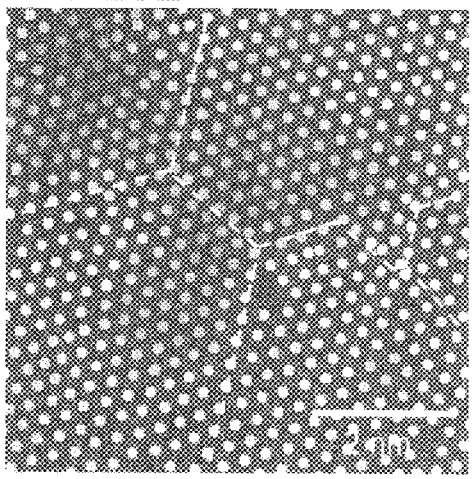

FIG. 26A is an enlarged plan-view TEM image of Region C. FIG. 26B is a plan-view TEM image of Region C in which a boundary portion where the angles of hexagonal lattices change is indicated by a white dotted line. FIG. 26C is an FFT filtering image of Region C. FIG. 26D is the FFT filtering image of Region C in which the boundary portion where the angles of hexagonal lattices change is indicated by a white dotted line. FIG. 26E is an image of Region C showing the gradation depending on the angle of the hexagonal lattice. In FIG. 26E, a white dotted line indicates the boundary portion where the angles of hexagonal lattices change. FIG. 26E shows that lattice points are continuously arranged at a boundary portion where the angles of hexagonal lattices change.

Figure 27A:
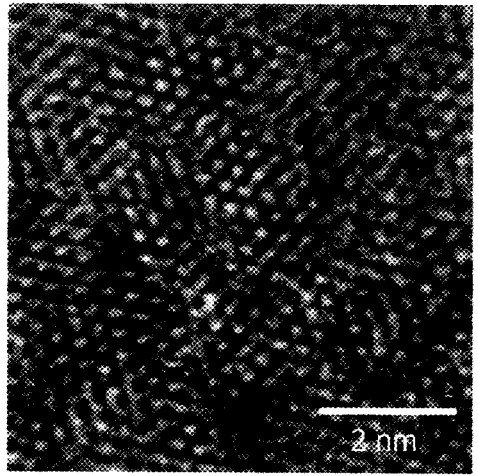
FIGS. 27A to 27E are plan-view TEM images of a CAAC-OS and images obtained through analyses thereof.
Figure 27B:
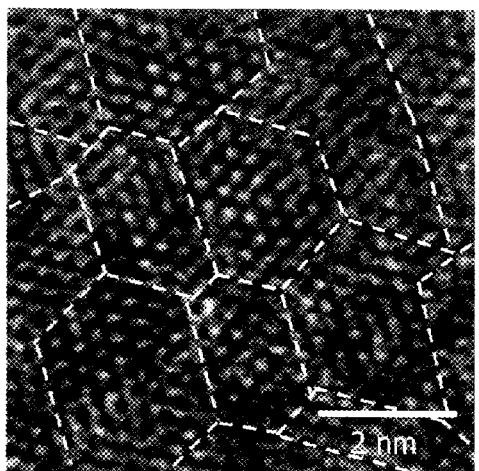
Figure 27C:
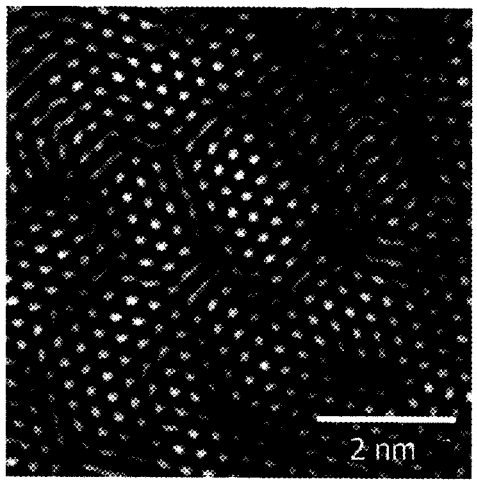
Figure 27D:
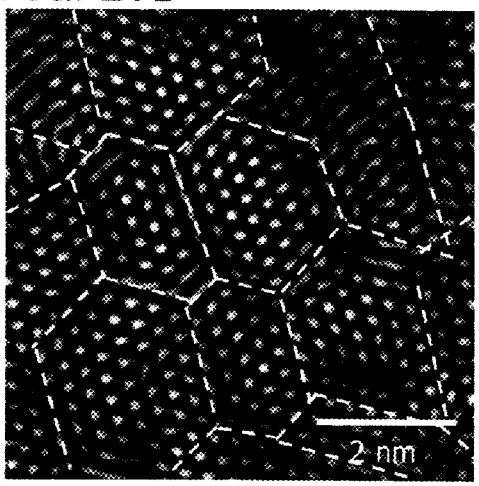
Figure 27E:
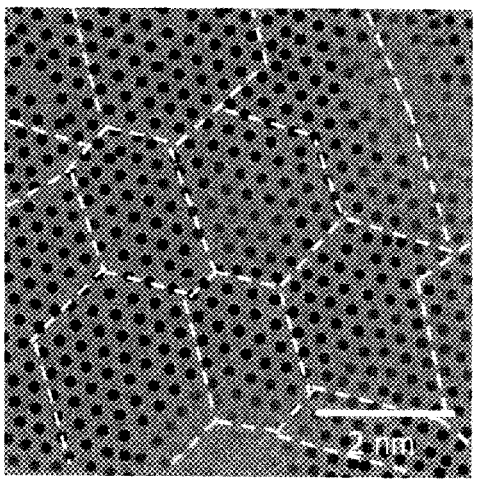

FIG. 27A is an enlarged plan-view TEM image of Region D. FIG. 27B is a plan-view TEM image of Region D in which a boundary portion where the angles of hexagonal lattices change is indicated by a white dotted line. FIG. 27C is an FFT filtering image of Region D. FIG. 27D is the FFT filtering image of Region D in which the boundary portion where the angles of hexagonal lattices change is indicated by a white dotted line. FIG. 27E is an image of Region D showing the gradation depending on the angle of the hexagonal lattice. In FIG. 27E, a white dotted line indicates a boundary portion where the angles of hexagonal lattices change. FIG. 27E shows that lattice points are continuously arranged at the boundary portion where the angles of hexagonal lattices change.

Here, Sample X5 is prepared. Sample X5 includes, over a single crystal silicon substrate over which a 25-nm-thick thermal oxide film is formed, a 100-nm-thick In—Ga—Zn oxide that is deposited by PESP under the following conditions: an In—Ga—Zn oxide target (circular target whose diameter is 101.6 mm and atomic ratio of In to Ga and Zn is 1:1:1) is used; a deposition power (DC) is 200 W; a deposition pressure is 0.4 Pa; a target-substrate distance (distance between the target and a substrate holder) is 130 mm; an argon gas at a flow rate of 20 sccm and an oxygen gas at a flow rate of 10 sccm are used as a deposition gas; and the substrate is not heated. After the deposition of the In—Ga—Zn oxide, Sample X5 is heated at 450° C. in a nitrogen atmosphere for one hour.

Figure 28:
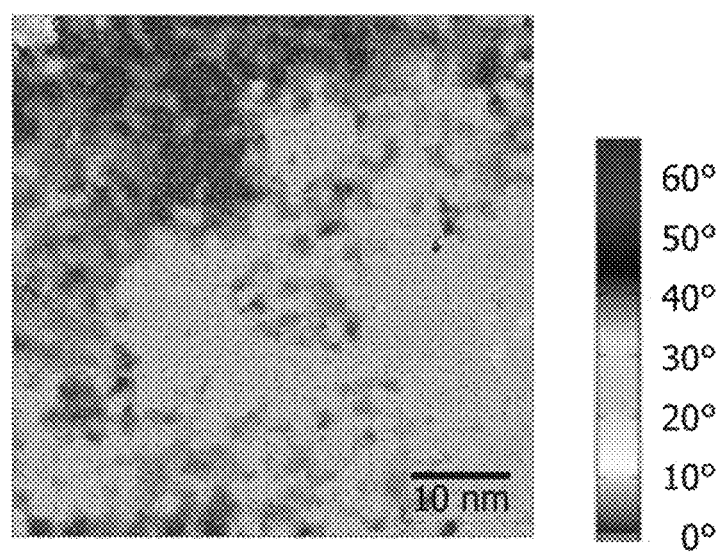
FIG. 28 is an image obtained through an analysis of a plan-view TEM image of a CAAC-OS.

FIG. 28 is an image showing the gradation depending on an angle of a hexagonal lattice in Sample X5. FIG. 28 indicates that Sample X5 has a plurality of regions where angles of hexagonal lattices are uniform.

Figure 29A:
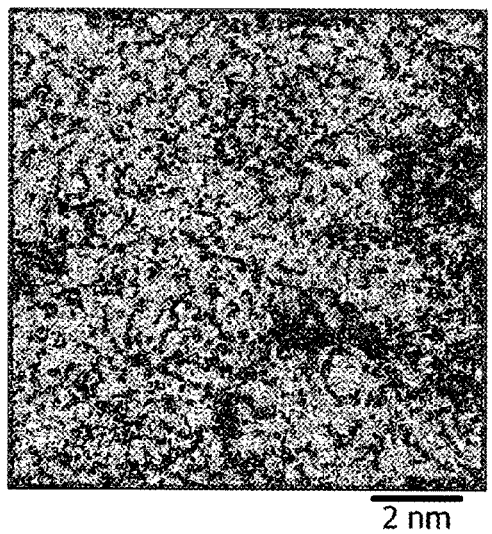
FIGS. 29A to 29D are images obtained through analyses of plan-view TEM images of CAAC-OSs and graphs showing strain rates.
Figure 29B:
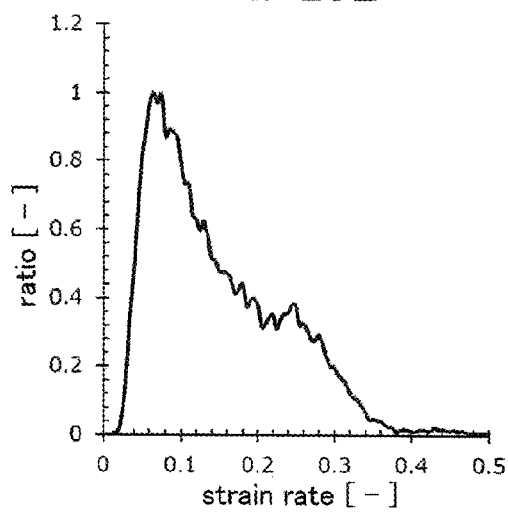
Figure 29C:
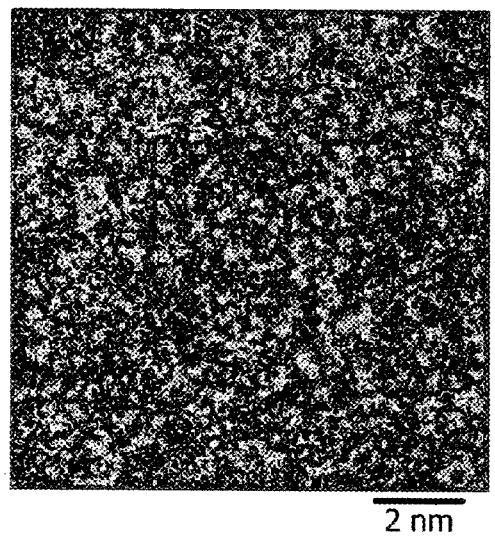
Figure 29D:
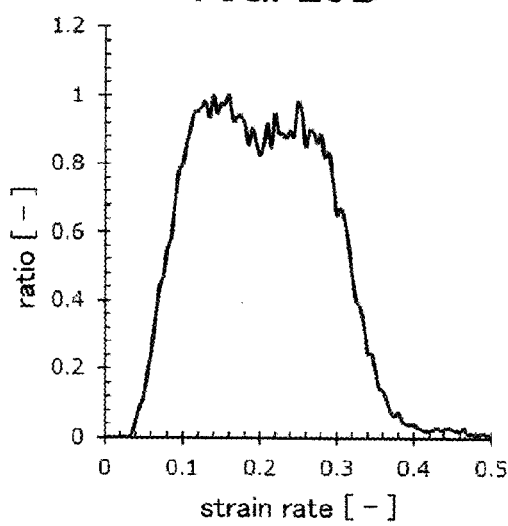

Through the analysis of a plan-view TEM image of a CAAC-OS, a boundary portion where angles of hexagonal lattices change can be examined. In the method described with reference to FIGS. 23A to 23D, a strain rate of the hexagonal lattice can be calculated by dividing the average deviation D between the resulting regular hexagon and the hexagonal lattice by the distance R from the center point of the regular hexagon to each vertex. FIGS. 29A to 29D show strain rates of the hexagonal lattices in Sample X4 and Sample X5. In FIG. 29A, light gray indicates a region where the strain rate of the hexagonal lattice in the observation area of the plan-view TEM image of Sample X4 is less than or equal to 0.15. In FIG. 29C, light gray indicates a region where the strain rate of the hexagonal lattice in an observation area of a plan-view TEM image of Sample X5 is less than or equal to 0.15. FIG. 29B is a graph showing strain rate distribution of the hexagonal lattices in Sample X4. FIG. 29D is a graph showing strain rate distribution of the hexagonal lattices in Sample X5.

In Sample X4, the proportion of regions where the strain rate is 0.4 or less is approximately 99%, that of regions where the strain rate is 0.3 or less is approximately 95%, that of regions where the strain rate is 0.2 or less is approximately 74%, and that of regions where the strain rate is 0.15 or less is approximately 60%. In Sample X5, the proportion of regions where the strain rate is 0.4 or less is approximately 99%, that of regions where the strain rate is 0.3 or less is approximately 88%, that of regions where the strain rate is 0.2 or less is approximately 51%, and that of regions where the strain rate is 0.15 or less is approximately 32%. As described above, Sample X4 and Sample X5, particularly Sample X4, have a high proportion of regions where the strain rate of the hexagonal lattice is small. A CAAC-OS which has a high proportion of regions where a strain rate of a hexagonal lattice is small probably has similar properties as a single crystal oxide semiconductor.

Next, Voronoi diagrams are formed using lattice point groups in Sample X4 and Sample X5. A Voronoi diagram is an image partitioned by regions including a lattice point group. Each lattice point is closer to regions surrounding the lattice point than to any other lattice point. Hereinafter, a method for forming a Voronoi diagram is described in detail using schematic diagrams in FIGS. 30A to 30D and a flow chart in FIG. 30E.

Figure 30A:
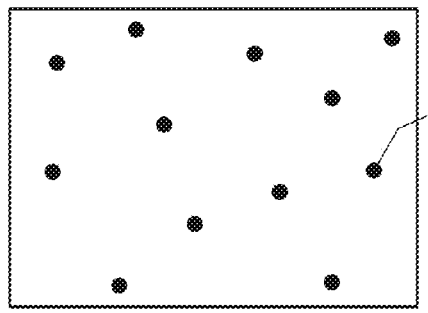
FIGS. 30A to 30E illustrate a method for forming a Voronoi diagram.
Figure 30B:
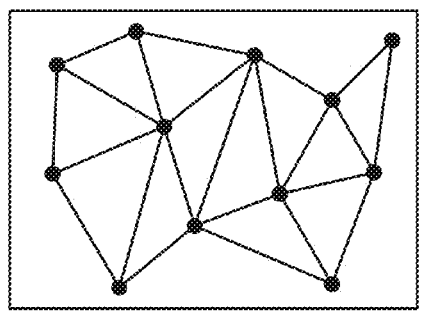
Figure 30C:
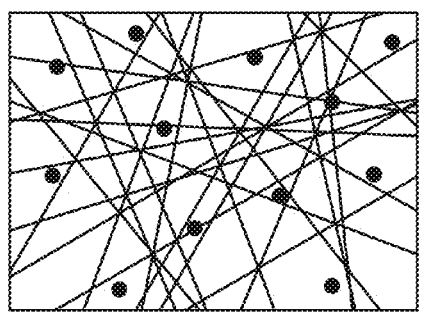
Figure 30D:
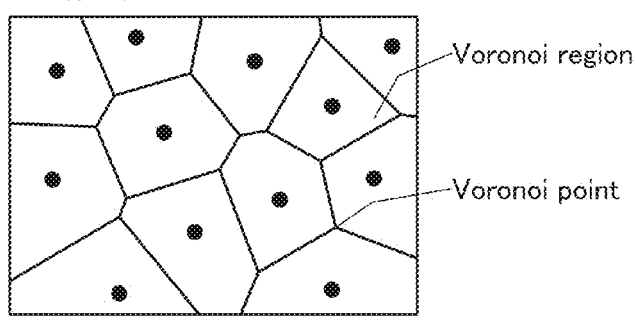
Figure 30E:
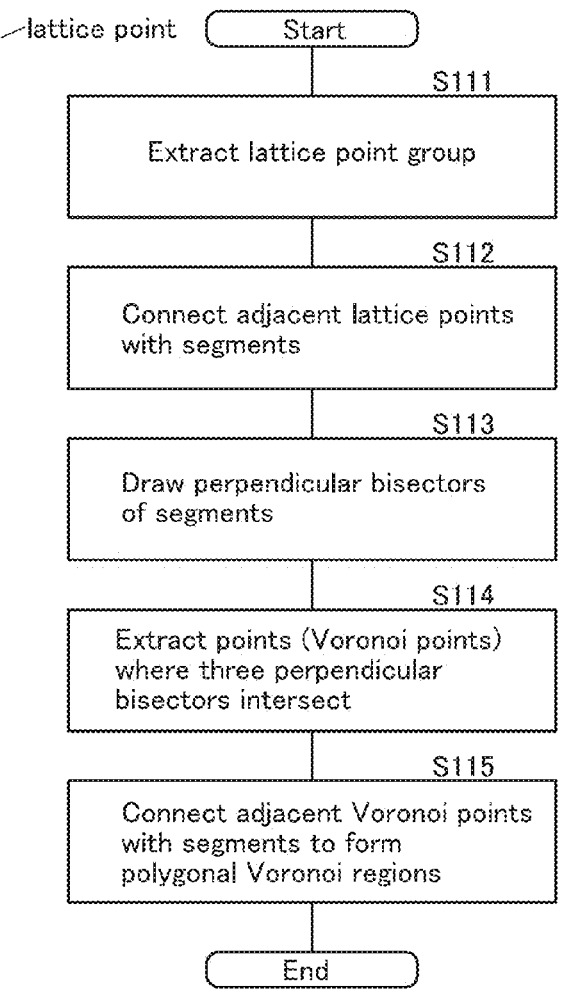

First, a lattice point group is extracted by the method described using FIGS. 23A to 23D or the like (FIG. 30A and Step S111 in FIG. 30E). Next, adjacent lattice points are connected with segments (FIG. 30B and Step S112 in FIG. 30E). Then, perpendicular bisectors of the segments are drawn (FIG. 30C and Step S113 in FIG. 30E). Subsequently, points where three perpendicular bisectors intersect are extracted (Step S114 in FIG. 30E). The points are called Voronoi points. After that, adjacent Voronoi points are connected with segments (FIG. 30D and Step S115 in FIG. 30E). A polygonal region surrounded by the segments at this point is called a Voronoi region. In the above method, a Voronoi diagram can be formed.

Here, Sample X6 is prepared. Sample X6 includes a 100-nm-thick In—Ga—Zn oxide that is deposited by PESP over a single crystal yttria-stabilized zirconia (YSZ) substrate under the following conditions: an In—Ga—Zn oxide target (circular target whose diameter is 101.6 mm and atomic ratio of In to Ga and Zn is 1:1:1.5) is used; a deposition power (DC) is 200 W; a deposition pressure is 0.4 Pa; a target-substrate distance (distance between the target and a substrate holder) is 130 mm; an argon gas at a flow rate of 20 sccm and an oxygen gas at a flow rate of 10 sccm are used as a deposition gas; and the substrate is heated (substrate temperature is 300° C.). After the deposition of the In—Ga—Zn oxide, Sample X6 is heated at 1200° C. in an oxygen atmosphere for one hour.

Figure 31A:
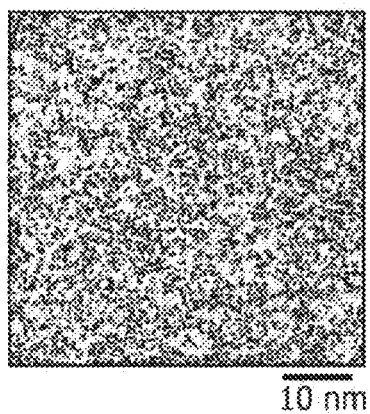
FIGS. 31A to 31F are Voronoi diagrams and graphs showing proportions of shapes of Voronoi regions.
Figure 31B:
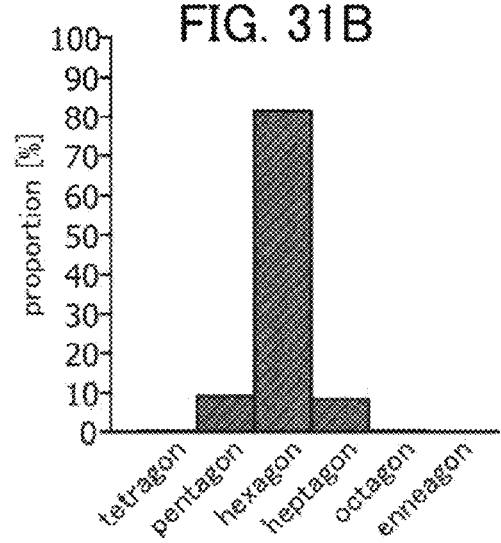
Figure 31C:
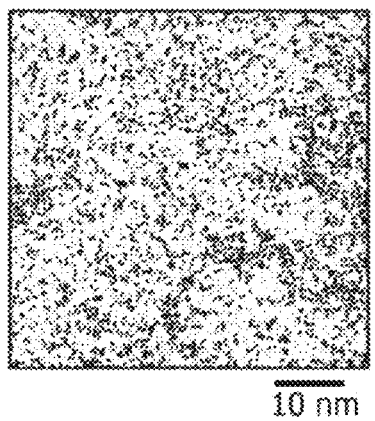
Figure 31D:
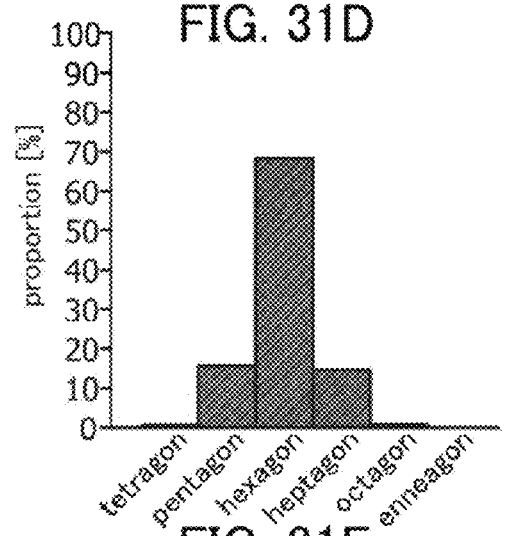
Figure 31E:
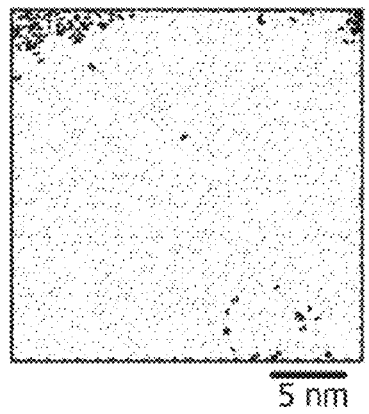
Figure 31F:
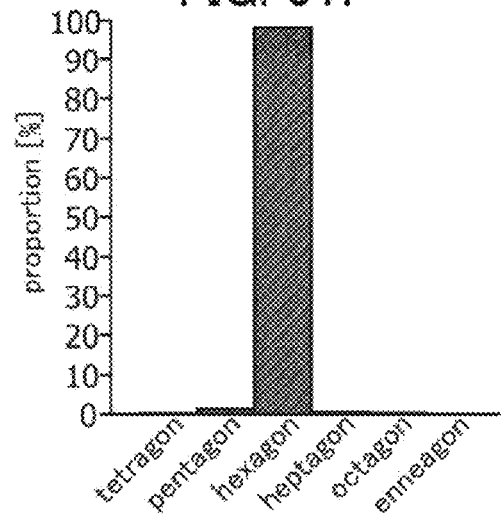

FIG. 31A is a Voronoi diagram formed using the lattice point group in Sample X4. FIG. 31B shows the proportions of the shapes of Voronoi regions (tetragon, pentagon, hexagon, heptagon, octagon, and enneagon) in FIG. 31A. FIG. 31C is a Voronoi diagram formed using the lattice point group in Sample X5. FIG. 31D shows the proportions of the shapes) of Voronoi regions (tetragon, pentagon, hexagon, heptagon, octagon, and enneagon in FIG. 31C. FIG. 31E is a Voronoi diagram formed using a lattice point group in Sample X6. FIG. 31F shows the proportions of the shapes of Voronoi regions (tetragon, pentagon, hexagon, heptagon, octagon, and enneagon) in FIG. 31E. Table 4 lists the proportions of the shapes of the Voronoi regions (tetragon, pentagon, hexagon, heptagon, octagon, and enneagon) in Sample X4, Sample X5, and Sample X6.

TABLE 4

| Shape of Voronoi region | Sample X4 | Sample X5 | Sample X6 |
|---|---|---|---|
| Tetragon | 0.3 | 0.7 | 0.1 |
| Pentagon | 9.1 | 15.5 | 1.2 |
| Hexagon | 81.6 | 68.3 | 98.2 |
| Heptagon | 8.5 | 14.5 | 0.4 |
| Octagon | 0.4 | 0.9 | 0.2 |
| Enneagon | 0.0 | 0.0 | 0.0 |

FIGS. 31A to 31F and Table 4 indicate that the proportion of hexagonal Voronoi regions in Sample X6 is extremely high, followed by Sample X4 and Sample X5. In the ideal hexagonal single crystal structure, the proportion of hexagonal Voronoi regions is 100%. Thus, the crystallinity of Sample X6, Sample X4, and Sample X5 are closer to that of the ideal single crystal structure in this order. In a CAAC-OS having high crystallinity, for example, the proportion of hexagonal Voronoi regions is higher than or equal to 50% and lower than or equal to 100%, preferably higher than or equal to 65% and lower than or equal to 100%, further preferably higher than or equal to 78% and lower than or equal to 100%, and still further preferably higher than or equal to 80% and lower than or equal to 100%.

To fabricate Sample X6, a single crystal YSZ substrate is used and heat treatment at 1200° C. is performed after the deposition; for this reason, the productivity of Sample X6 might be lower than that of other samples. Meanwhile, the productivity of Sample X5 is higher than that of Sample X6 because the heat treatment after the deposition is performed at 450° C., which is relatively low. The productivity of Sample X4 is higher than that of Sample X5 because no heat treatment is performed after the deposition. Accordingly, in light of the productivity, Sample X4 and Sample X5, particularly Sample X4, are preferable.

Note that pentagonal and heptagonal Voronoi regions in each sample are formed probably because lateral growth regions of pellets cause hexagonal regions to change their shapes to form junctions.

<Electron Diffraction>

Sample X4 is irradiated with an electron beam with a probe diameter of 1 nm (also referred to as a nanobeam) to obtain electron diffraction patterns.

Figure 32:
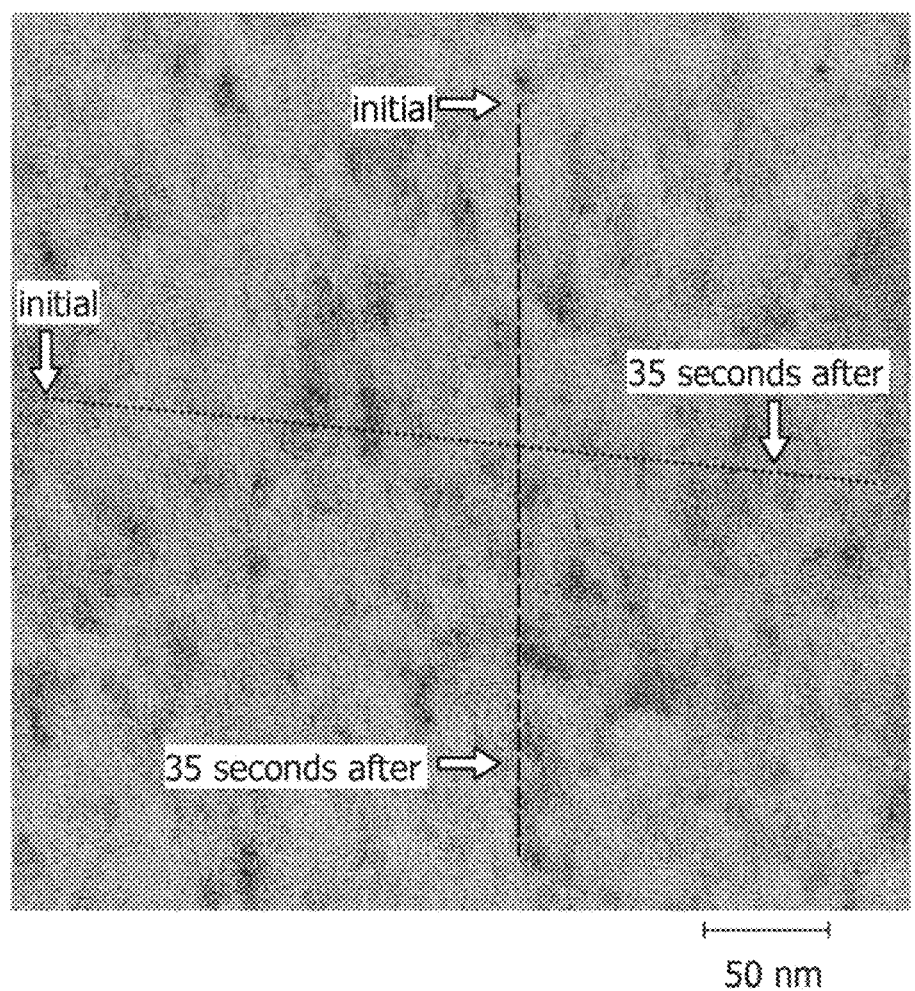
FIG. 32 is a plan-view TEM image of a CAAC-OS.
Figure 33:
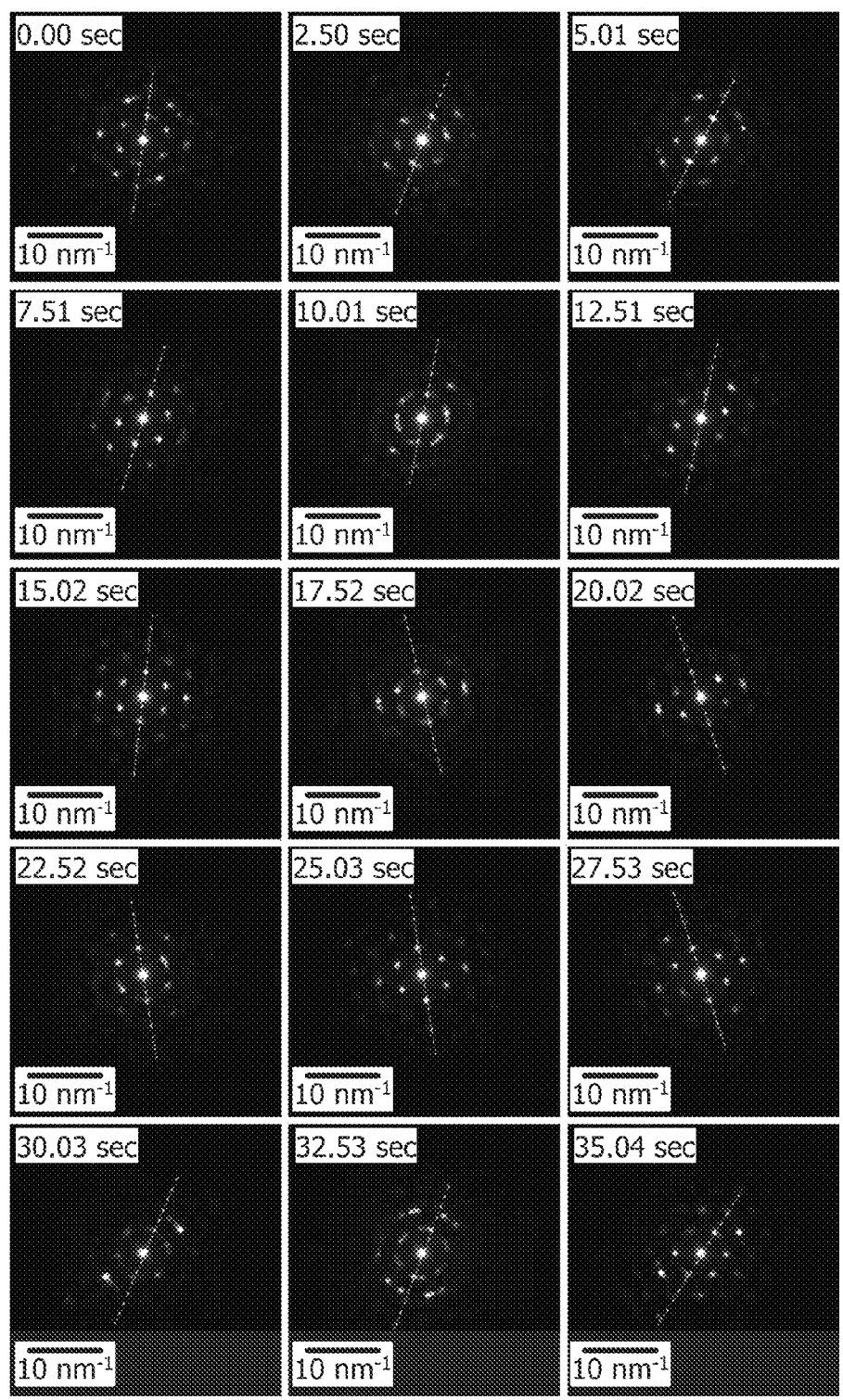
FIG. 33 shows electron diffraction patterns of a CAAC-OS.
Figure 34:
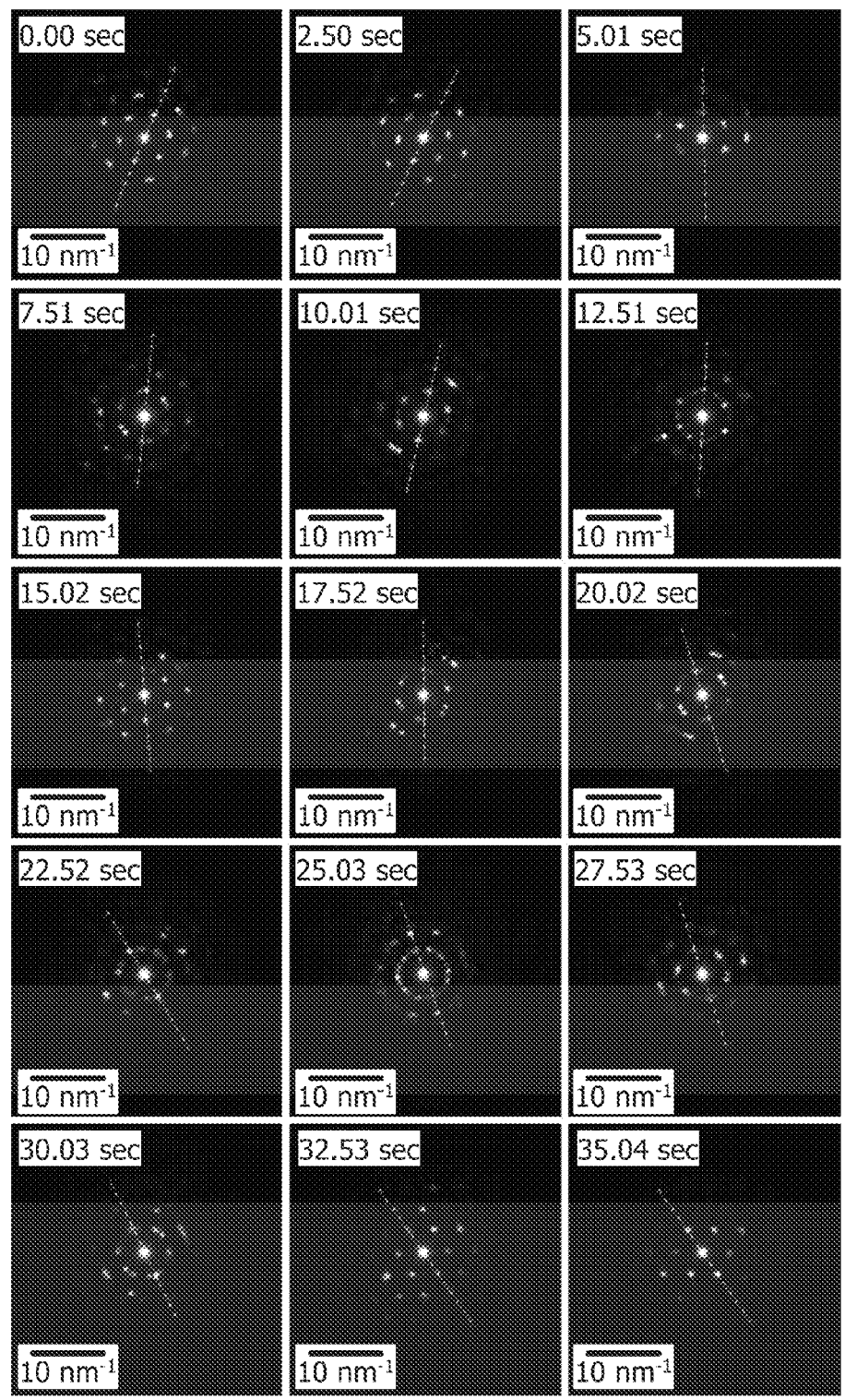
FIG. 34 shows electron diffraction patterns of a CAAC-OS.

FIG. 32 is a plan-view TEM image of Sample X4. Electron diffraction patterns are successively observed along a dotted line and a dashed line in FIG. 32. Note that the electron diffraction patterns are observed while an electron beam irradiation is performed at a constant rate for 35 seconds. FIG. 33 shows the observation results along the dotted line and FIG. 34 shows the observation results along the dashed line. In FIG. 33 and FIG. 34, one of crystal axes that appear in each electron diffraction pattern is indicated by a dashed-dotted line. FIG. 33 and FIG. 34 show that the angles of the crystal axes in Sample X4 gradually vary in the area shown in FIG. 32. Furthermore, no clear grain boundaries are observed.

Figure 35:
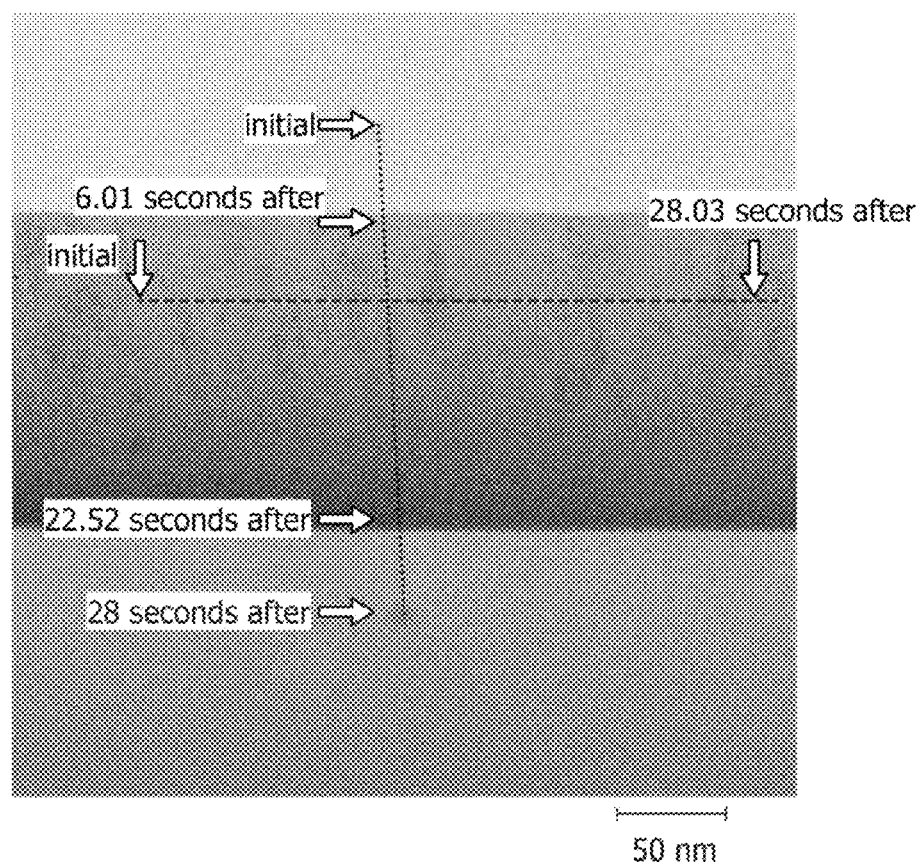
FIG. 35 is a cross-sectional TEM image of a CAAC-OS.
Figure 36:
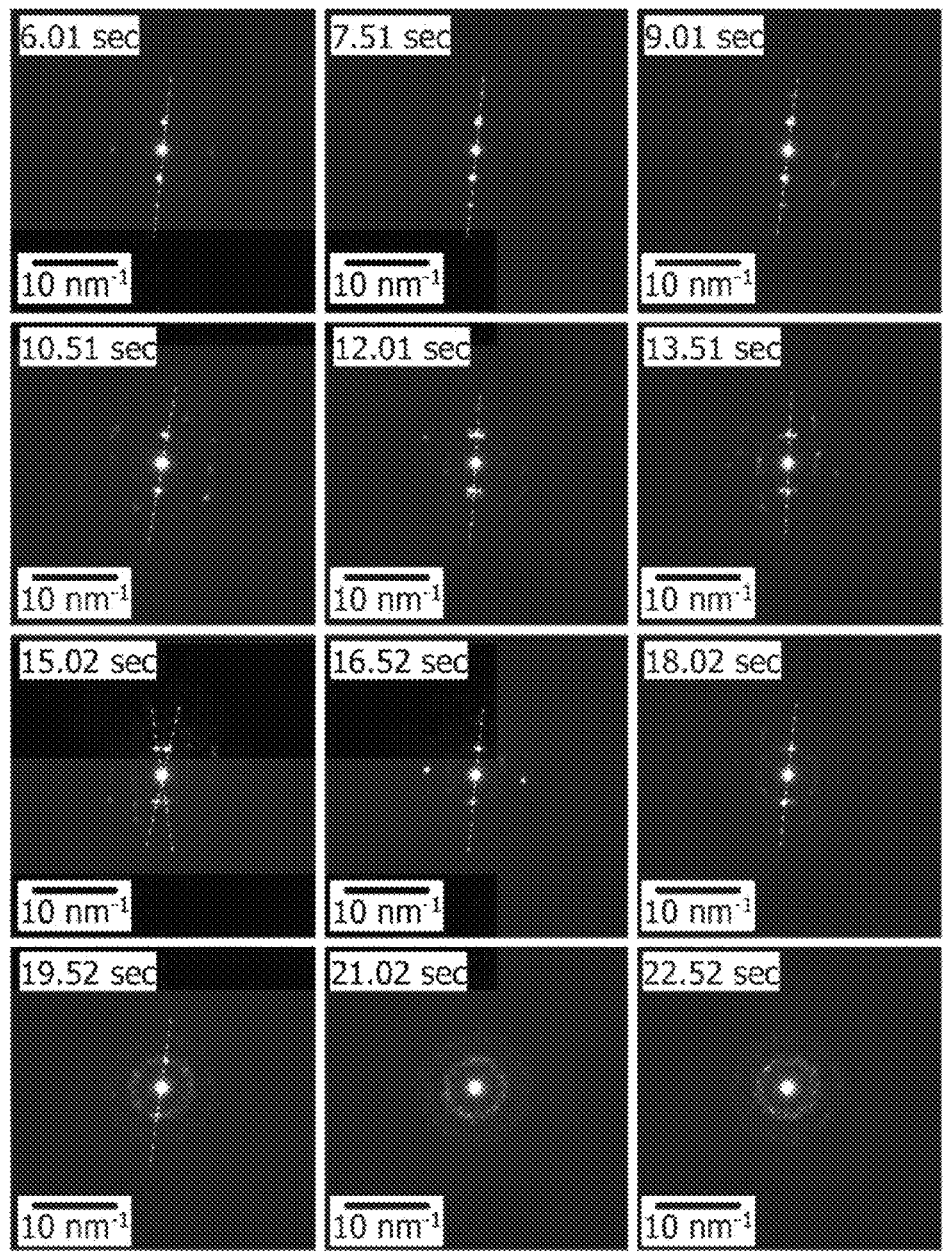
FIG. 36 shows electron diffraction patterns of a CAAC-OS.
Figure 37:
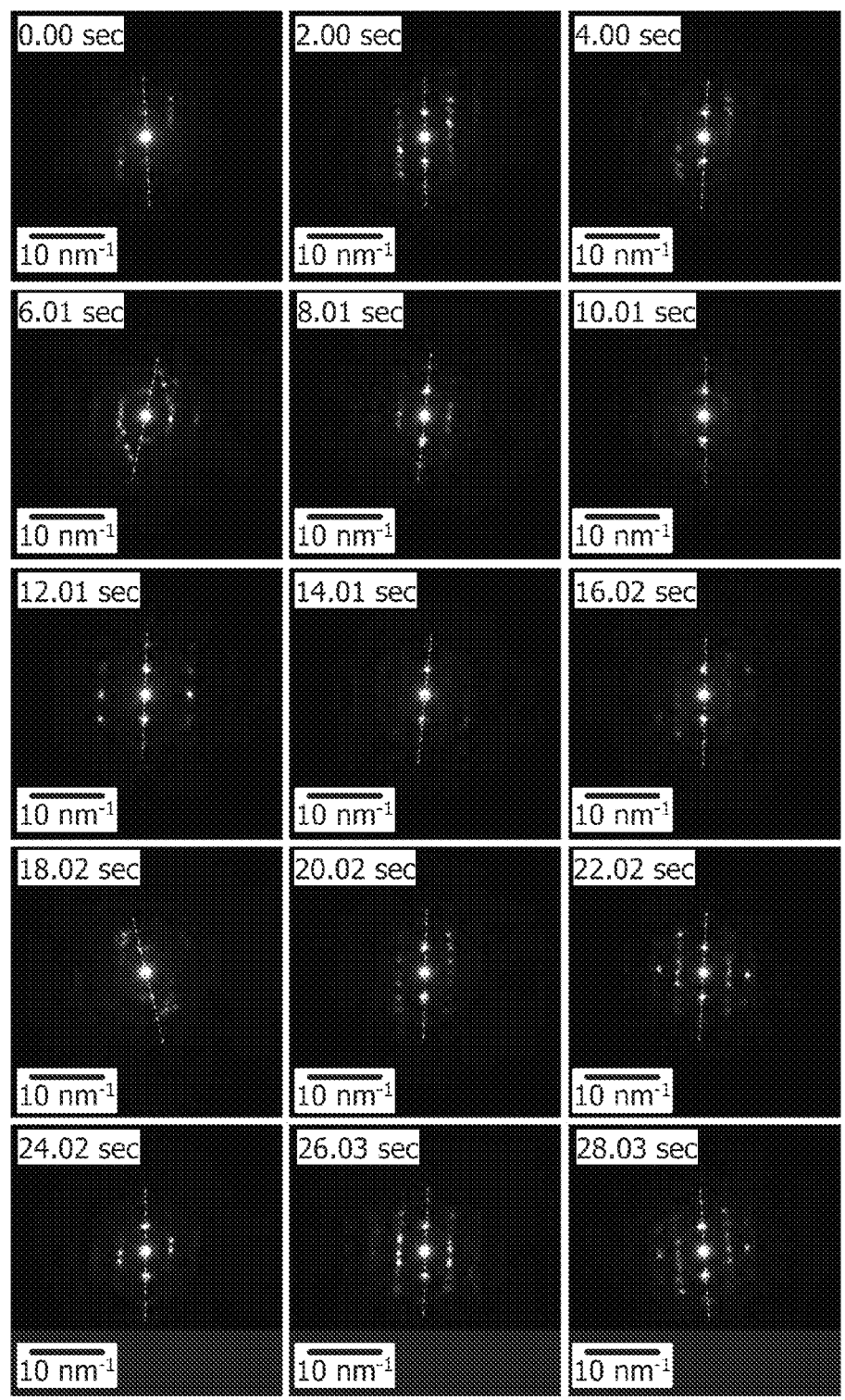
FIG. 37 shows electron diffraction patterns of a CAAC-OS.

FIG. 35 is a cross-sectional TEM image of Sample X4. Electron diffraction patterns are successively observed along a dotted line and a dashed line in FIG. 35. Note that the electron diffraction patterns are observed while an electron beam irradiation is performed at a constant rate for 28 seconds. FIG. 36 shows the observation results along the dotted line and FIG. 37 shows the observation results along the dashed line. In FIG. 36 and FIG. 37, one of crystal axes that appear in each electron diffraction pattern is indicated by a dashed-dotted line. FIG. 36 and FIG. 37 show that the angles of the crystal axes in Sample X4 gradually vary in the area shown in FIG. 35. Furthermore, no clear grain boundaries are observed.

The results indicate that, unlike a polycrystalline oxide semiconductor, a CAAC-OS has a fluctuation of an atomic arrangement while having a periodic structure. In other words, the CAAC-OS has a displacement distribution in the periodic structure. From the above characteristics, the CAAC-OS can be regarded to have a structure different from those of an amorphous oxide semiconductor, a polycrystalline oxide semiconductor, and a single crystal oxide semiconductor.

In the CAAC-OS, c-axis alignment is observed and a crystal structure with distortion which is formed by a lateral growth of a plurality of pellets (nanocrystals) in the a-b plane is observed. Note that growth points collide with and anchored to each other. Accordingly, the CAAC-OS can be technically referred to as an oxide semiconductor including c-axis-aligned a-b-plane-anchored crystals (CAA crystals).

A paracrystal is known as such a crystal structure which has a trace of an ideal atomic arrangement while having distortion. The paracrystal has been reported in the field of organic filament, but it has been hardly reported in the field of inorganic materials. A paracrystal and a CAAC-OS are different from each other in the following points. For example, the paracrystal has a planar structure (like cloth), while the CAAC-OS has a shape along a formation surface and has a stacked-layer thin film structure. Furthermore, in the CAAC-OS, a denser structure is formed by heat treatment performed at a temperature higher than or equal to a deposition temperature (e.g., higher than 300° C. and lower than 1500° C., preferably higher than 350° C. and lower than 800° C.). In addition, the CAAC-OS changes its structure into a single crystal structure when heat treatment is performed at a temperature higher than or equal to a temperature at which a crystal structure changes (e.g., higher than or equal to 1000° C. and lower than or equal to 1500° C.). Thus, it is found that the CAAC-OS has a novel crystal structure different from that of the paracrystal.

The features observed in the cross-sectional TEM images and the plan-view TEM images are one aspect of a structure of an oxide semiconductor. When a conductor is formed over a CAAC-OS, for example, physical damages or chemical damages might occur, which causes defects.

<Transistor 1>

Figure 38A:
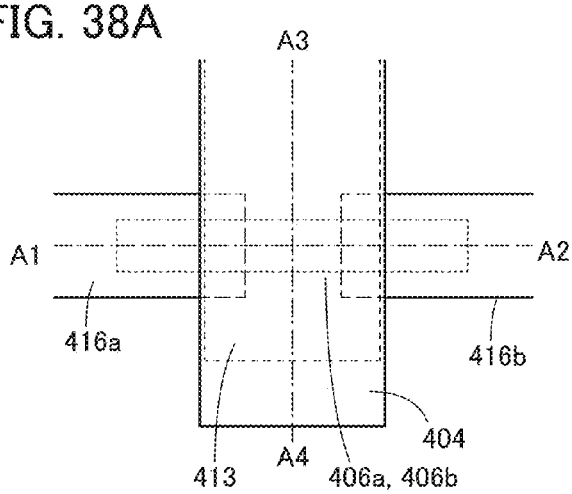
FIGS. 38A to 38C are a top view and cross-sectional views illustrating a transistor of one embodiment of the present invention.
Figure 38B:
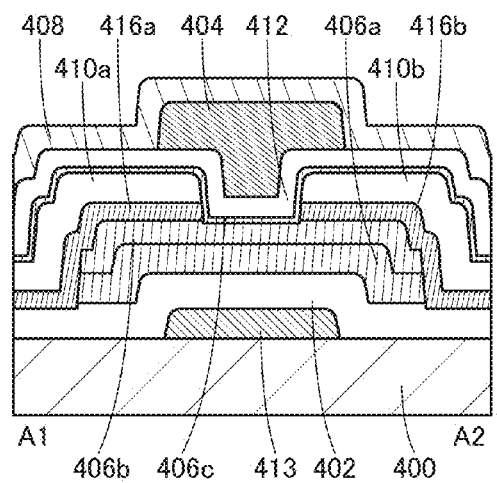
Figure 38C:
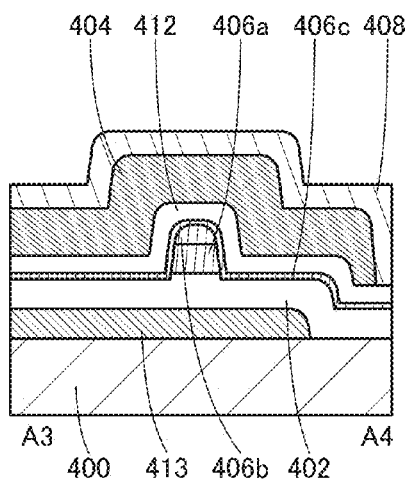

FIGS. 38A to 38C are a top view and cross-sectional views illustrating a transistor of one embodiment of the present invention. FIG. 38A is a top view, and FIGS. 38B and 38C are cross-sectional views taken along dashed-dotted lines A1-A2 and A3-A4 in FIG. 38A, respectively. Note that for simplification of the drawing, some components are not illustrated in the top view in FIG. 38A.

The transistor illustrated in FIGS. 38A to 38C includes a conductor 413 over a substrate 400, an insulator 402 over the substrate 400 and the conductor 413, a semiconductor 406a over the insulator 402, a semiconductor 406b over the semiconductor 406a, a conductor 416a and a conductor 416b which are arranged to be separated from each other while being in contact with top and side surfaces of the semiconductor 406b, an insulator 410a over the conductor 416a, an insulator 410b over the conductor 416b, a semiconductor 406c over the semiconductor 406b and the insulators 410a and 410b, an insulator 412 over the semiconductor 406c, a conductor 404 over the insulator 412, and an insulator 408 over the conductor 404. Although the conductor 413 is part of the transistor in this non-limiting example, the conductor 413 may be a component independent of the transistor, for example. Furthermore, the transistor does not necessarily include one or more of the insulator 408, the insulator 410a, and the insulator 410b.

The conductor 404 includes a region that faces the top surface and the side surface of the semiconductor 406b with the insulator 412 provided therebetween in the cross section taken along line A3-A4. The conductor 413 includes a region which faces the bottom surface of the semiconductor 406b with the insulator 402 provided therebetween.

The semiconductor 406b serves as a channel formation region of the transistor. The conductor 404 serves as a first gate electrode (also referred to as a front gate electrode) of the transistor. The conductor 413 serves as a second gate electrode (also referred to as a back gate electrode) of the transistor. The conductor 416a and the conductor 416b serve as a source electrode and a drain electrode of the transistor.

As illustrated in FIG. 38C, the semiconductor 406b can be electrically surrounded by an electric field of the conductor 404 and/or the conductor 413 (a structure in which a semiconductor is electrically surrounded by an electric field of a conductor is referred to as a surrounded channel (s-channel) structure). Therefore, a channel is formed in the entire semiconductor 406b (the top, bottom, and side surfaces). In the s-channel structure, a large amount of current can flow between a source and a drain of the transistor, so that a high on-state current can be achieved.

In the case where the transistor has the s-channel structure, a channel is formed also in the side surface of the semiconductor 406b. Therefore, as the semiconductor 406b has a larger thickness, the channel formation region becomes larger. In other words, the thicker the semiconductor 406b is, the larger the on-state current of the transistor is. In addition, when the semiconductor 406b is thicker, the proportion of the region with a high carrier controllability increases, leading to a smaller subthreshold swing value. For example, the semiconductor 406b has a region with a thickness of greater than or equal to 10 nm, preferably greater than or equal to 20 nm, further preferably greater than or equal to 40 nm, still further preferably greater than or equal to 60 nm, and yet still further preferably greater than or equal to 100 nm. In addition, to prevent a decrease in the productivity of the semiconductor device, the semiconductor 406b has a region with a thickness of, for example, less than or equal to 300 nm, preferably less than or equal to 200 nm, and further preferably less than or equal to 150 nm. In some cases, when the channel formation region is reduced in size, electrical characteristics of the transistor with a smaller thickness of the semiconductor 406b may be improved. Therefore, the semiconductor 406b may have a thickness less than 10 nm.

The s-channel structure is suitable for a miniaturized transistor because a high on-state current can be achieved. A semiconductor device including the miniaturized transistor can have a high integration degree and high density. For example, the transistor includes a region having a channel length of preferably less than or equal to 40 nm, further preferably less than or equal to 30 nm, and still further preferably less than or equal to 20 nm and a region having a channel width of preferably less than or equal to 40 nm, further preferably less than or equal to 30 nm, and still further preferably less than or equal to 20 nm.

As the substrate 400, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a single material semiconductor substrate of silicon, germanium, or the like or a compound semiconductor substrate of silicon carbide, silicon germanium, gallium arsenide, indium phosphide, zinc oxide, gallium oxide, or the like is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 400. As a method for providing a device over a flexible substrate, there is a method in which the device is formed over a non-flexible substrate and then the device is separated and transferred to the substrate 400 which is a flexible substrate. In that case, a separation layer is preferably provided between the non-flexible substrate and the device. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The thickness of the substrate 400 is, for example, greater than or equal to 5 μm and less than or equal to 700 μm, preferably greater than or equal to 10 μm and less than or equal to 500 μm, and further preferably greater than or equal to 15 μm and less than or equal to 300 μm. When the substrate 400 has a small thickness, the weight of the semiconductor device can be reduced. When the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a durable semiconductor device can be provided.

For the substrate 400 which is a flexible substrate, metal, an alloy, resin, glass, or fiber thereof can be used, for example. The flexible substrate 400 preferably has a lower coefficient of linear expansion because deformation due to an environment is suppressed. The flexible substrate 400 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

The conductor 413 may be formed to have a single-layer structure or a stacked-layer structure using a conductor containing, for example, one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 402 may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 402 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator 402 preferably contains excess oxygen in the case where the semiconductor 406b is an oxide semiconductor. Note that excess oxygen means oxygen in an insulator or the like which does not bond with (which is liberated from) the insulator or the like or has low bonding energy with the insulator or the like.

Here, an insulator including excess oxygen may release oxygen, the amount of which is higher than or equal to $1\times10^{18}$ atoms/cm$^3$, higher than or equal to $1\times10^{19}$ atoms/cm$^3$, or higher than or equal to $1\times10^{20}$ atoms/cm$^3$ (converted into the number of oxygen atoms) in thermal desorption spectroscopy (TDS) analysis in the range of a surface temperature of 100° C. to 700° C. or 100° C. to 500° C.

The method of measuring the amount of released oxygen using TDS analysis is described below.

The total amount of released gas from a measurement sample in TDS analysis is proportional to the integral value of the ion intensity of the released gas. Then, comparison with a reference sample is made, whereby the total amount of released gas can be calculated.

For example, the number of released oxygen molecules ($N_{O2}$) from a measurement sample can be calculated according to the following formula using the TDS results of a silicon substrate containing hydrogen at a predetermined density, which is a reference sample, and the TDS results of the measurement sample. Here, all gases having a mass-to-charge ratio of 32 which are obtained in the TDS analysis are assumed to originate from an oxygen molecule. Note that CH$_3$OH, which is a gas having the mass-to-charge ratio of 32, is not taken into consideration because it is unlikely to be present. Furthermore, an oxygen molecule including an oxygen atom having a mass number of 17 or 18 which is an isotope of an oxygen atom is also not taken into consideration because the proportion of such a molecule in the natural world is minimal.

$$NO_2 = N_{H2}/S_{H2} \times S_{O2} \times \alpha$$

The value $N_{H2}$ is obtained by conversion of the number of hydrogen molecules desorbed from the reference sample into densities. The value $S_{H2}$ is the integral value of ion intensity in the case where the reference sample is subjected to the TDS analysis. Here, the reference value of the reference sample is set to $N_{H2}/S_{H2}$. The value $S_{O2}$ is the integral value of ion intensity when the measurement sample is analyzed by TDS. The value $\alpha$ is a coefficient affecting the ion intensity in the TDS analysis. Refer to Japanese Published Patent Application No. H6-275697 for details of the above formula. The amount of released oxygen was measured with a thermal desorption spectroscopy apparatus produced by ESCO Ltd., EMD-WA1000S/W using a silicon substrate containing a certain amount of hydrogen atoms as the reference sample.

Furthermore, in the TDS analysis, oxygen is partly detected as an oxygen atom. The ratio between oxygen molecules and oxygen atoms can be calculated from the ionization rate of the oxygen molecules. Note that, since the above α includes the ionization rate of the oxygen molecules, the number of the released oxygen atoms can also be estimated through the evaluation of the number of the released oxygen molecules.

Note that $N_{O2}$ is the number of the released oxygen molecules. The number of released oxygen in the case of being converted into oxygen atoms is twice the number of the released oxygen molecules.

Furthermore, the insulator from which oxygen is released by heat treatment may contain a peroxide radical. Specifically, the spin density of a signal attributed to the peroxide radical is greater than or equal to $5\times10^{17}$ spins/cm$^3$. Note that the insulator containing a peroxide radical may have an asymmetric signal with a g factor of approximately 2.01 in electron spin resonance (ESR).

The conductor 416a and the conductor 416b may be formed to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 410a and the insulator 410b may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 410a and the insulator 410b may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

Note that the insulator 410a and the insulator 410b preferably include an insulator with low relative permittivity. For example, the insulator 410a and the insulator 410b preferably include silicon oxide, silicon oxynitride, silicon nitride oxide, silicon nitride, resin, or the like. Examples of the resin include polyester, polyolefin, polyamide (e.g., nylon or aramid), polyimide, polycarbonate, and acrylic.

The insulator 412 may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 412 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator 412 preferably contains excess oxygen in the case where the semiconductor 406b is an oxide semiconductor.

The conductor 404 may be formed to have a single-layer structure or a stacked-layer structure using a conductor containing, for example, one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Figure 39A:
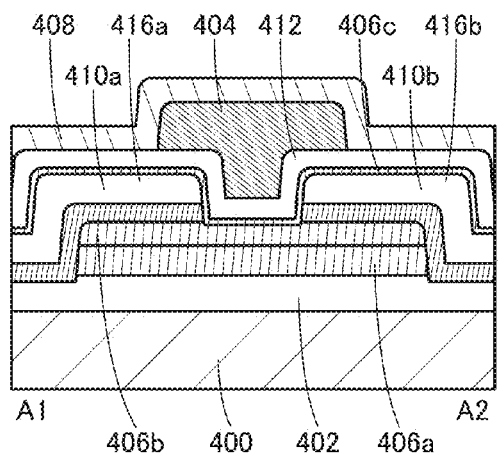
FIGS. 39A to 39F are cross-sectional views each illustrating a transistor of one embodiment of the present invention.
Figure 39B:
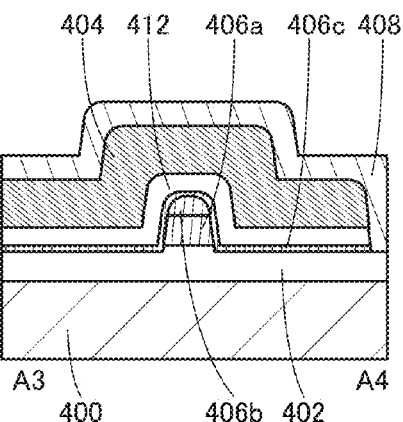
Figure 39C:
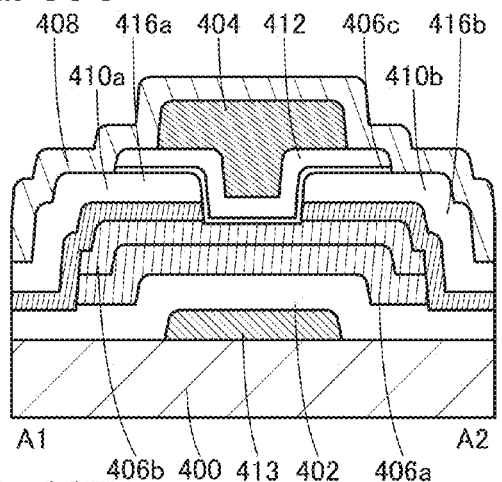
Figure 39D:
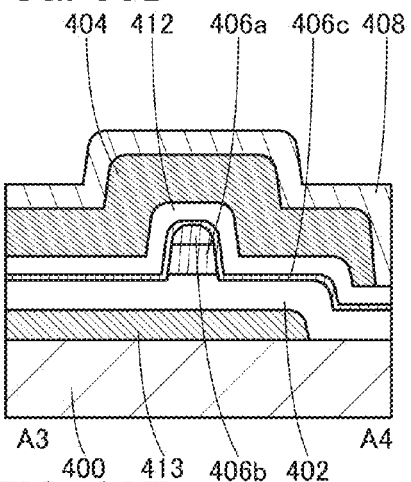
Figure 39E:
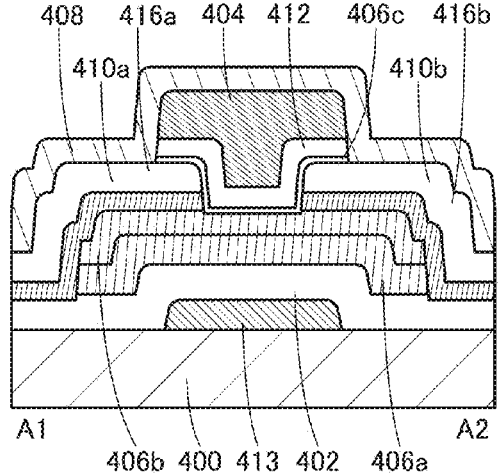
Figure 39F:
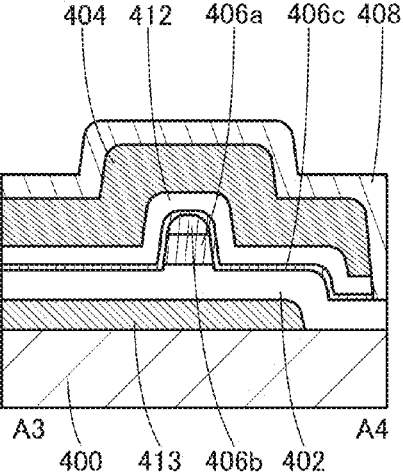
Figure 40A:
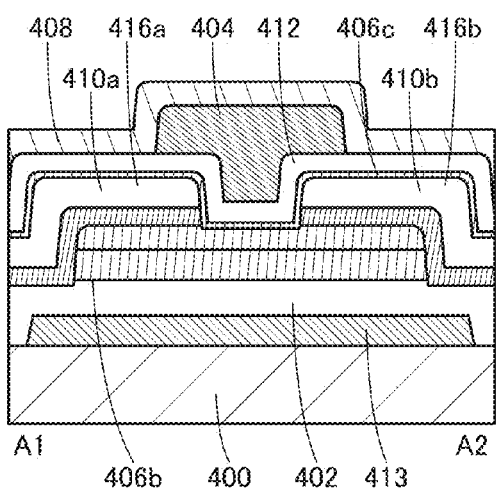
FIGS. 40A to 40F are cross-sectional views each illustrating a transistor of one embodiment of the present invention.
Figure 40B:
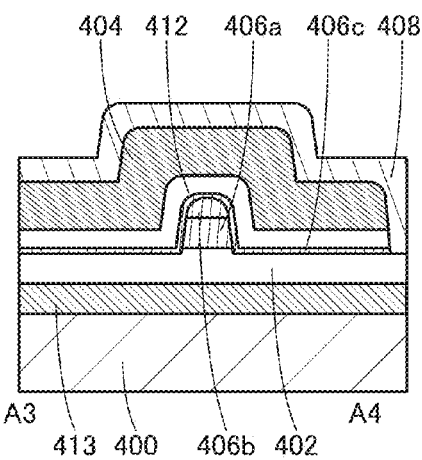
Figure 40C:
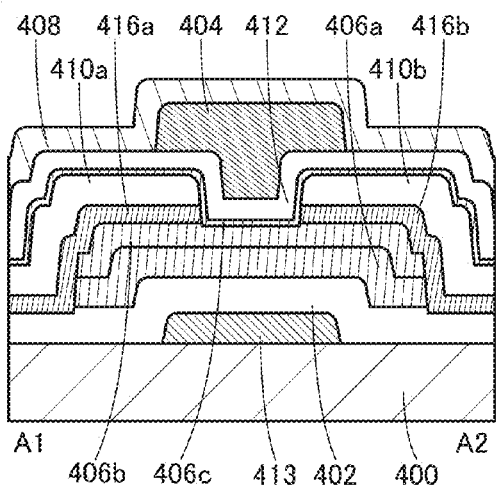
Figure 40D:
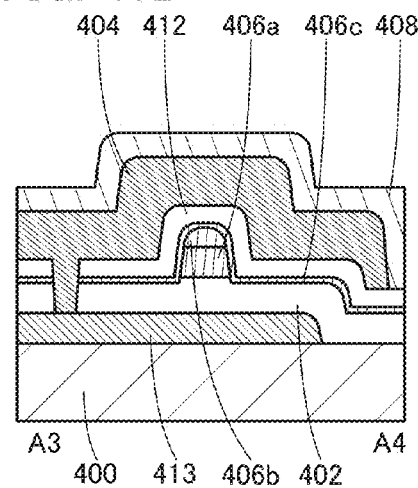
Figure 40E:
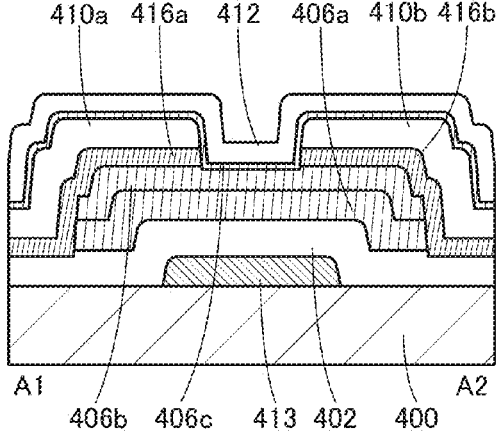
Figure 40F:
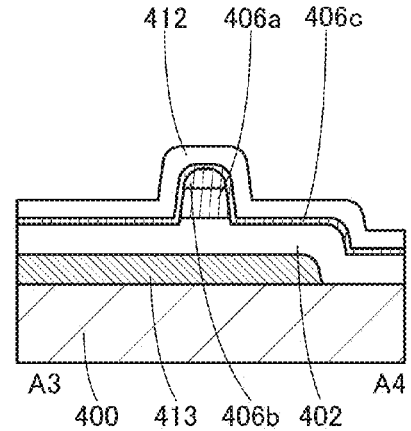

Note that the conductor 413 is not necessarily formed (see FIGS. 39A and 39B). A shape in which the insulator 412 and the semiconductor 406c protrude from the conductor 404 may be employed (see FIGS. 39C and 39D). A shape in which the insulator 412 and the semiconductor 406c do not necessarily protrude from the conductor 404 may be employed (see FIGS. 39E and 39F). In the A1-A2 cross section, the width of the conductor 413 may be larger than that of the semiconductor 406b (see FIGS. 40A and 40B). The conductor 413 may be in contact with the conductor 404 through an opening (see FIGS. 40C and 40D). The conductor 404 is not necessarily formed (see FIGS. 40E and 40F).

The insulator 408 is, for example, an insulator having a low hydrogen-transmitting property (i.e., a hydrogen barrier property).

Because of its small atomic radius or the like, hydrogen is likely to be diffused in an insulator (i.e., the diffusion coefficient of hydrogen is large). For example, a low-density insulator has a high hydrogen-transmitting property. In other words, a high-density insulator has a low hydrogen-transmitting property. The density of a low-density insulator is not always low throughout the insulator; an insulator including a low-density part is also referred to as a low-density insulator. This is because the low-density part serves as a hydrogen path. Although a density that allows hydrogen to be transmitted is not limited, it is typically lower than 2.6 g/cm$^3$. Examples of a low-density insulator include an inorganic insulator such as silicon oxide or silicon oxynitride and an organic insulator such as polyester, polyolefin, polyamide (e.g., nylon or aramid), polyimide, polycarbonate, or acrylic. Examples of a high-density insulator include magnesium oxide, aluminum oxide, germanium oxide, gallium oxide, yttrium oxide, zirconium oxide, lanthanum oxide, neodymium oxide, hafnium oxide, and tantalum oxide. Note that a low-density insulator and a high-density insulator are not limited to these insulators. For example, the insulators may contain one or more of boron, nitrogen, fluorine, neon, phosphorus, chlorine, and argon.

An insulator having crystal grain boundaries can have a high hydrogen-transmitting property. In other words, hydrogen is less likely transmitted through an insulator having no grain boundaries or few grain boundaries. For example, a non-polycrystalline insulator (e.g., an amorphous insulator) has a lower hydrogen-transmitting property than a polycrystalline insulator.

An insulator having a high hydrogen-bonding energy has a low hydrogen-transmitting property in some cases. For example, when an insulator which forms a hydrogen compound by bonding with hydrogen has bonding energy at which hydrogen is not released at temperatures in fabrication and operation of a device, the insulator can be in the category of an insulator having a low hydrogen-transmitting property. For example, an insulator which forms a hydrogen compound at higher than or equal to 200° C. and lower than or equal to 1000° C., higher than or equal to 300° C. and lower than or equal to 1000° C., or higher than or equal to 400° C. and lower than or equal to 1000° C. has a low hydrogen-transmitting property in some cases. An insulator which forms a hydrogen compound and which releases hydrogen at higher than or equal to 200° C. and lower than or equal to 1000° C., higher than or equal to 300° C. and lower than or equal to 1000° C., or higher than or equal to 400° C. and lower than or equal to 1000° C. has a low hydrogen-transmitting property in some cases. An insulator which forms a hydrogen compound and which releases hydrogen at higher than or equal to 20° C. and lower than or equal to 400° C., higher than or equal to 20° C. and lower than or equal to 300° C., or higher than or equal to 20° C. and lower than or equal to 200° C. has a high hydrogen-transmitting property in some cases. Hydrogen which is released easily and liberated can be referred to as excess hydrogen.

The insulator 408 is, for example, an insulator having a low oxygen-transmitting property (i.e., an oxygen barrier property).

The insulator 408 is, for example, an insulator having a low water-transmitting property (i.e., a water barrier property).

<Semiconductor>

The semiconductor 406a, the semiconductor 406b, and the semiconductor 406c will be described.

Placing the semiconductor 406a under the semiconductor 406b and placing the semiconductor 406c over the semiconductor 406b can increase electrical characteristics of the transistor in some cases.

The semiconductor 406a, the semiconductor 406b, and the semiconductor 406c preferably include a CAAC-OS.

The semiconductor 406b is an oxide semiconductor containing indium, for example. The oxide semiconductor 406b can have high carrier mobility (electron mobility) by containing indium, for example. The semiconductor 406b preferably contains an element M The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, and the like. Note that two or more of the above elements may be used in combination as the element M The element M is an element having high bonding energy with oxygen, for example. The element M is an element whose bonding energy with oxygen is higher than that of indium. The element M is an element that can increase the energy gap of the oxide semiconductor, for example. Furthermore, the semiconductor 406b preferably contains zinc. When the oxide semiconductor contains zinc, the oxide semiconductor is easily crystallized, in some cases.

Note that the semiconductor 406b is not limited to the oxide semiconductor containing indium. The semiconductor 406b may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the semiconductor 406b, an oxide with a wide energy gap may be used, for example. For example, the energy gap of the semiconductor 406b is greater than or equal to 2.5 eV and less than or equal to 4.2 eV, preferably greater than or equal to 2.8 eV and less than or equal to 3.8 eV, and further preferably greater than or equal to 3 eV and less than or equal to 3.5 eV.

For example, the semiconductor 406a and the semiconductor 406c are oxide semiconductors including one or more elements, or two or more elements other than oxygen included in the semiconductor 406b. Since the semiconductor 406a and the semiconductor 406c each include one or more elements, or two or more elements other than oxygen included in the semiconductor 406b, a defect state is less likely to be formed at the interface between the semiconductor 406a and the semiconductor 406b and the interface between the semiconductor 406b and the semiconductor 406c.

The semiconductor 406a, the semiconductor 406b, and the semiconductor 406c preferably include at least indium. In the case of using an In-M-Zn oxide as the semiconductor 406a, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case of using an In-M-Zn oxide as the semiconductor 406b, when the summation of In and M is assumed to be 100 atomic %, the proportions of In and M are preferably set to be greater than 25 atomic % and less than 75 atomic %, respectively, and further preferably greater than 34 atomic % and less than 66 atomic %, respectively. In the case of using an In-M-Zn oxide as the semiconductor 406c, when the summation of In and M is assumed to be 100 atomic %, the proportions of In and M are preferably set to be less than 50 atomic % and greater than 50 atomic %, respectively, and further preferably less than 25 atomic % and greater than 75 atomic %, respectively. Note that the semiconductor 406c may be an oxide that is of the same type as the oxide of the semiconductor 406a. Note that the semiconductor 406a and/or the semiconductor 406c do/does not necessarily contain indium in some cases. For example, the semiconductor 406a and/or the semiconductor 406c may be gallium oxide. Note that the atomic ratios of the elements included in the semiconductor 406a, the semiconductor 406b, and the semiconductor 406c are not necessarily simple ratios of integers.

As the semiconductor 406b, an oxide having an electron affinity higher than those of the semiconductors 406a and 406c is used. For example, as the semiconductor 406b, an oxide having an electron affinity higher than those of the semiconductors 406a and 406c by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy difference between the vacuum level and the conduction band minimum.

An indium gallium oxide has small electron affinity and a high oxygen-blocking property. Therefore, the semiconductor 406c preferably includes an indium gallium oxide. The fraction of gallium atoms [Ga/(In+Ga)] is, for example, higher than or equal to 70%, preferably higher than or equal to 80%, further preferably higher than or equal to 90%.

At this time, when gate voltage is applied, a channel is formed in the semiconductor 406b whose electron affinity is the highest among the semiconductor 406a, the semiconductor 406b, and the semiconductor 406c.

Figure 41:
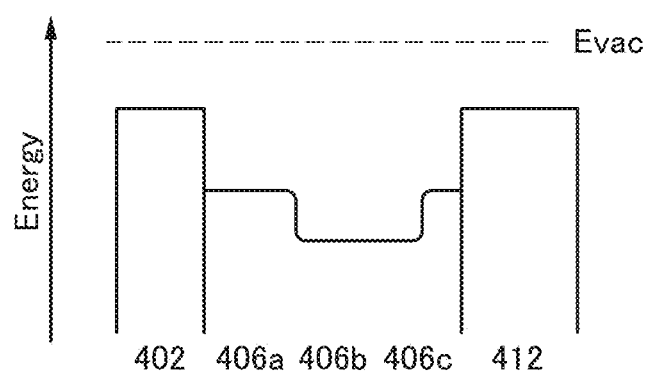
FIG. 41 is a band diagram of a region including an oxide semiconductor of one embodiment of the present invention.

In some cases, there is a mixed region of the semiconductor 406a and the semiconductor 406b between the semiconductor 406a and the semiconductor 406b. Furthermore, in some cases, there is a mixed region of the semiconductor 406b and the semiconductor 406c between the semiconductor 406b and the semiconductor 406c. The mixed region has a low density of defect states. For that reason, in a band diagram of a stack including the semiconductor 406a, the semiconductor 406b, and the semiconductor 406c (see FIG. 41), energy changes continuously at each interface and in the vicinity of the interface (continuous junction). Note that boundaries of the semiconductor 406a, the semiconductor 406b, and the semiconductor 406c are not clear in some cases.

At this time, electrons move mainly in the semiconductor 406b, not in the semiconductor 406a and the semiconductor 406c. As described above, when the density of defect states at the interface between the semiconductor 406a and the semiconductor 406b and the density of defect states at the interface between the semiconductor 406b and the semiconductor 406c are decreased, electron movement in the semiconductor 406b is less likely to be inhibited and the on-sate current of the transistor can be increased.

As factors of inhibiting electron movement are decreased, the on-state current of the transistor can be increased. For example, in the case where there is no factor of inhibiting electron movement, electrons are assumed to be efficiently moved. Electron movement is inhibited, for example, in the case where physical unevenness of the channel formation region is large.

To increase the on-state current of the transistor, for example, root mean square (RMS) roughness with a measurement area of 1 µm×1 µm of the top surface or the bottom surface of the semiconductor 406b (a formation surface; here, the top surface of the semiconductor 406a) is less than 1 nm, preferably less than 0.6 nm, further preferably less than 0.5 nm, still further preferably less than 0.4 nm. The average surface roughness (also referred to as Ra) with the measurement area of 1 µm×1 µm is less than 1 nm, preferably less than 0.6 nm, further preferably less than 0.5 nm, still further preferably less than 0.4 nm. The maximum difference (P–V) with the measurement area of 1 µm×1 µm is less than 10 nm, preferably less than 9 nm, further preferably less than 8 nm, still further preferably less than 7 nm. RMS roughness, Ra, and P–V can be measured using a scanning probe microscope SPA-500 manufactured by SII Nano Technology Inc.

Moreover, the thickness of the semiconductor 406c is preferably as small as possible to increase the on-state current of the transistor. For example, the semiconductor 406c is formed to include a region with a thickness of less than 10 nm, preferably less than or equal to 5 nm, further preferably less than or equal to 3 nm. Meanwhile, the semiconductor 406c has a function of blocking entry of elements other than oxygen (such as hydrogen and silicon) included in the adjacent insulator into the semiconductor 406b where a channel is formed. For this reason, it is preferable that the semiconductor 406c have a certain thickness. For example, the semiconductor 406c is formed to include a region with a thickness of greater than or equal to 0.3 nm, preferably greater than or equal to 1 nm, and further preferably greater than or equal to 2 nm. The semiconductor 406c preferably has an oxygen blocking property to suppress outward diffusion of oxygen released from the insulator 402 and the like.

To improve reliability, preferably, the thickness of the semiconductor 406a is large and the thickness of the semiconductor 406c is small. For example, the semiconductor 406a includes a region with a thickness of, for example, greater than or equal to 10 nm, preferably greater than or equal to 20 nm, further preferably greater than or equal to 40 nm, and still further preferably greater than or equal to 60 nm. When the thickness of the semiconductor 406a is made large, a distance from an interface between the adjacent insulator and the semiconductor 406a to the semiconductor 406b in which a channel is formed can be large. Since the productivity of the semiconductor device might be decreased, the semiconductor 406a has a region with a thickness of, for example, less than or equal to 200 nm, preferably less than or equal to 120 nm, and further preferably less than or equal to 80 nm.

A region with a silicon concentration measured by secondary ion mass spectrometry (SIMS) of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $2\times10^{18}$ atoms/cm$^3$ is provided between the semiconductor 406b and the semiconductor 406a, for example. A region with a silicon concentration measured by SIMS of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $2\times10^{18}$ atoms/cm$^3$ is provided between the semiconductor 406b and the semiconductor 406c.

The semiconductor 406b includes a region with a hydrogen concentration measured by SIMS of higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, or still further preferably higher than or equal to $1\times10^{16}$ atoms/cm$^3$ and lower than or equal to $5\times10^{18}$ atoms/cm$^3$. It is preferable to reduce the hydrogen concentration in the semiconductor 406a and the semiconductor 406c in order to reduce the hydrogen concentration in the semiconductor 406b. The semiconductor 406a and the semiconductor 406c each include a region with a hydrogen concentration measured by SIMS of higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, or still further preferably higher than or equal to $1\times10^{16}$ atoms/cm$^3$ and lower than or equal to $5\times10^{18}$ atoms/cm$^3$. The semiconductor 406b includes a region with a nitrogen concentration measured by SIMS of higher than or equal to $1\times10^{15}$ atoms/cm$^3$ and lower than or equal to $5\times10^{19}$ atoms/cm$^3$, preferably higher than or equal to $1\times10^{15}$ atoms/cm$^3$ and lower than or equal to $5\times10^{18}$ atoms/cm$^3$, further preferably higher than or equal to $1\times10^{15}$ atoms/cm$^3$ and lower than or equal to $1\times10^{18}$ atoms/cm$^3$, or still further preferably higher than or equal to $1\times10^{15}$ atoms/cm$^3$ and lower than or equal to $5\times10^{17}$ atoms/cm$^3$. It is preferable to reduce the nitrogen concentration in the semiconductor 406a and the semiconductor 406c in order to reduce the nitrogen concentration in the semiconductor 406b. The semiconductor 406a and the semiconductor 406c each include a region with a nitrogen concentration measured by SIMS of higher than or equal to $1\times10^{15}$ atoms/cm$^3$ and lower than or equal to $5\times10^{19}$ atoms/cm$^3$, preferably higher than or equal to $1\times10^{15}$ atoms/cm$^3$ and lower than or equal to $5\times10^{18}$ atoms/cm$^3$, further preferably higher than or equal to $1\times10^{15}$ atoms/cm$^3$ and lower than or equal to $1\times10^{18}$ atoms/cm$^3$, or still further preferably higher than or equal to $1\times10^{15}$ atoms/cm$^3$ and lower than or equal to $5\times10^{17}$ atoms/cm$^3$.

The above three-layer structure is an example. For example, a two-layer structure without the semiconductor 406a or the semiconductor 406c may be employed. Alternatively, a four-layer structure in which any one of the semiconductors described as examples of the semiconductor 406a, the semiconductor 406b, and the semiconductor 406c is provided under or over the semiconductor 406a or under or over the semiconductor 406c may be employed. An n-layer structure (n is an integer of 5 or more) may be employed in which one of the semiconductors described as examples of the semiconductor 406a, the semiconductor 406b, and the semiconductor 406c is provided at two or more of the following positions: over the semiconductor 406a, under the semiconductor 406a, over the semiconductor 406c, and under the semiconductor 406c.

<Transistor 2>

Figure 42A:
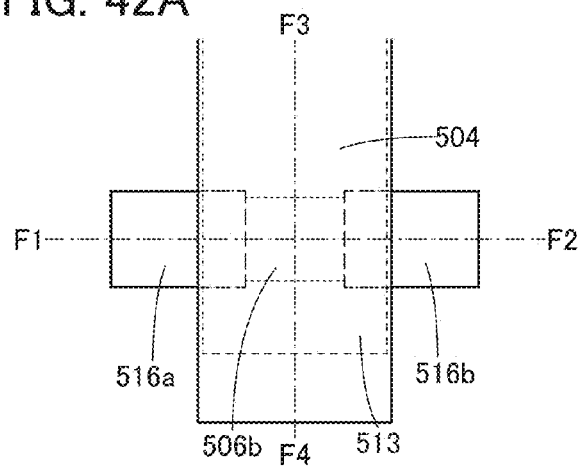
FIGS. 42A to 42C are a top view and cross-sectional views illustrating a transistor of one embodiment of the present invention.
Figure 42B:
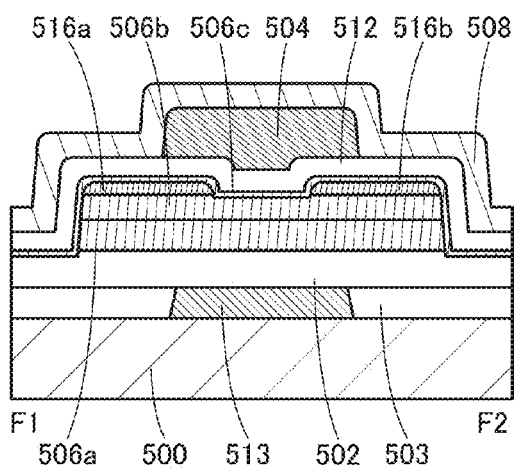
Figure 42C:
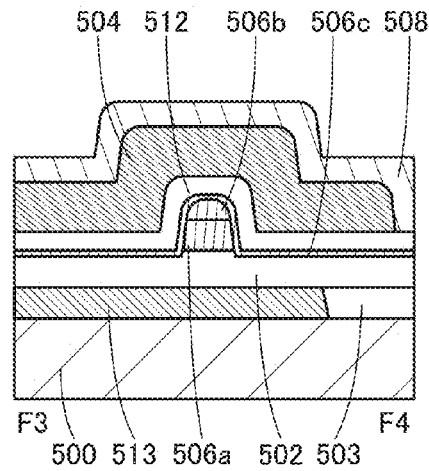

FIGS. 42A to 42C are a top view and cross-sectional views illustrating a transistor of one embodiment of the present invention. FIG. 42A is a top view, and FIGS. 42B and 42C are cross-sectional views taken along dashed-dotted lines F1-F2 and F3-F4 in FIG. 42A, respectively. Note that for simplification of the drawing, some components are not illustrated in the top view in FIG. 42A.

A transistor illustrated in FIGS. 42A to 42C includes a conductor 513 over a substrate 500; an insulator 503 that is over the substrate 500 and is level with the conductor 513; an insulator 502 over the conductor 513 and the insulator 503; a semiconductor 506a over the insulator 502; a semiconductor 506b over the semiconductor 506a; a conductor 516a and a conductor 516b which are arranged to be separated from each other while being in contact with the top surface of the semiconductor 506b; a semiconductor 506c over the insulator 502, the semiconductor 506b, the conductor 516a, and the conductor 516b; an insulator 512 over the semiconductor 506c; a conductor 504 over the insulator 512; and an insulator 508 over the conductor 504. Note that although the conductor 513 is part of the transistor in this non-limiting example, the conductor 513 may be a component independent of the transistor, for example. Furthermore, the transistor does not necessarily include the insulator 508. The transistor may include an insulator between the conductor 516a and the semiconductor 506c and/or between the conductor 516b and the semiconductor 506c. For the insulator, refer to the description of the insulator 410a or the insulator 410b.

For the substrate 500, refer to the description of the substrate 400; for the conductor 513, that of the conductor 413; for the insulator 502, that of the insulator 402; for the semiconductor 506a, that of the semiconductor 406a; for the semiconductor 506b, that of the semiconductor 406b; for the conductor 516a, that of the conductor 416a; for the conductor 516b, that of the conductor 416b; for the semiconductor 506c, that of the semiconductor 406c; for the insulator 512, that of the insulator 412; for the conductor 504, that of the conductor 404; for the insulator 508, that of the insulator 408.

The insulator 503 may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 503 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

As illustrated in FIG. 42C, the transistor has an s-channel structure. The electric field from the conductor 504 and the conductor 513 is less likely to be inhibited by the conductor 516a, the conductor 516b, and the like at the side surface of the semiconductor 506b.

Figure 43A:
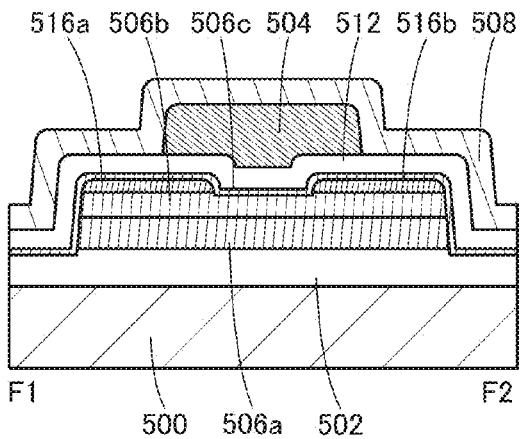
FIGS. 43A to 43F are cross-sectional views each illustrating a transistor of one embodiment of the present invention.
Figure 43B:
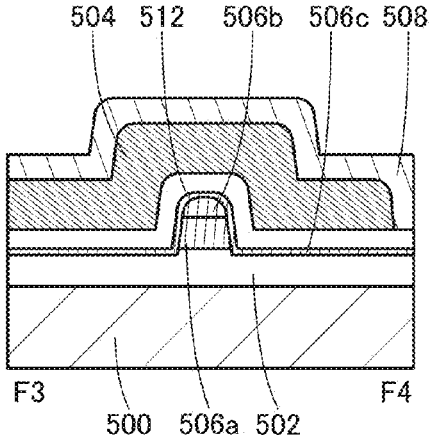
Figure 43C:
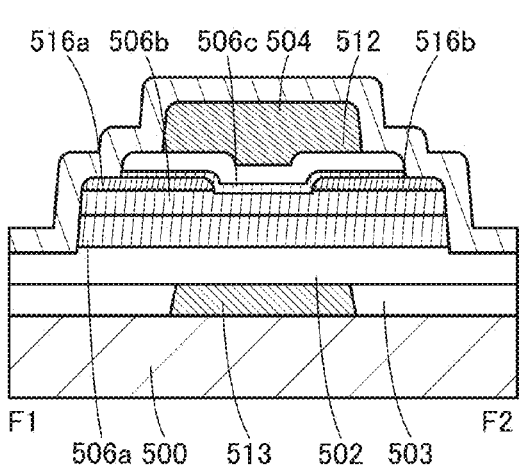
Figure 43D:
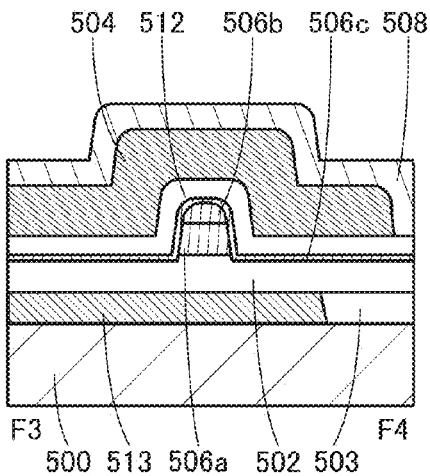
Figure 43E:
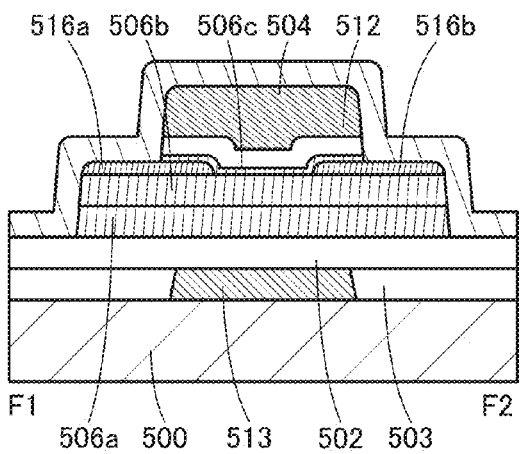
Figure 43F:
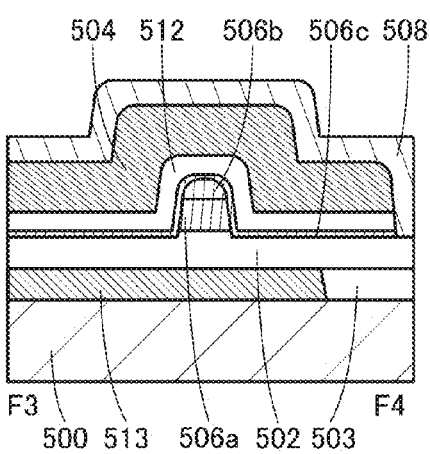
Figure 44A:
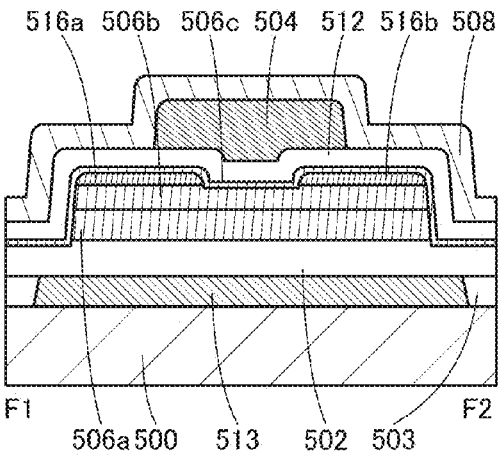
FIGS. 44A to 44F are cross-sectional views each illustrating a transistor of one embodiment of the present invention.
Figure 44B:
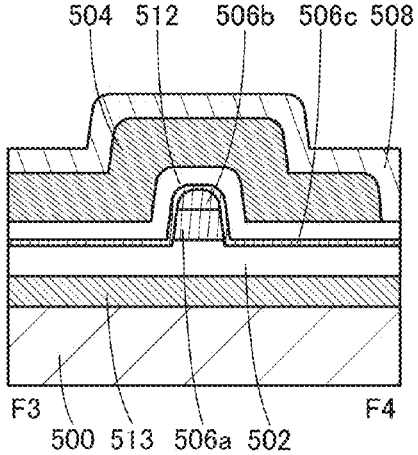
Figure 44C:
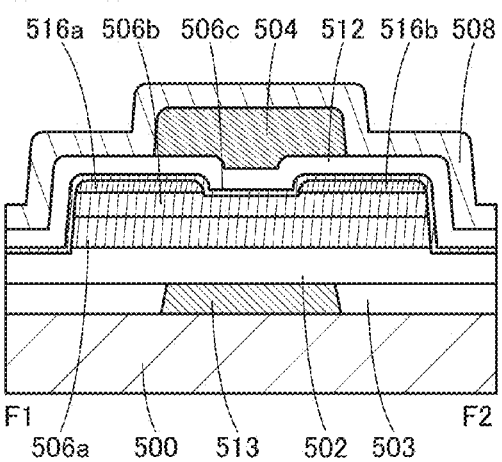
Figure 44D:
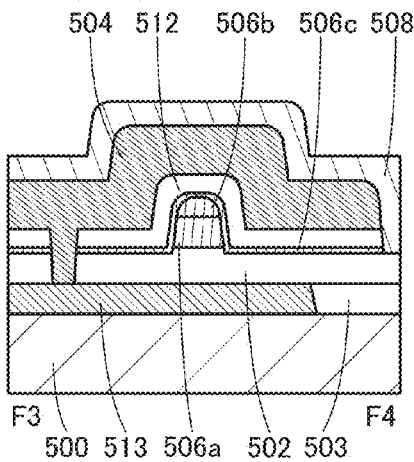
Figure 44E:
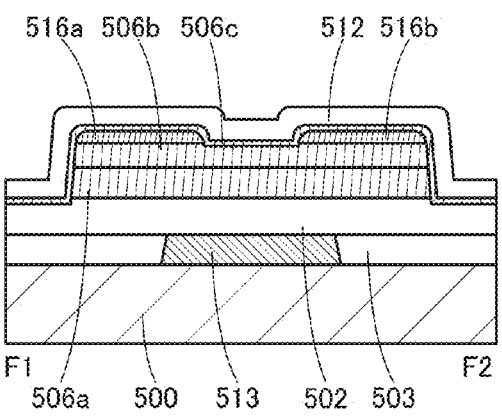
Figure 44F:
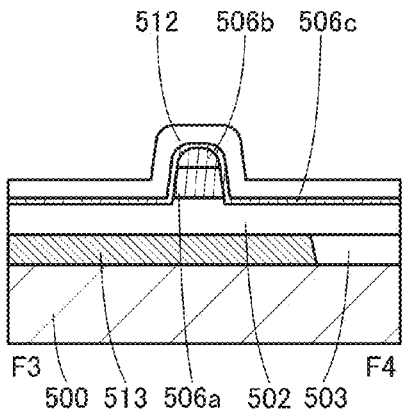

Note that the conductor 513 is not necessarily formed (see FIGS. 43A and 43B). A shape in which the insulator 512 and the semiconductor 506c protrude from the conductor 504 may be employed (see FIGS. 43C and 43D). A shape in which the insulator 512 and the semiconductor 506c do not necessarily protrude from the conductor 504 may be employed (see FIGS. 43E and 43F). In the F1-F2 cross section, the width of the conductor 513 may be larger than that of the semiconductor 506b (see FIGS. 44A and 44B). The conductor 513 may be in contact with the conductor 504 through an opening (see FIGS. 44C and 44D). The conductor 504 is not necessarily formed (see FIGS. 44E and 44F).

<Circuit>

An example of a circuit of the semiconductor device of one embodiment of the present invention will be described below.

<CMOS Inverter>

Figure 45A:
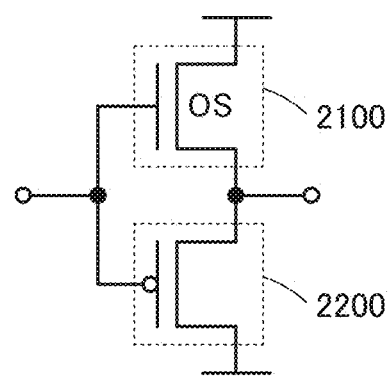
FIGS. 45A and 45B are circuit diagrams each illustrating a semiconductor device of one embodiment of the present invention.

A circuit diagram in FIG. 45A shows a configuration of what is called a CMOS inverter in which a p-channel transistor 2200 and an n-channel transistor 2100 are connected to each other in series and in which gates of them are connected to each other.

<Structure 1 of Semiconductor Device>

FIGS. 46A to 46C are cross-sectional views of the semiconductor device of FIG. 45A. The semiconductor device illustrated in FIGS. 46A to 46C includes the transistor 2200 and the transistor 2100. The transistor 2100 is placed above the transistor 2200. Although an example where the transistor illustrated in FIGS. 42A to 42C is used as the transistor 2100 is shown, the semiconductor device of one embodiment of the present invention is not limited thereto. For example, any of the transistors illustrated in FIGS. 38A to 38C, FIGS. 39A to 39F, FIGS. 40A to 40F, FIGS. 43A to 43F, FIGS. 44A to 44F, and the like can be used as the transistor 2100. Therefore, the description regarding the above-mentioned transistors is referred to for the transistor 2100 as appropriate. Note that FIGS. 46A to 46C are cross-sectional views of different portions.

The transistor 2200 illustrated in FIGS. 46A to 46C is a transistor using a semiconductor substrate 450. The transistor 2200 includes a region 472a in the semiconductor substrate 450, a region 472b in the semiconductor substrate 450, an insulator 462, and a conductor 454.

In the transistor 2200, the regions 472a and 472b have functions of a source region and a drain region. The insulator 462 has a function of a gate insulator. The conductor 454 has a function of a gate electrode. Thus, the resistance of a channel formation region can be controlled by a potential applied to the conductor 454. In other words, conduction or non-conduction between the region 472a and the region 472b can be controlled by the potential applied to the conductor 454.

For the semiconductor substrate 450, a single-material semiconductor substrate of silicon, germanium, or the like or a compound semiconductor substrate of silicon carbide, silicon germanium, gallium arsenide, indium phosphide, zinc oxide, gallium oxide, or the like may be used, for example. A single crystal silicon substrate is preferably used as the semiconductor substrate 450.

For the semiconductor substrate 450, a semiconductor substrate including impurities imparting n-type conductivity is used. However, a semiconductor substrate including impurities imparting p-type conductivity may be used as the semiconductor substrate 450. In that case, a well including impurities imparting the n-type conductivity may be provided in a region where the transistor 2200 is formed. Alternatively, the semiconductor substrate 450 may be an i-type semiconductor substrate.

The top surface of the semiconductor substrate 450 preferably has a (110) plane. Thus, on-state characteristics of the transistor 2200 can be improved.

The regions 472a and 472b are regions including impurities imparting the p-type conductivity. Accordingly, the transistor 2200 has a structure of a p-channel transistor.

Note that the transistor 2200 is apart from an adjacent transistor by a region 460 and the like. The region 460 is an insulating region.

The semiconductor device illustrated in FIGS. 46A to 46C includes an insulator 464, an insulator 466, an insulator 468, an insulator 422, a conductor 480a, a conductor 480b, a conductor 480c, a conductor 478a, a conductor 478b, a conductor 478c, a conductor 476a, a conductor 476b, a conductor 474a, a conductor 474b, a conductor 474c, a conductor 496a, a conductor 496b, a conductor 496c, a conductor 496d, a conductor 498a, a conductor 498b, a conductor 498c, an insulator 490, the insulator 502, an insulator 492, an insulator 428, an insulator 409, and an insulator 494.

The insulator 422, the insulator 428, and the insulator 409 have barrier properties. This means that the semiconductor device illustrated in FIGS. 46A to 46C has a structure in which the transistor 2100 is surrounded by insulators having barrier properties. Note that one or more of the insulator 422, the insulator 428, and the insulator 409 are not necessarily provided.

The insulator 464 is placed over the transistor 2200. The insulator 466 is placed over the insulator 464. The insulator 468 is placed over the insulator 466. The insulator 490 is placed over the insulator 468. The transistor 2100 is placed over the insulator 490. The insulator 492 is placed over the transistor 2100. The insulator 494 is placed over the insulator 492.

The insulator 464 includes an opening reaching the region 472a, an opening reaching the region 472b, and an opening reaching the conductor 454. In the openings, the conductor 480a, the conductor 480b, and the conductor 480c are embedded.

The insulator 466 includes an opening reaching the conductor 480a, an opening reaching the conductor 480b, and an opening reaching the conductor 480c. In the openings, the conductor 478a, the conductor 478b, and the conductor 478c are embedded.

The insulator 468 and the insulator 422 include an opening reaching the conductor 478b and an opening reaching the conductor 478c. In the openings, the conductor 476a and the conductor 476b are embedded.

The insulator 490 includes an opening overlapping a channel formation region of the transistor 2100, an opening reaching the conductor 476a, and an opening reaching the conductor 476b. In the openings, the conductor 474a, the conductor 474b, and the conductor 474c are embedded.

The conductor 474a may have a function of a gate electrode of the transistor 2100. The electrical characteristics of the transistor 2100, such as the threshold voltage, may be controlled by application of a predetermined potential to the conductor 474a, for example. The conductor 474a may be electrically connected to the conductor 404 having a function of the gate electrode of the transistor 2100, for example. In that case, on-state current of the transistor 2100 can be increased. Furthermore, a punch-through phenomenon can be suppressed; thus, the electrical characteristics of the transistor 2100 in a saturation region can be stable.

The insulator 409 and the insulator 492 include an opening reaching the conductor 474b through the conductor 516b that is one of a source electrode and a drain electrode of the transistor 2100, an opening reaching the conductor 516a that is the other of the source electrode and the drain electrode of the transistor 2100, an opening reaching the conductor 504 that is the gate electrode of the transistor 2100, and an opening reaching the conductor 474c. In the openings, the conductor 496a, the conductor 496b, the conductor 496c, and the conductor 496d are embedded. Note that in some cases, the openings are provided through any of components of the transistor 2100 or the like.

The insulator 494 includes an opening reaching the conductor 496a, an opening reaching the conductor 496b and the conductor 496d, and an opening reaching the conductor 496c. In the openings, the conductor 498a, the conductor 498b, and the conductor 498c are embedded.

The insulators 464, 466, 468, 490, 492, and 494 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 401 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

At least one of the insulators 464, 466, 468, 490, 492, and 494 preferably includes an insulator having a barrier property.

An insulator with a function of blocking oxygen and impurities such as hydrogen may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Each of the conductors 480a, 480b, 480c, 478a, 478b, 478c, 476a, 476b, 474a, 474b, 474c, 496a, 496b, 496c, 496d, 498a, 498b, and 498c may be formed to have, for example, a single-layer structure or a stacked-layer structure including a conductor containing one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used. At least one of the conductors 480a, 480b, 480c, 478a, 478b, 478c, 476a, 476b, 474a, 474b, 474c, 496a, 496b, 496c, 496d, 498a, 498b, and 498c preferably includes a conductor having a barrier property.

Figure 47A:
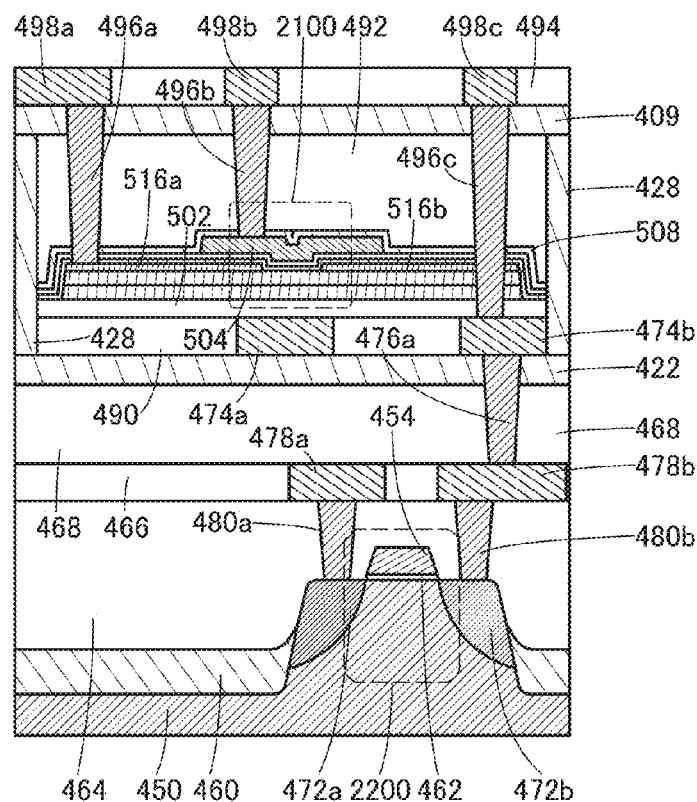
FIGS. 47A to 47C are cross-sectional views illustrating a semiconductor device of one embodiment of the present invention.
Figure 47B:
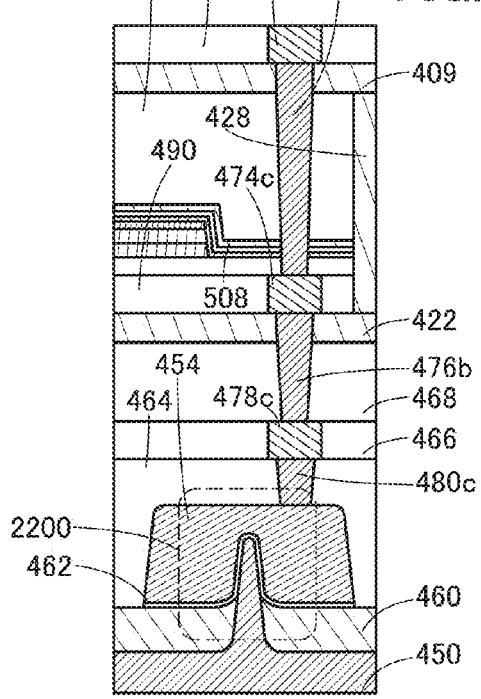
Figure 47C:
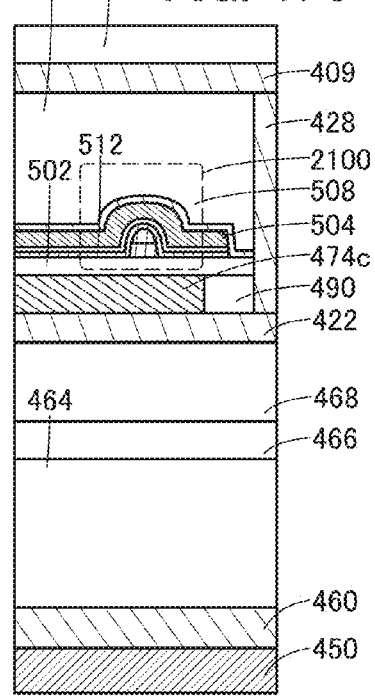

Note that a semiconductor device in FIGS. 47A to 47C is the same as the semiconductor device in FIGS. 46A to 46C except for the structure of the transistor 2200. Therefore, the description of the semiconductor device in FIGS. 46A to 46C is referred to for the semiconductor device in FIGS. 47A to 47C. In the semiconductor device in FIGS. 47A to 47C, the transistor 2200 is a FIN-type transistor. The effective channel width is increased in the FIN-type transistor 2200, whereby the on-state characteristics of the transistor 2200 can be improved. In addition, since contribution of the electric field of the gate electrode can be increased, the off-state characteristics of the transistor 2200 can be improved. Note that FIGS. 47A to 47C are cross-sectional views of different portions.

Note that a semiconductor device in FIGS. 48A to 48C is the same as the semiconductor device in FIGS. 46A to 46C except for the structure of the transistor 2200. Therefore, the description of the semiconductor device in FIGS. 46A to 46C is referred to for the semiconductor device in FIGS. 48A to 48C. Specifically, in the semiconductor device in FIGS. 48A to 48C, the transistor 2200 is formed using the semiconductor substrate 450, which is an SOI substrate. In the structure in FIGS. 48A to 48C, a region 456 is apart from the semiconductor substrate 450 with an insulator 452 provided therebetween. Since the SOI substrate is used as the semiconductor substrate 450, a punch-through phenomenon and the like can be suppressed; thus, the off-state characteristics of the transistor 2200 can be improved. Note that the insulator 452 can be formed by turning the semiconductor substrate 450 into an insulator. For example, silicon oxide can be used as the insulator 452. Note that FIGS. 48A to 48C are cross-sectional views of different portions.

In each of the semiconductor devices shown in FIGS. 46A to 46C, FIGS. 47A to 47C, and FIGS. 48A to 48C, a p-channel transistor is formed utilizing a semiconductor substrate, and an n-channel transistor is formed above that; therefore, an occupation area of the element can be reduced. That is, the integration degree of the semiconductor device can be improved. In addition, the manufacturing process can be simplified compared to the case where an n-channel transistor and a p-channel transistor are formed utilizing the same semiconductor substrate; therefore, the productivity of the semiconductor device can be increased. Moreover, the yield of the semiconductor device can be improved. For the p-channel transistor, some complicated steps such as formation of lightly doped drain (LDD) regions, formation of a shallow trench structure, or distortion design can be omitted in some cases. Therefore, the productivity and yield of the semiconductor device can be increased in some cases, compared to a semiconductor device where an n-channel transistor is formed utilizing the semiconductor substrate.

<CMOS Analog Switch>

Figure 45B:
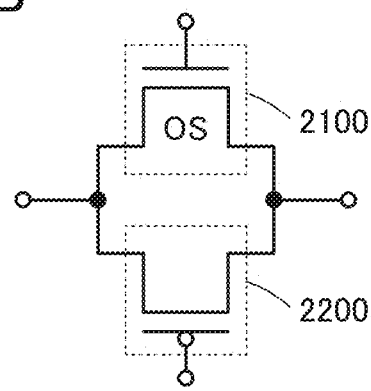

A circuit diagram in FIG. 45B shows a configuration in which sources of the transistors 2100 and 2200 are connected to each other and drains of the transistors 2100 and 2200 are connected to each other. With such a configuration, the transistors can function as what is called a CMOS analog switch.

<Memory Device 1>

Figure 49A:
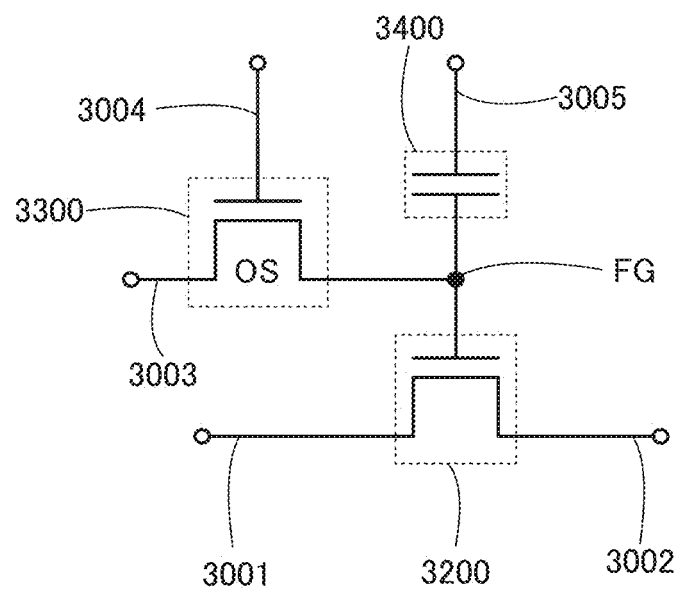
FIGS. 49A and 49B are circuit diagrams each illustrating a semiconductor device of one embodiment of the present invention.
Figure 49B:
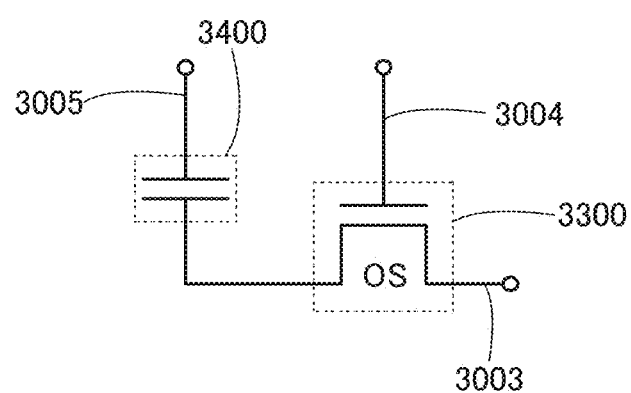

An example of a semiconductor device (memory device) which includes the transistor of one embodiment of the present invention, which can retain stored data even when not powered, and which has an unlimited number of write cycles is shown in FIGS. 49A and 49B.

The semiconductor device illustrated in FIG. 49A includes a transistor 3200 using a first semiconductor, a transistor 3300 using a second semiconductor, and a capacitor 3400. Note that any of the above-described transistors can be used as the transistor 3300.

Note that the transistor 3300 is preferably a transistor with a low off-state current. For example, a transistor using an oxide semiconductor can be used as the transistor 3300. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 49A, a first wiring 3001 is electrically connected to a source of the transistor 3200. A second wiring 3002 is electrically connected to a drain of the transistor 3200. A third wiring 3003 is electrically connected to one of the source and the drain of the transistor 3300. A fourth wiring 3004 is electrically connected to the gate of the transistor 3300. The gate of the transistor 3200 and the other of the source and the drain of the transistor 3300 are electrically connected to the one electrode of the capacitor 3400. A fifth wiring 3005 is electrically connected to the other electrode of the capacitor 3400.

The semiconductor device in FIG. 49A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined charge is supplied to the gate of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is off, so that the transistor 3300 is turned off. Thus, the charge is held at the node FG (retaining).

Since the off-state current of the transistor 3300 is low, the charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the node FG. This is because in the case of using an n-channel transistor as the transistor 3200, an apparent threshold voltage $V_{th\_H}$ at the time when the high-level charge is given to the gate of the transistor 3200 is lower than an apparent threshold voltage $V_{th\_L}$ at the time when the low-level charge is given to the gate of the transistor 3200. Here, an apparent threshold voltage refers to the potential of the fifth wiring 3005 which is needed to make the transistor 3200 be in an "on state." Thus, the potential of the fifth wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the fifth wiring 3005 is $V_0$ ($>V_{th\_H}$), the transistor 3200 is brought into an "on state." In the case where the low-level charge is supplied to the node FG in writing, even when the potential of the fifth wiring 3005 is $V_0$ ($<V_{th\_L}$), the transistor 3200 still remains in an "off state." Thus, the data retained in the node FG can be read by determining the potential of the second wiring 3002.

Note that in the case where memory cells are arrayed, it is necessary that data of a desired memory cell be read in read operation. A configuration in which only data of a desired memory cell can be read by supplying a potential at which the transistor 3200 is brought into an "off state" regardless of the charge supplied to the node FG, that is, a potential lower than $V_{th\_H}$ to the fifth wiring 3005 of memory cells from which data is not read may be employed. Alternatively, a configuration in which only data of a desired memory cell can be read by supplying a potential at which the transistor 3200 is brought into an "on state" regardless of the charge supplied to the node FG, that is, a potential higher than $V_{th\_L}$ to the fifth wiring 3005 of memory cells from which data is not read may be employed.

<Structure 2 of Semiconductor Device>

Figure 50A:
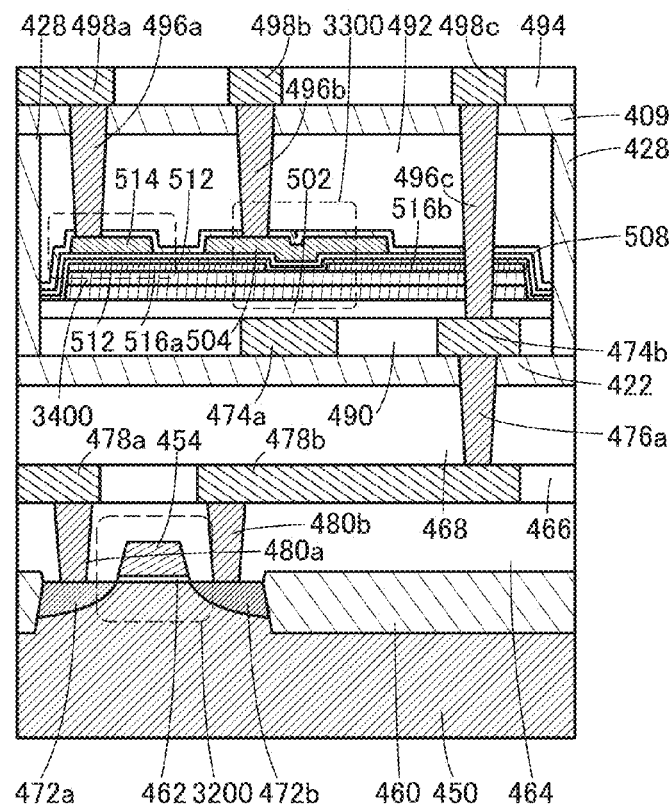
FIGS. 50A to 50C are cross-sectional views illustrating a semiconductor device of one embodiment of the present invention.
Figure 50B:
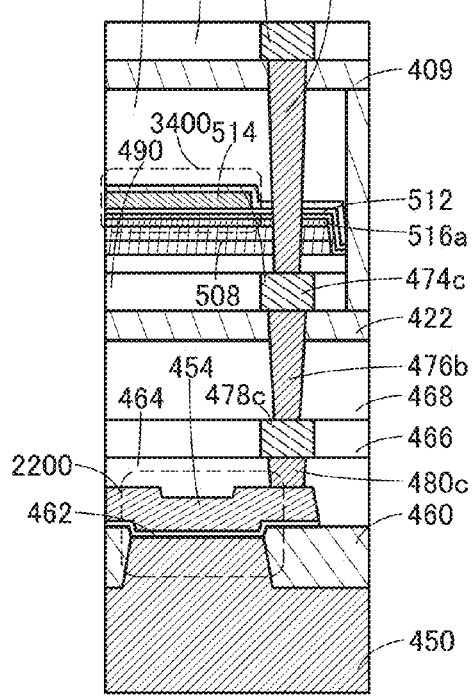
Figure 50C:
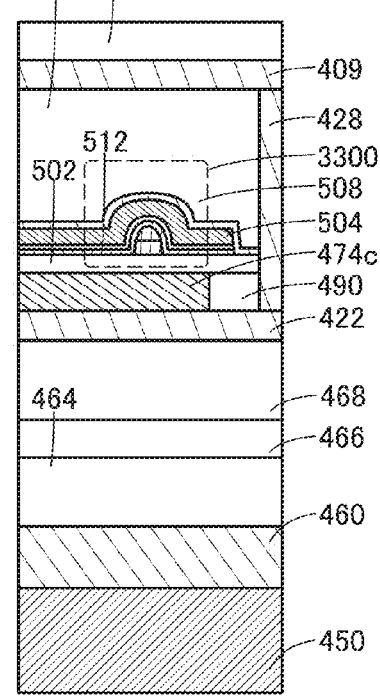

FIGS. 50A to 50C are cross-sectional views of the semiconductor device of FIG. 49A. The semiconductor device illustrated in FIGS. 50A to 50C includes the transistor 3200, the transistor 3300, and the capacitor 3400. The transistor 3300 and the capacitor 3400 are placed above the transistor 3200. Note that for the transistor 3300, refer to the description of the above transistor 2100. Furthermore, for the transistor 3200, refer to the description of the transistor 2200 in FIGS. 46A to 46C. Note that although the transistor 2200 is illustrated as a p-channel transistor in FIGS. 46A to 46C, the transistor 3200 may be an n-channel transistor. Note that FIGS. 50A to 50C are cross-sectional views of different portions.

The transistor 3200 illustrated in FIGS. 50A to 50C is a transistor using a semiconductor substrate 450. The transistor 3200 includes a region 472a in the semiconductor substrate 450, a region 472b in the semiconductor substrate 450, an insulator 462, and a conductor 454.

The semiconductor device FIGS. 50A to 50C includes the insulator 464, the insulator 466, the insulator 468, the insulator 422, the conductor 480a, the conductor 480b, the conductor 480c, the conductor 478a, the conductor 478b, the conductor 478c, the conductor 476a, the conductor 476b, the conductor 474a, the conductor 474b, the conductor 474c, the conductor 496a, the conductor 496b, the conductor 496c, the conductor 496d, the conductor 498a, the conductor 498b, the conductor 498c, a conductor 498d, the insulator 490, the insulator 502, the insulator 492, the insulator 428, the insulator 409, and the insulator 494.

The insulator 422, the insulator 428, and the insulator 409 have barrier properties. This means that the semiconductor device illustrated in FIGS. 50A to 50C has a structure in which the transistor 3300 is surrounded by insulators having barrier properties. Note that one or more of the insulator 422, the insulator 428, and the insulator 409 are not necessarily provided.

The insulator 464 is provided over the transistor 3200. The insulator 466 is provided over the insulator 464. The insulator 468 is provided over the insulator 466. The insulator 490 is provided over the insulator 468. The transistor 3300 is provided over the insulator 490. The insulator 492 is provided over the transistor 3300. The insulator 494 is provided over the insulator 492.

The insulator 464 has an opening reaching the region 472a, an opening reaching the region 472b, and an opening reaching the conductor 454. In the openings, the conductor 480a, the conductor 480b, and the conductor 480c are embedded.

The insulator 466 includes an opening reaching the conductor 480a, an opening reaching the conductor 480b, and an opening reaching the conductor 480c. In the openings, the conductor 478a, the conductor 478b, and the conductor 478c are embedded.

The insulator 468 and the insulator 422 include an opening reaching the conductor 478b and an opening reaching the conductor 478c. In the openings, the conductor 476a and the conductor 476b are embedded.

The insulator 490 includes an opening overlapping the channel formation region of the transistor 3300, an opening reaching the conductor 476a, and an opening reaching the conductor 476b. In the openings, the conductor 474a, the conductor 474b, and the conductor 474c are embedded.

The conductor 474a may have a function as a bottom gate electrode of the transistor 3300. Alternatively, for example, electric characteristics such as the threshold voltage of the transistor 3300 may be controlled by application of a predetermined potential to the conductor 474a. Further alternatively, for example, the conductor 474a and the conductor 404 that is the top gate electrode of the transistor 3300 may be electrically connected to each other. Thus, the on-state current of the transistor 3300 can be increased. A punch-through phenomenon can be suppressed; thus, stable electric characteristics in the saturation region of the transistor 3300 can be obtained.

The insulator 409 and the insulator 492 include an opening reaching the conductor 474b through the conductor 516b that is one of a source electrode and a drain electrode of the transistor 3300, an opening reaching a conductor 514 that overlaps with the conductor 516a that is the other of the source electrode and the drain electrode of the transistor 3300, with the insulator 512 positioned therebetween, an opening reaching the conductor 504 that is the gate electrode of the transistor 3300, and an opening reaching the conductor 474c through the conductor 516a that is the other of the source electrode and the drain electrode of the transistor 3300. In the openings, the conductor 496a, the conductor 496b, the conductor 496c, and the conductor 496d are embedded. Note that in some cases, a component of the transistor 3300 or the like is through other components.

The insulator 494 includes an opening reaching the conductor 496a, an opening reaching the conductor 496b, an opening reaching the conductor 496c, and an opening reaching the conductor 496d. In the openings, the conductors 498a, 498b, 498c, and 498d are embedded.

At least one of the insulators 464, 466, 468, 490, 492, and 494 preferably includes an insulator having a barrier property.

The conductor 498d may be formed to have a single-layer structure or a stacked-layer structure including a conductor containing, for example, one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used. Each of the conductors 498a, 498b, 498c, and 498d preferably includes a conductor having a barrier property.

The source or drain of the transistor 3200 is electrically connected to the conductor 516b that is one of a source electrode and a drain electrode of the transistor 3300 through the conductor 480b, the conductor 478b, the conductor 476a, the conductor 474b, and the conductor 496c. The conductor 454 that is the gate electrode of the transistor 3200 is electrically connected to the conductor 516a that is the other of the source electrode and the drain electrode of the transistor 3300 through the conductor 480c, the conductor 478c, the conductor 476b, the conductor 474c, and the conductor 496d.

The capacitor 3400 includes an electrode electrically connected to the other of the source electrode and the drain electrode of the transistor 3300, the conductor 514, and the insulator 512. The insulator 512 included in the capacitor 3400 has and can be formed in the same step as a region serving as a gate insulator of the transistor 3300. Thus, productivity can be preferably increased in some cases. When a layer formed by the same step as the conductor 504 serving as a gate electrode of the transistor 3300 is used as the conductor 514, productivity can be preferably increased in some cases.

For the structures of other components, the description of FIGS. 46A to 46C and the like can be referred to as appropriate.

Figure 51A:
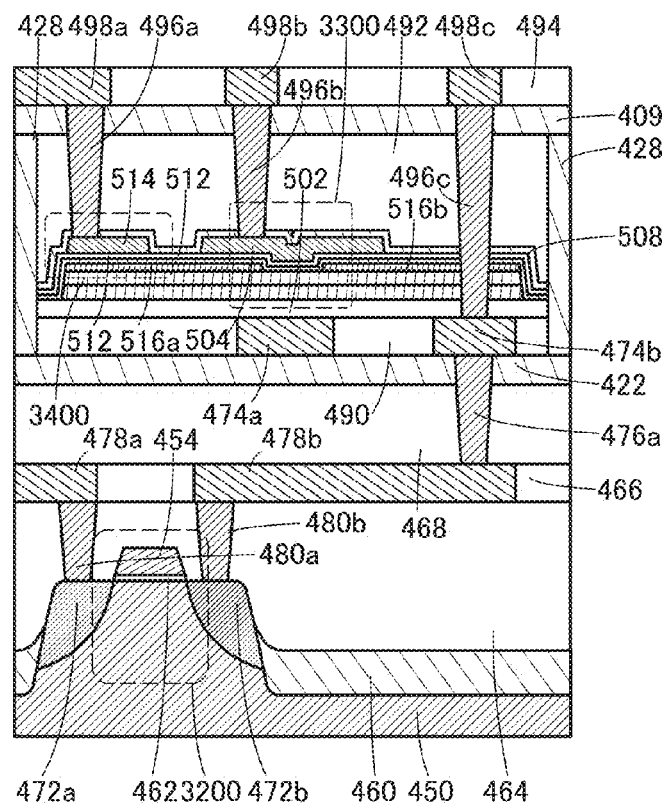
FIGS. 51A to 51C are cross-sectional views illustrating a semiconductor device of one embodiment of the present invention.
Figure 51B:
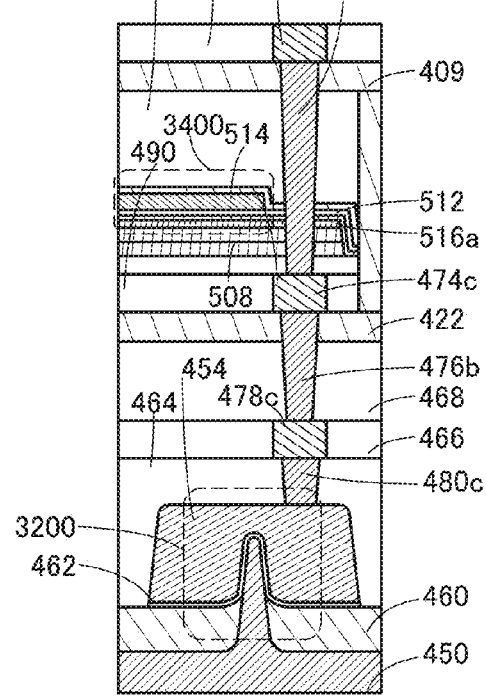
Figure 51C:
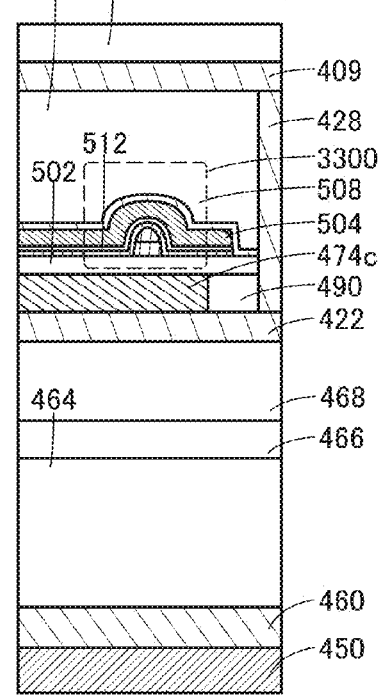

A semiconductor device in FIGS. 51A to 51C is the same as the semiconductor device in FIGS. 50A to 50C except for the structure of the transistor 3200. Therefore, the description of the semiconductor device in FIGS. 50A to 50C is referred to for the semiconductor device in FIGS. 51A to 51C. Specifically, in the semiconductor device in FIGS. 51A to 51C, the transistor 3200 is a FIN-type transistor. For the FIN-type transistor 3200, refer to the description of the transistor 2200 in FIGS. 47A to 47C. Note that although the transistor 2200 is illustrated as a p-channel transistor in FIGS. 47A to 47C, the transistor 3200 may be an n-channel transistor. Note that FIGS. 51A to 51C are cross-sectional views of different portions.

Figure 52A:
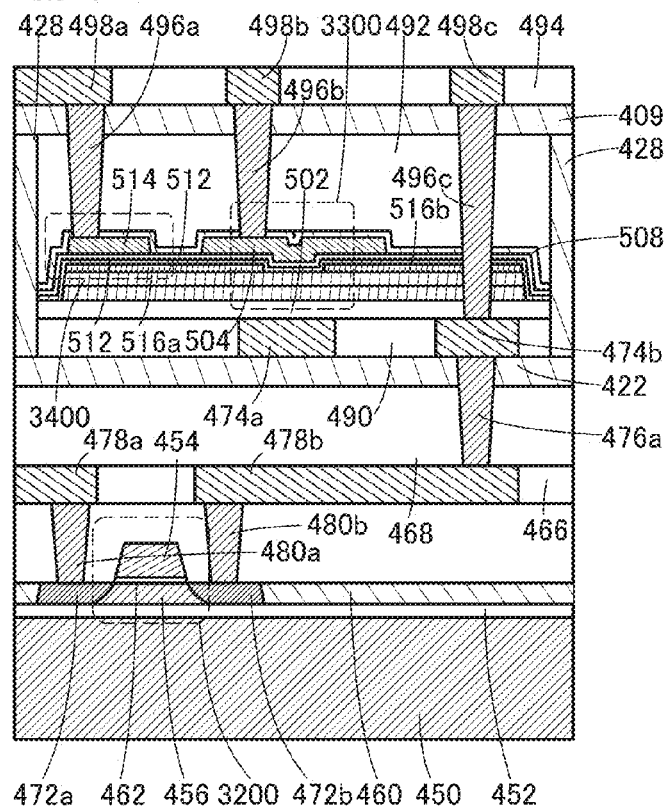
FIGS. 52A to 52C are cross-sectional views illustrating a semiconductor device of one embodiment of the present invention.
Figure 52B:
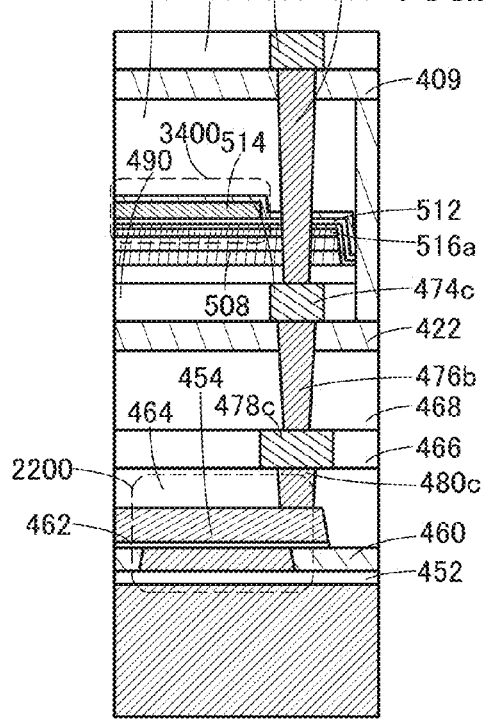
Figure 52C:
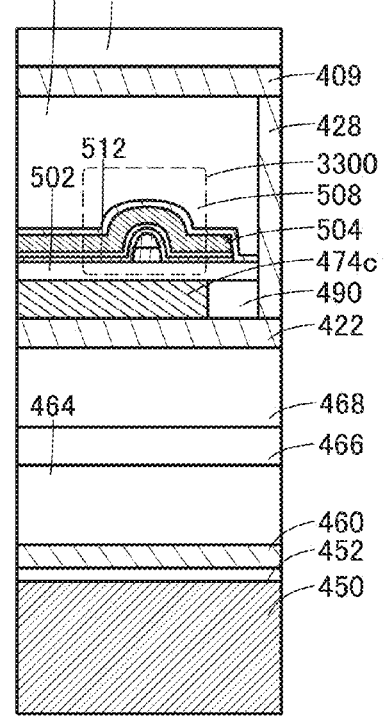

A semiconductor device in FIGS. 52A to 52C is the same as the semiconductor device in FIGS. 50A to 50C except for the structure of the transistor 3200. Therefore, the description of the semiconductor device in FIGS. 50A to 50C is referred to for the semiconductor device in FIGS. 52A to 52C. Specifically, in the semiconductor device in FIGS. 52A to 52C, the transistor 3200 is provided in the semiconductor substrate 450 that is an SOI substrate. For the transistor 3200, which is provided in the semiconductor substrate 450 that is an SOI substrate, refer to the description of the transistor 2200 in FIGS. 48A to 48C. Note that although the transistor 2200 is illustrated as a p-channel transistor in FIGS. 48A to 48C, the transistor 3200 may be an n-channel transistor. Note that FIGS. 52A to 52C are cross-sectional views of different portions.

<Memory Device 2>

The semiconductor device in FIG. 49B is different from the semiconductor device in FIG. 49A in that the transistor 3200 is not provided. Also in this case, data can be written and retained in a manner similar to that of the semiconductor device in FIG. 49A.

Reading of data in the semiconductor device in FIG. 49B is described. When the transistor 3300 is brought into an on state, the third wiring 3003 which is in a floating state and the capacitor 3400 are brought into conduction, and the charge is redistributed between the third wiring 3003 and the capacitor 3400. As a result, the potential of the third wiring 3003 is changed. The amount of change in the potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having a low off-state current, the semiconductor device described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

<Imaging Device>

An imaging device of one embodiment of the present invention will be described below.

FIG. 53A is a plan view illustrating an example of an imaging device 2000 of one embodiment of the present invention. The imaging device 2000 includes a pixel portion 2010 and peripheral circuits for driving the pixel portion 2010 (a peripheral circuit 2060, a peripheral circuit 2070, a peripheral circuit 2080, and a peripheral circuit 2090). The pixel portion 2010 includes a plurality of pixels 2011 arranged in a matrix with p rows and q columns (p and q are each a natural number greater than or equal to 2). The peripheral circuit 2060, the peripheral circuit 2070, the peripheral circuit 2080, and the peripheral circuit 2090 are each connected to the plurality of pixels 2011 and each have a function of supplying a signal for driving the plurality of pixels 2011. In this specification and the like, in some cases, a "peripheral circuit" or a "driver circuit" indicates all of the peripheral circuits 2060, 2070, 2080, and 2090. For example, the peripheral circuit 2060 can be regarded as part of the peripheral circuit.

The imaging device 2000 preferably includes a light source 2091. The light source 2091 can emit detection light P1.

The peripheral circuit includes at least one of a logic circuit, a switch, a buffer, an amplifier circuit, and a converter circuit. The peripheral circuit may be formed over a substrate where the pixel portion 2010 is formed. Alternatively, a semiconductor device such as an IC chip may be used as part or the whole of the peripheral circuit. Note that as the peripheral circuit, one or more of the peripheral circuits 2060, 2070, 2080, and 2090 may be omitted.

As illustrated in FIG. 53B, the pixels 2011 may be obliquely arranged in the pixel portion 2010 in the imaging device 2000. When the pixels 2011 are obliquely arranged, the distance between pixels (pitch) can be shortened in the row direction and the column direction. Accordingly, the quality of an image taken by the imaging device 2000 can be improved.

Configuration Example 1 of Pixel

Each of the pixels 2011 included in the imaging device 2000 is formed with a plurality of subpixels 2012, and each subpixel 2012 is combined with a filter (color filter) which transmits light with a specific wavelength band, whereby data for achieving color image display can be obtained.

Figure 54A:
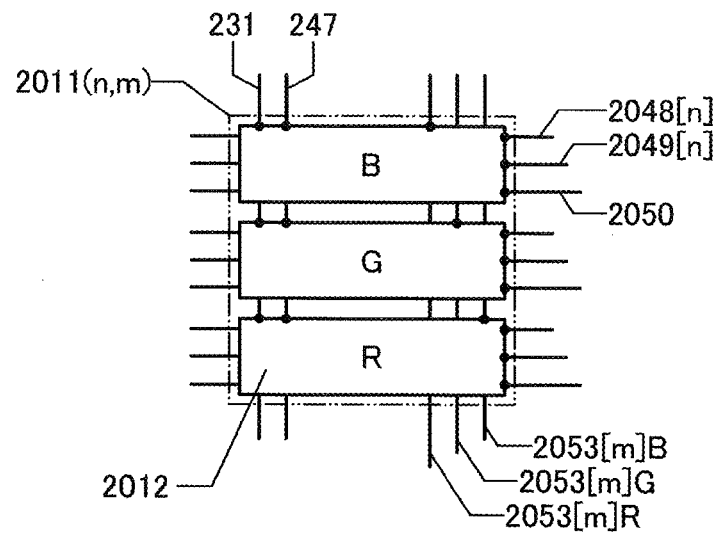
FIGS. 54A and 54B are block diagrams each illustrating a semiconductor device of one embodiment of the present invention.

FIG. 54A is a plan view illustrating an example of the pixel 2011 with which a color image is obtained. The pixel 2011 illustrated in FIG. 54A includes the subpixel 2012 provided with a color filter transmitting light with a red (R) wavelength band (also referred to as a "subpixel 2012R"), the subpixel 2012 provided with a color filter transmitting light with a green (G) wavelength band (also referred to as a "subpixel 2012G"), and the subpixel 2012 provided with a color filter transmitting light with a blue (B) wavelength band (also referred to as a "subpixel 2012B"). The subpixels 2012 can function as photosensors.

Each of the subpixels 2012 (the subpixel 2012R, the subpixel 2012G, and the subpixel 2012B) is electrically connected to a wiring 2031, a wiring 2047, a wiring 2048, a wiring 2049, and a wiring 2050. In addition, the subpixel 2012R, the subpixel 2012G, and the subpixel 2012B are connected to respective wirings 2053 which are independent from one another. In this specification and the like, for example, the wiring 2048 and the wiring 2049 that are connected to the pixels 2011 in an n-th row are referred to as a wiring 2048[n] and a wiring 2049[n], respectively. Furthermore, for example, the wiring 2053 connected to the pixels 2011 in an m-th column is referred to as a wiring 2053[m]. Note that in FIG. 54A, the wirings 2053 connected to the subpixel 2012R, the subpixel 2012G, and the subpixel 2012B in the pixel 2011 in the m-th column are referred to as a wiring 2053[m]R, a wiring 2053[m]G, and a wiring 2053[m]B, respectively. The subpixels 2012 are electrically connected to the peripheral circuits through the above wirings.

Figure 54B:
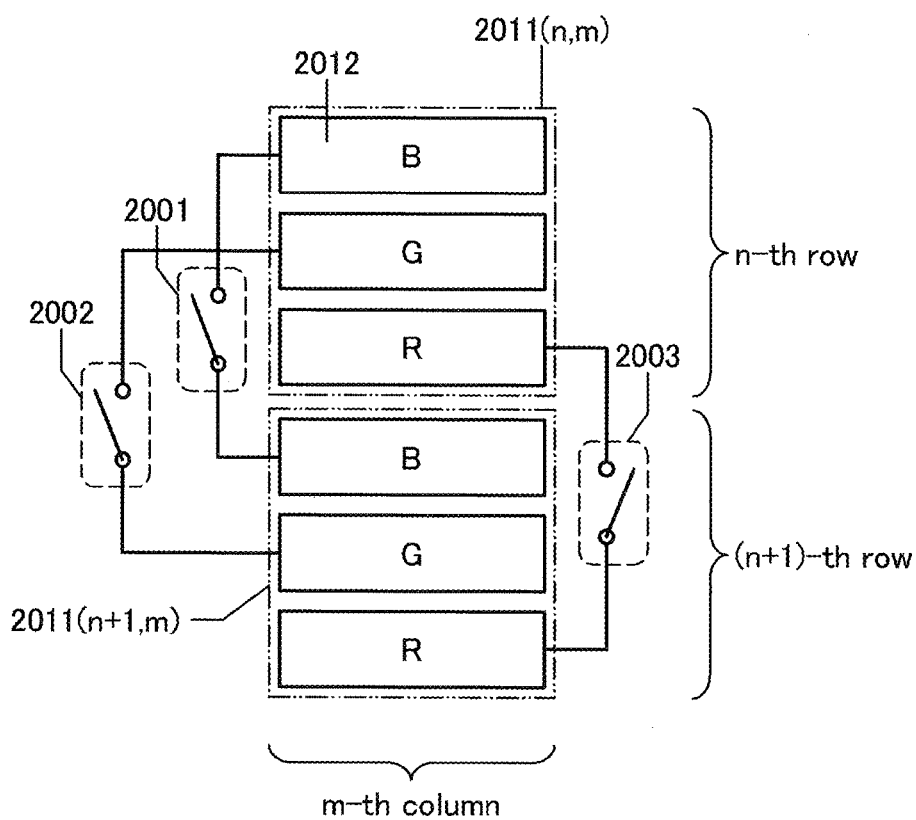

In the imaging device 2000, the subpixel 2012 is electrically connected to the subpixel 2012, which is in an adjacent pixel 2011 and is provided with a color filter transmitting light with the same wavelength band, via a switch. FIG. 54B illustrates a connection example of the subpixels 2012: the subpixel 2012 in the pixel 2011 arranged in the n-th (n is an integer greater than or equal to 1 and less than or equal to p) row and the m-th (m is an integer greater than or equal to 1 and less than or equal to q) column and the subpixel 2012 in the adjacent pixel 2011 arranged in an (n+1)-th row and the m-th column. In FIG. 54B, the subpixel 2012R arranged in the n-th row and the m-th column and the subpixel 2012R arranged in the (n+1)-th row and the m-th column are connected to each other via a switch 2001. The subpixel 2012G arranged in the n-th row and the m-th column and the subpixel 2012G arranged in the (n+1)-th row and the m-th column are connected to each other via a switch 2002. The subpixel 2012B arranged in the n-th row and the m-th column and the subpixel 2012B arranged in the (n+1)-th row and the m-th column are connected to each other via a switch 2003.

The color filters used in the subpixels 2012 are not limited to red (R), green (G), and blue (B) color filters, and color filters that transmit light of cyan (C), yellow (Y), and magenta (M) may be used. By provision of the subpixels 2012 that sense light with three different wavelength bands in one pixel 2011, a full-color image can be obtained.

The pixel 2011 including the subpixel 2012 provided with a color filter transmitting yellow (Y) light may be provided, in addition to the subpixels 2012 provided with the color filters transmitting red (R), green (G), and blue (B) light. The pixel 2011 including the subpixel 2012 provided with a color filter transmitting blue (B) light may be provided, in addition to the subpixels 2012 provided with color filters transmitting cyan (C), yellow (Y), and magenta (M) light. When the subpixels 2012 sensing light with four different wavelength bands are provided in one pixel 2011, the reproducibility of colors of an obtained image can be increased.

For example, in FIG. 54A, in regard to the subpixel 2012 sensing a red wavelength band, the subpixel 2012 sensing a green wavelength band, and the subpixel 2012 sensing a blue wavelength band, the pixel number ratio (or the light receiving area ratio) thereof is not necessarily 1:1:1. For example, the Bayer arrangement in which the pixel number ratio (the light receiving area ratio) of red and green to blue is 1:2:1 may be employed. Alternatively, the pixel number ratio (the light receiving area ratio) of red and green to blue may be 1:6:1.

Although the number of subpixels 2012 provided in the pixel 2011 may be one, two or more subpixels are preferably provided. For example, when two or more subpixels 2012 sensing the same wavelength band are provided, the redundancy is increased, and the reliability of the imaging device 2000 can be increased.

When an infrared (IR) filter that transmits infrared light and absorbs or reflects visible light is used as the filter, the imaging device 2000 that senses infrared light can be achieved.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 2011 may be provided with a lens. Arrangement examples of the pixel 2011, filters 2054, and a lens 2055 are described with cross-sectional views in FIGS. 55A and 55B. With the lens 2055, the photoelectric conversion element can efficiently receive incident light. Specifically, as illustrated in FIG. 55A, light 2056 enters a photoelectric conversion element 2020 through the lens 2055, the filters 2054 (a filter 2054R, a filter 2054G, and a filter 2054B), a pixel circuit 2030, and the like which are provided in the pixel 2011.

However, as illustrated in a region surrounded by a two-dot chain line, part of the light 2056 indicated by arrows might be blocked by part of a wiring 2057. Thus, a preferred structure is such that the lens 2055 and the filters 2054 are provided on the photoelectric conversion element 2020 side, so that the photoelectric conversion element 2020 can efficiently receive the light 2056 as illustrated in FIG. 55B. When the light 2056 is incident on the photoelectric conversion element 2020 through the photoelectric conversion element 2020, the imaging device 2000 with high sensitivity can be provided.

Figure 55A:
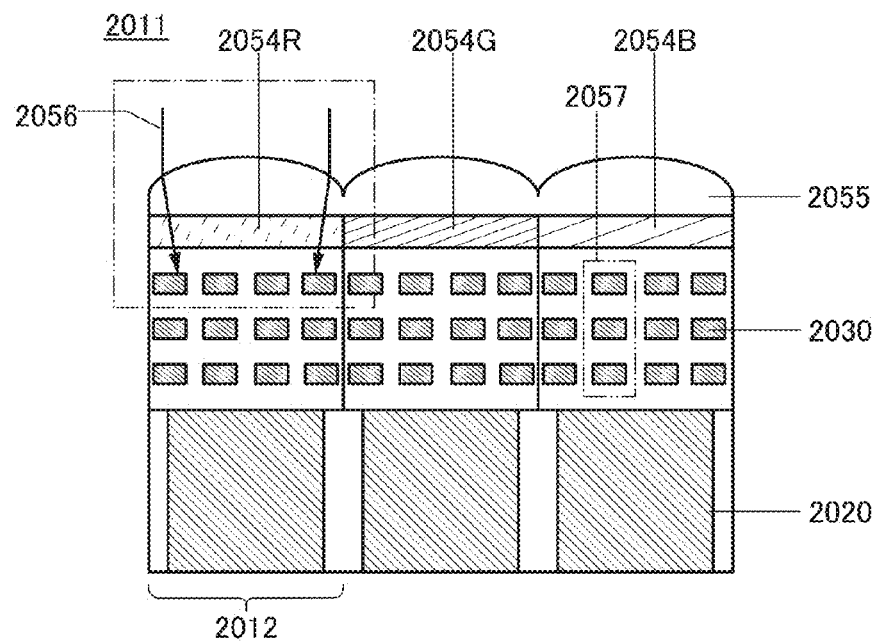
FIGS. 55A and 55B are cross-sectional views each illustrating a semiconductor device of one embodiment of the present invention.
Figure 55B:
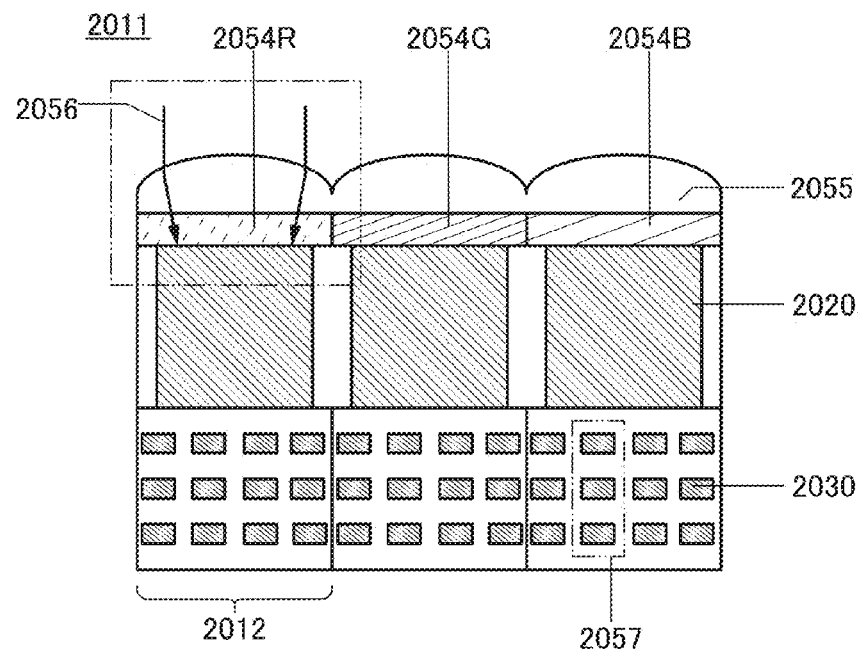

As each of the photoelectric conversion elements 2020 illustrated in FIGS. 55A and 55B, a photoelectric conversion element in which a p-n junction or a p-i-n junction is formed may be used.

The photoelectric conversion element 2020 may be formed using a substance that has a function of absorbing a radiation and generating electric charges. Examples of the substance that has a function of absorbing radiation and generating electric charges include selenium, lead iodide, mercury iodide, gallium arsenide, cadmium telluride, and a cadmium zinc alloy.

The use of selenium for the photoelectric conversion element 2020 enables the photoelectric conversion element 2020 to have a light absorption coefficient over a wide wavelength range including X-rays and gamma rays in addition to visible light, ultraviolet light, and infrared rays, for example.

One pixel 2011 included in the imaging device 2000 may include the subpixel 2012 with a first filter, in addition to the subpixels 2012 illustrated in FIGS. 54A and 54B.

Configuration Example 2 of Pixel

An example of a pixel including a transistor using silicon and a transistor using an oxide semiconductor is described below.

Figure 56A:
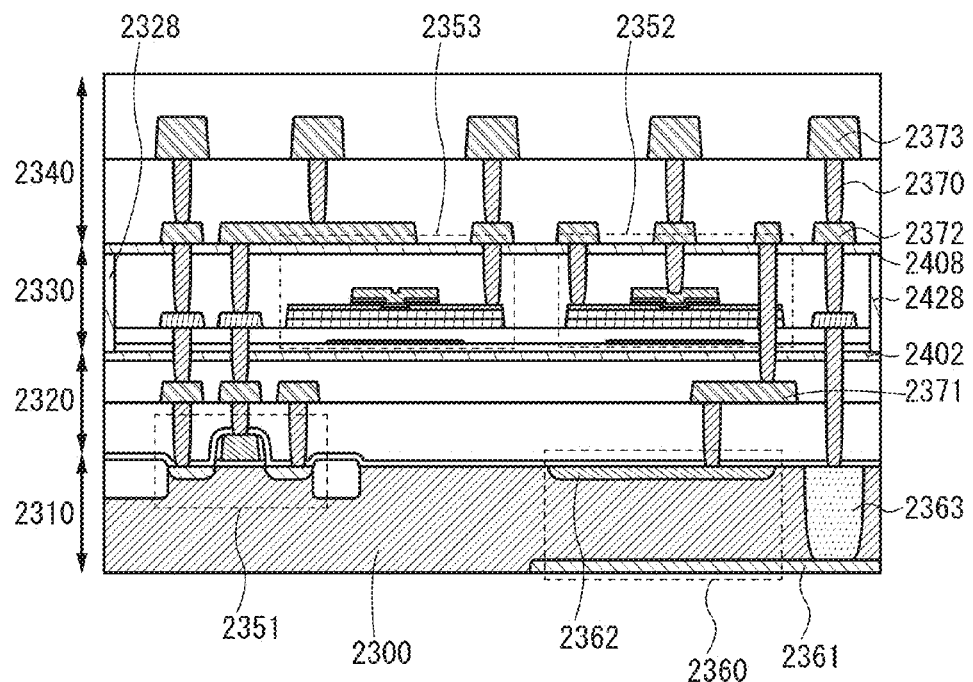
FIGS. 56A and 56B are cross-sectional views each illustrating a semiconductor device of one embodiment of the present invention.
Figure 56B:
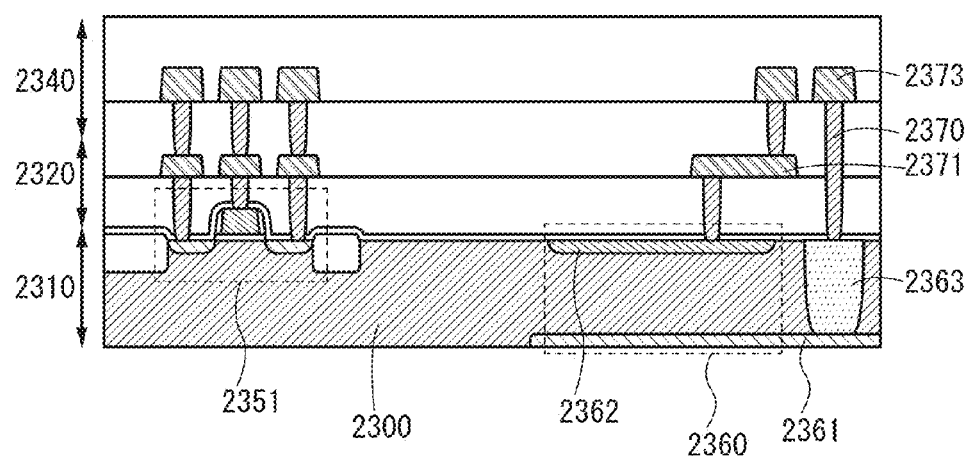

FIGS. 56A and 56B are each a cross-sectional view of an element included in an imaging device. The imaging device illustrated in FIG. 56A includes a transistor 2351 including silicon over a silicon substrate 2300, transistors 2352 and 2353 which include an oxide semiconductor and are stacked over the transistor 2351, and a photodiode 2360 provided in a silicon substrate 2300. The transistors and the photodiode 2360 are electrically connected to various plugs 2370 and wirings 2371. In addition, an anode 2361 of the photodiode 2360 is electrically connected to the plug 2370 through a low-resistance region 2363.

The imaging device includes a layer 2310 including the transistor 2351 provided on the silicon substrate 2300 and the photodiode 2360 provided in the silicon substrate 2300, a layer 2320 which is in contact with the layer 2310 and includes the wirings 2371, a layer 2330 which is in contact with the layer 2320 and includes the transistors 2352 and 2353, and a layer 2340 which is in contact with the layer 2330 and includes a wiring 2372 and a wiring 2373.

In the example of cross-sectional view in FIG. 56A, a light-receiving surface of the photodiode 2360 is provided on the side opposite to a surface of the silicon substrate 2300 where the transistor 2351 is formed. With this structure, a light path can be secured without an influence of the transistors and the wirings. Thus, a pixel with a high aperture ratio can be formed. Note that the light-receiving surface of the photodiode 2360 can be the same as the surface where the transistor 2351 is formed.

In the case where a pixel is formed with use of only transistors using an oxide semiconductor, the layer 2310 may include the transistor using an oxide semiconductor. Alternatively, the layer 2310 may be omitted, and the pixel may include only transistors using an oxide semiconductor.

In the case where a pixel is formed with use of only transistors using silicon, the layer 2330 may be omitted. An example of a cross-sectional view in which the layer 2330 is not provided is shown in FIG. 56B.

Note that the silicon substrate 2300 may be an SOI substrate. Furthermore, the silicon substrate 2300 can be replaced with a substrate made of germanium, silicon germanium, silicon carbide, gallium arsenide, aluminum gallium arsenide, indium phosphide, gallium nitride, or an organic semiconductor.

Here, an insulator 2422 is provided between the layer 2310 including the transistor 2351 and the photodiode 2360 and the layer 2330 including the transistors 2352 and 2353. However, there is no limitation on the position of the insulator 2422.

Hydrogen in an insulator provided in the vicinity of a channel formation region of the transistor 2351 terminates dangling bonds of silicon and thus can improve the reliability of the transistor 2351. In contrast, hydrogen in an insulator provided in the vicinity of the transistor 2352, the transistor 2353, and the like becomes one of factors generating a carrier in the oxide semiconductor and thus may cause a reduction of the reliability of the transistor 2352, the transistor 2353, and the like. For this reason, in the case where the transistor using an oxide semiconductor is provided over the transistor using silicon, it is preferable that the insulator 2422 having a barrier property be provided between the transistors. Each of the transistor 2352 and the transistor 2353 is preferably surrounded by an insulator 2418 having a barrier property in all directions. In addition, an insulator 2409 having a barrier property is preferably provided over the transistor 2352 and the transistor 2353 to cover the transistors. When the hydrogen is confined below the insulator 2422, the reliability of the transistor 2351 can be improved. In addition, the hydrogen can be prevented from being diffused from a part below the insulator 2422 to a part above the insulator 2422; thus, the reliability of the transistor 2352, the transistor 2353, and the like can be improved.

The semiconductor device illustrated in FIGS. 56A and 56B has a structure in which the transistor 2352 and the transistor 2353 are surrounded by insulators having barrier properties. Note that the transistor 2352 and the transistor 2353 are not necessarily surrounded by insulators having barrier properties.

In the cross-sectional view in FIG. 56A, the photodiode 2360 in the layer 2310 and the transistor in the layer 2330 can be formed so as to overlap with each other. Thus, the degree of integration of pixels can be increased. In other words, the resolution of the imaging device can be increased.

Figure 57A:
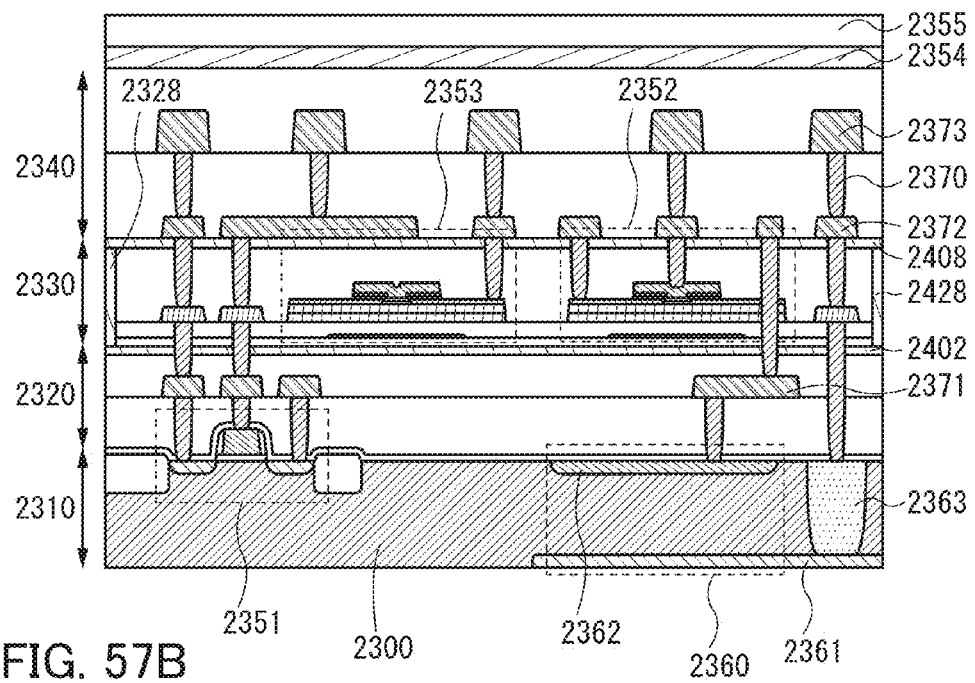
FIGS. 57A and 57B are cross-sectional views each illustrating a semiconductor device of one embodiment of the present invention.
Figure 57B:
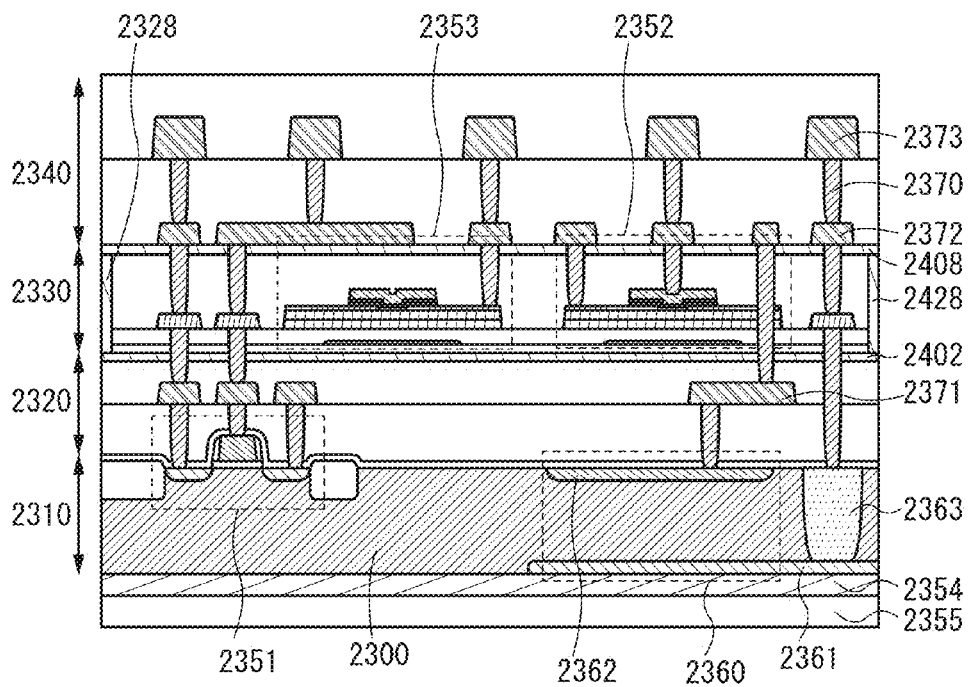

A filter 2354 and/or a lens 2355 may be provided over or under the pixel as shown in FIGS. 57A and 57B. For the filter 2354, refer to the description of the filter 2054. For the lens 2355, refer to for the description of the lens 2055.

As illustrated in FIG. 58A1 and FIG. 58B1, part or the whole of the imaging device can be bent. FIG. 58A1 illustrates a state in which the imaging device is bent in the direction of a dashed-dotted line X1-X2. FIG. 58A2 is a cross-sectional view illustrating a portion indicated by the dashed-dotted line X1-X2 in FIG. 58A1. FIG. 58A3 is a cross-sectional view illustrating a portion indicated by a dashed-dotted line Y1-Y2 in FIG. 58A1.

FIG. 58B1 illustrates a state where the imaging device is bent in the direction of a dashed-dotted line X3-X4 and the direction of a dashed-dotted line Y3-Y4. FIG. 58B2 is a cross-sectional view illustrating a portion indicated by the dashed-dotted line X3-X4 in FIG. 58B1. FIG. 58B3 is a cross-sectional view illustrating a portion indicated by the dashed-dotted line Y3-Y4 in FIG. 58B1.

The bent imaging device enables the curvature of field and astigmatism to be reduced. Thus, the optical design of lens and the like, which is used in combination of the imaging device, can be facilitated. For example, the number of lens used for aberration correction can be reduced; accordingly, a reduction of size or weight of electronic devices using the imaging device, and the like, can be achieved. In addition, the quality of a captured image can be improved.

<CPU>

A CPU including a semiconductor device such as any of the above-described transistors or the above-described memory device is described below.

Figure 59:
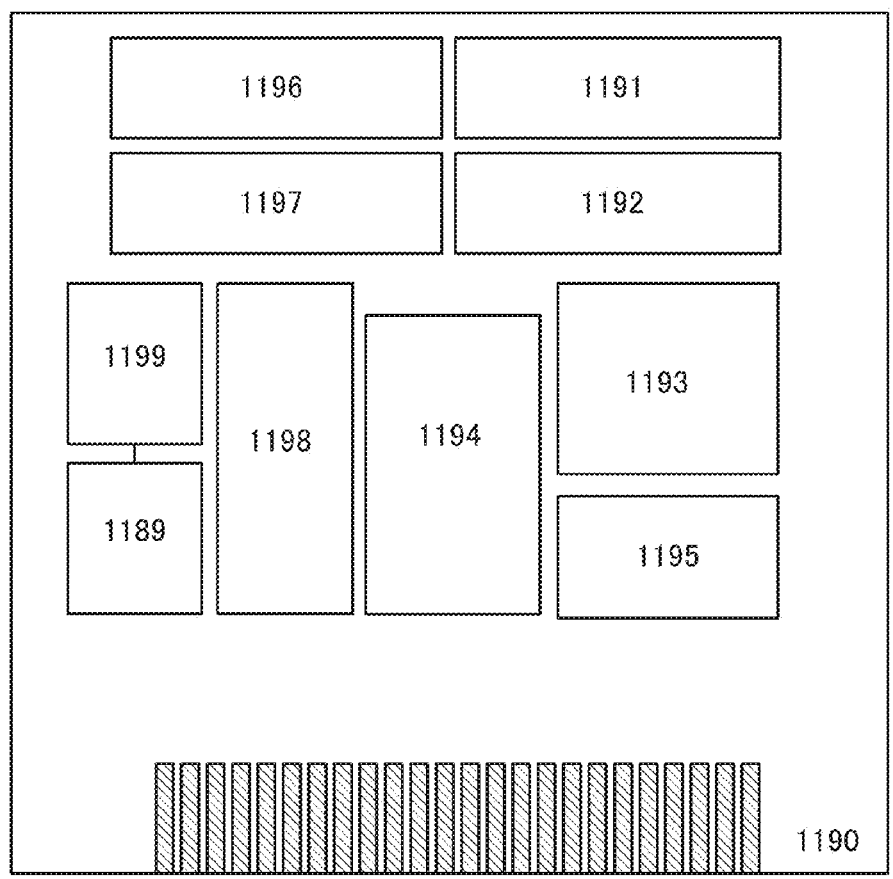
FIG. 59 is a block diagram illustrating a semiconductor device of one embodiment of the present invention.

FIG. 59 is a block diagram illustrating a configuration example of a CPU including any of the above-described transistors as a component.

The CPU illustrated in FIG. 59 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 59 is just an example in which the configuration has been simplified, and an actual CPU may have a variety of configurations depending on the application. For example, the CPU may have the following configuration: a structure including the CPU illustrated in FIG. 59 or an arithmetic circuit is considered as one core; a plurality of such cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 59, a memory cell is provided in the register 1196. For the memory cell of the register 1196, any of the above-described transistors, the above-described memory device, or the like can be used.

In the CPU illustrated in FIG. 59, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retention by the flip-flop is selected, a power supply voltage is supplied to the memory cell in the register 1196. When data retention by the capacitor is selected, the data is rewritten in the capacitor, and supply of a power supply voltage to the memory cell in the register 1196 can be stopped.

Figure 60:
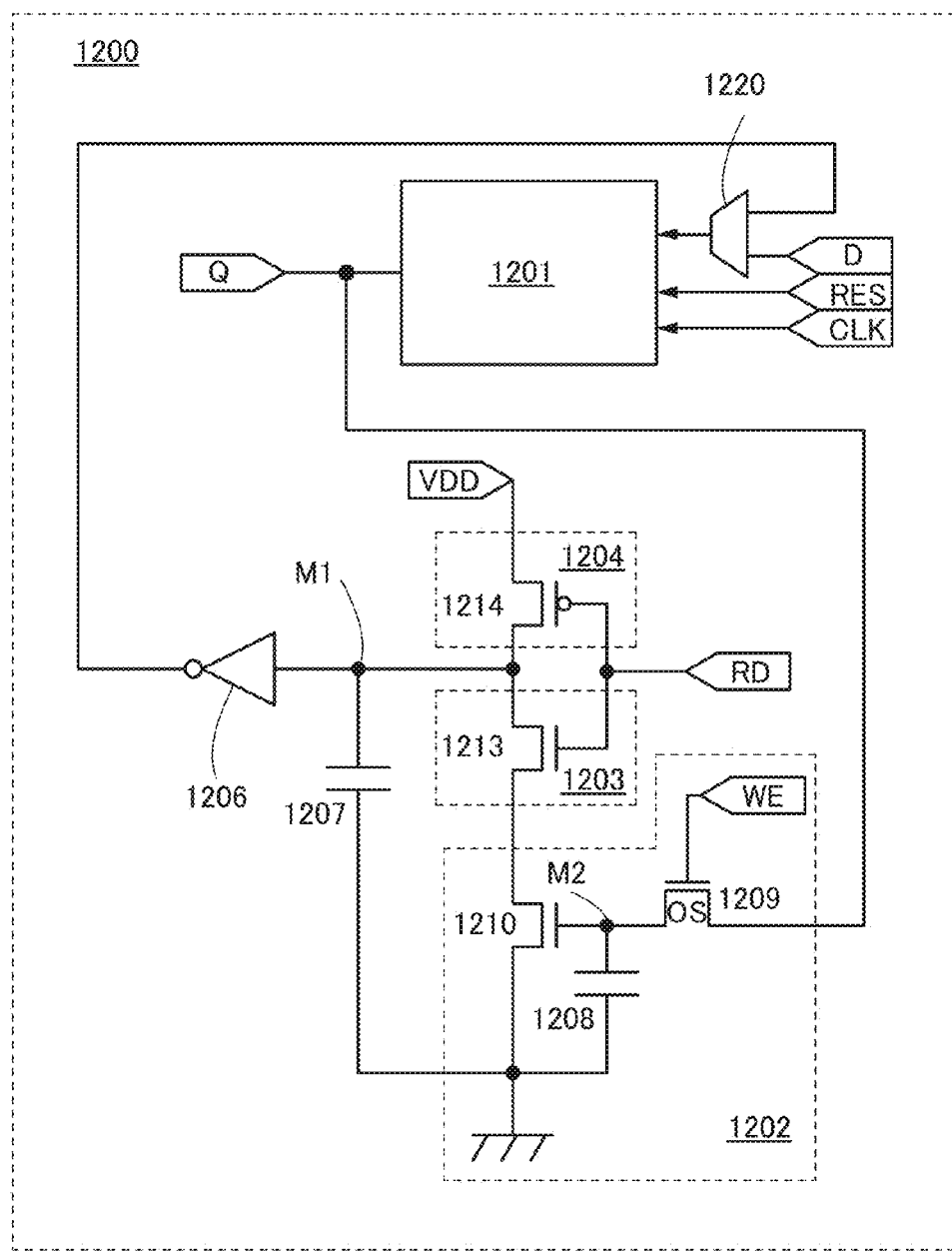
FIG. 60 is a circuit diagram illustrating a semiconductor device of one embodiment of the present invention.

FIG. 60 is an example of a circuit diagram of a memory element 1200 that can be used as the register 1196. The memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 60 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 60, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 60, the transistors included in the memory element 1200 except for the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor may be included besides the transistor 1209, and a transistor in which a channel is formed in a layer formed using a semiconductor other than an oxide semiconductor or in the substrate 1190 can be used for the rest of the transistors.

As the circuit 1201 in FIG. 60, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Thus, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Thus, the power supply can be stopped even for a short time in the processor or one or a plurality of logic circuits included in the processor, resulting in lower power consumption.

Although the memory element 1200 is used in a CPU, the memory element 1200 can also be used in an LSI such as a digital signal processor (DSP), a custom LSI, or a programmable logic device (PLD), and a radio frequency (RF) device.

<Display Device>

A display device of one embodiment of the present invention is described below with reference to FIGS. 61A to 61C and FIGS. 63A and 63B.

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

Figure 61A:
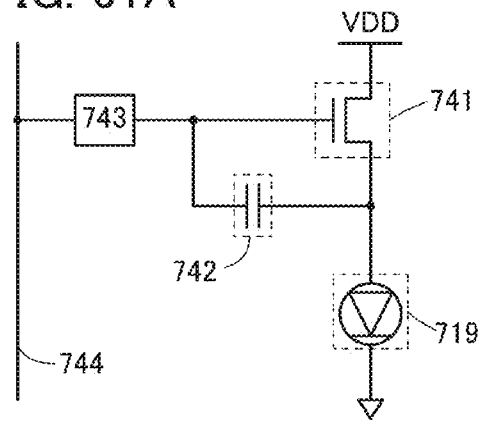
FIGS. 61A to 61C are a circuit diagram, a top view, and a cross-sectional view illustrating a semiconductor device of one embodiment of the present invention.
Figure 61B:
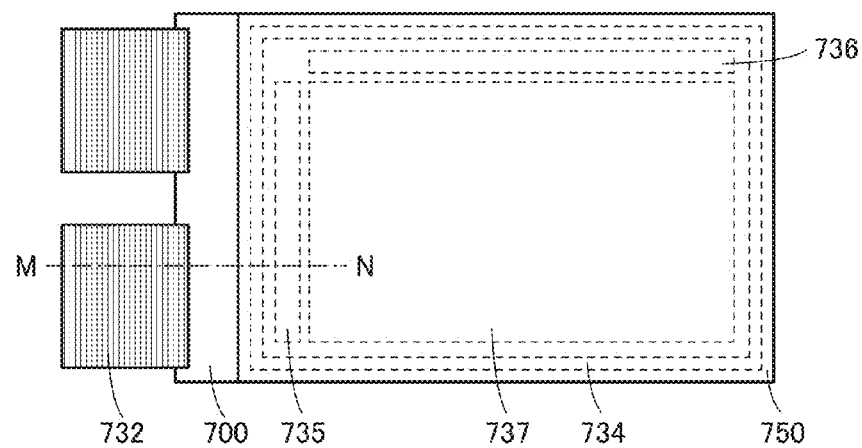
Figure 61C:
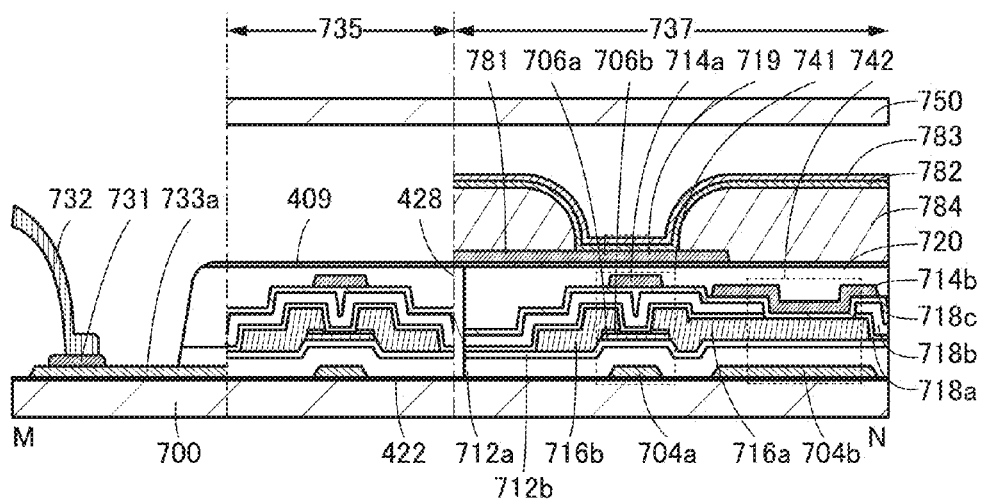

FIGS. 61A to 61C illustrate an example of an EL display device of one embodiment of the present invention. FIG. 61A is a circuit diagram of a pixel in an EL display device. FIG. 61B is a plan view showing the whole of the EL display device. FIG. 61C is a cross-sectional view taken along part of dashed-dotted line M-N in FIG. 61B.

FIG. 61A illustrates an example of a circuit diagram of a pixel used in an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be more than one, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Further, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 61A includes a switching element 743, a transistor 741, a capacitor 742, and a light-emitting element 719.

Note that FIG. 61A and the like each illustrate an example of a circuit structure; therefore, a transistor can be provided additionally. In contrast, for each node in FIG. 61A and the like, it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A drain of the transistor 741 is supplied with a power supply potential VDD. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, any of the above-described transistors can be used, for example.

FIG. 61B is a plan view of the EL display device. The EL display device includes a substrate 700, a substrate 750, the insulator 422, the insulator 428, the insulator 409, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 61C is a cross-sectional view of the EL display device taken along part of dashed-dotted line M-N in FIG. 61B.

FIG. 61C illustrates a structure of the transistor 741 including a conductor 704*a* over the substrate 700; an insulator 712*a* over the conductor 704*a*; an insulator 712*b* over the insulator 712a; a semiconductor 706a and a semiconductor 706b which are over the insulator 712b and overlaps with the conductor 704a; a conductor 716a and a conductor 716b in contact with the semiconductor 706a and the semiconductor 706b; an insulator 718a over the semiconductor 706b, the conductor 716a, and the conductor 716b; an insulator 718b over the insulator 718a; an insulator 718c over the insulator 718b; and a conductor 714a that is over the insulator 718c and overlaps with the semiconductor 706b. Note that the structure of the transistor 741 is just an example; the transistor 741 may have a structure different from that illustrated in FIG. 61C.

Thus, in the transistor 741 illustrated in FIG. 61C, the conductor 704a serves as a gate electrode, the insulator 712a and the insulator 712b serve as a gate insulator, the conductor 716a serves as a source electrode, the conductor 716b serves as a drain electrode, the insulator 718a, the insulator 718b, and the insulator 718c serve as a gate insulator, and the conductor 714a serves as a gate electrode. Note that in some cases, electrical characteristics of the semiconductor 706 change if light enters the semiconductor. To prevent this, it is preferable that one or more of the conductor 704a, the conductor 716a, the conductor 716b, and the conductor 714a have a light-blocking property.

Note that the interface between the insulator 718a and the insulator 718b is indicated by a broken line. This means that the boundary between them is not clear in some cases. For example, in the case where the insulator 718a and the insulator 718b are formed using insulators of the same kind, the insulator 718a and the insulator 718b are not distinguished from each other in some cases depending on an observation method.

FIG. 61C illustrates a structure of the capacitor 742 including a conductor 704b over the substrate; the insulator 712a over the conductor 704b; the insulator 712b over the insulator 712a; the conductor 716a that is over the insulator 712b and overlaps with the conductor 704b; the insulator 718a over the conductor 716a; the insulator 718b over the insulator 718a; the insulator 718c over the insulator 718b; and a conductor 714b that is over the insulator 718c and overlaps with the conductor 716a. In this structure, part of the insulator 718a and part of the insulator 718b are removed in a region where the conductor 716a and the conductor 714b overlap with each other.

In the capacitor 742, each of the conductor 704b and the conductor 714b serves as one electrode, and the conductor 716a serves as the other electrode.

Thus, the capacitor 742 can be formed using a film of the transistor 741. The conductor 704a and the conductor 704b are preferably conductors of the same kind, in which case the conductor 704a and the conductor 704b can be formed through the same step. Furthermore, the conductor 714a and the conductor 714b are preferably conductors of the same kind, in which case the conductor 714a and the conductor 714b can be formed through the same step.

The capacitor 742 illustrated in FIG. 61C has a large capacitance per area occupied by the capacitor. Therefore, the EL display device illustrated in FIG. 61C has high display quality. Note that although the capacitor 742 illustrated in FIG. 61C has the structure in which the part of the insulator 718a and the part of the insulator 718b are removed to reduce the thickness of the region where the conductor 716a and the conductor 714b overlap with each other, the structure of the capacitor according to one embodiment of the present invention is not limited to the structure. For example, a structure in which a part of the insulator 718c is removed to reduce the thickness of the region where the conductor 716a and the conductor 714b overlap with each other may be used.

An insulator 720 is provided over the transistor 741 and the capacitor 742. Here, the insulator 720 may have an opening reaching the conductor 716a that serves as the source electrode of the transistor 741. A conductor 781 is provided over the insulator 720. The conductor 781 may be electrically connected to the transistor 741 through the opening in the insulator 720.

A partition wall 784 having an opening reaching the conductor 781 is provided over the conductor 781. A light-emitting layer 782 in contact with the conductor 781 through the opening provided in the partition wall 784 is provided over the partition wall 784. A conductor 783 is provided over the light-emitting layer 782. A region where the conductor 781, the light-emitting layer 782, and the conductor 783 overlap with one another serves as the light-emitting element 719.

The insulator 422, the insulator 428, and the insulator 409 have barrier properties. This means that the display device illustrated in FIGS. 61A to 61C has a structure in which the transistor 741 is surrounded by insulators having barrier properties. Note that one or more of the insulator 422, the insulator 428, and the insulator 409 are not necessarily provided.

Note that a transistor, a capacitor, a wiring layer, and the like may be stacked to make the EL display device highly integrated.

Figure 62:
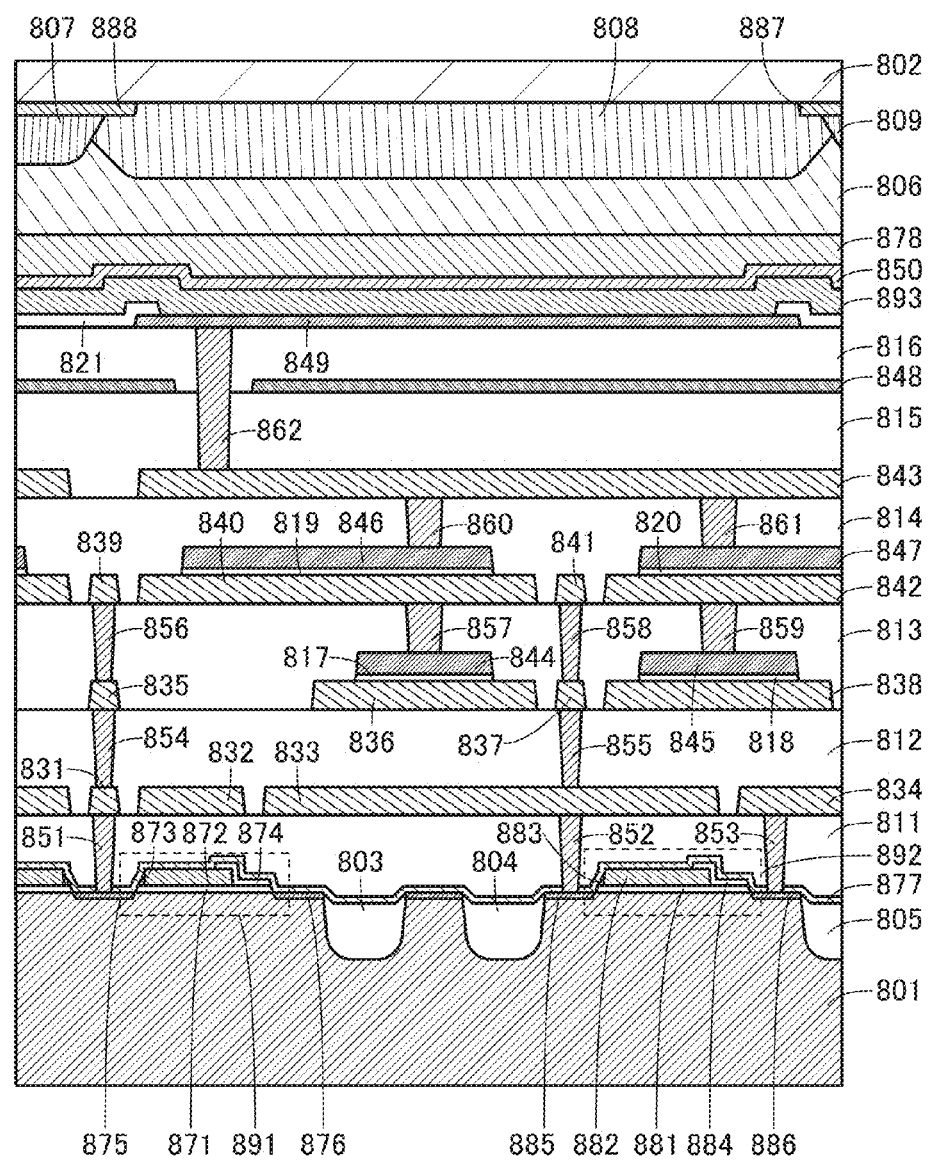
FIG. 62 is a cross-sectional view illustrating a semiconductor device of one embodiment of the present invention.

FIG. 62 is a cross-sectional view illustrating a pixel of an EL display device fabricated over a semiconductor substrate.

The EL display device shown in FIG. 62 includes a semiconductor substrate 801, a substrate 802, an insulator 803, an insulator 804, an insulator 805, an adhesive layer 806, a filter 807, a filter 808, a filter 809, an insulator 811, an insulator 812, an insulator 813, an insulator 814, an insulator 815, an insulator 816, an insulator 817, an insulator 818, an insulator 819, an insulator 820, an insulator 821, a conductor 831, a conductor 832, a conductor 833, a conductor 834, a conductor 835, a conductor 836, a conductor 837, a conductor 838, a conductor 839, a conductor 840, a conductor 841, a conductor 842, a conductor 843, a conductor 844, a conductor 845, a conductor 846, a conductor 847, a conductor 848, a conductor 849, a conductor 850, a conductor 851, a conductor 852, a conductor 853, a conductor 854, a conductor 855, a conductor 856, a conductor 857, a conductor 858, a conductor 859, a conductor 860, a conductor 861, a conductor 862, an insulator 871, a conductor 872, an insulator 873, an insulator 874, a region 875, a region 876, an insulator 877, an insulator 878, an insulator 881, a conductor 882, an insulator 883, an insulator 884, a region 885, a region 886, a layer 887, a layer 888, and a light-emitting layer 893.

A transistor 891 includes the semiconductor substrate 801, the insulator 871, the conductor 872, the insulator 873, the insulator 874, and the region 875 and the region 876. The semiconductor substrate 801 serves as a channel formation region. The insulator 871 has a function of a gate insulator. The conductor 872 has a function of a gate electrode. The insulator 873 has a function of a sidewall insulator. The insulator 874 has a function of a sidewall insulator. The region 875 has a function of a source region and/or a drain region. The region 876 has a function of a source region and/or a drain region.

The conductor 872 includes a region overlapping with part of the semiconductor substrate 801 with the insulator 871 therebetween. The region 875 and the region 876 are regions where impurities are added to the semiconductor substrate 801. In the case where the semiconductor substrate 801 is a silicon substrate, the region 875 and the region 876 may each be a region including a silicide, such as tungsten silicide, titanium silicide, cobalt silicide, or nickel silicide. The region 875 and the region 876 can be formed in a self-aligned manner using the conductor 872, the insulator 873, the insulator 874, and the like, and the region 875 and the region 876 are accordingly located in the semiconductor substrate 801 such that a channel formation region is provided between the region 875 and the region 876.

Since the transistor 891 includes the insulator 873, the region 875 can be distanced from the channel formation region. Owing to the insulator 873, the transistor 891 can be prevented from being broken or degraded by an electric field generated in the region 875. Since the transistor 891 includes the insulator 874, the region 876 can be distanced from the channel formation region. Owing to the insulator 874, the transistor 891 can be prevented from being broken or degraded by an electric field generated in the region 876. Note that in the transistor 891, the distance between the region 876 and a channel formation region is longer than the distance between the region 875 and a channel formation region. This structure can enable both high on-state current and high reliability in the case where a potential difference between the region 876 and a channel formation region is likely to be larger than a potential difference between the region 875 and a channel formation region in operation of the transistor 891.

A transistor 892 includes the semiconductor substrate 801, the insulator 881, the conductor 882, the insulator 883, the insulator 884, the region 885, and the region 886. The semiconductor substrate 801 has a function of a channel formation region. The insulator 881 has a function of a gate insulator. The conductor 882 has a function of a gate electrode. The insulator 883 has a function of a sidewall insulator. The insulator 884 has a function of a sidewall insulator. The region 885 has a function of a source region and/or a drain region. The region 886 has a function of a source and/or a drain region.

The conductor 882 includes a region overlapping with part of the semiconductor substrate 801 with the insulator 881 therebetween. The region 885 and the region 886 are regions where impurities are added to the semiconductor substrate 801. In the case where the semiconductor substrate 801 is a silicon substrate, the region 885 and the region 886 are a region including a silicide. The region 885 and the region 886 can be formed in a self-aligned manner using the conductor 882, the insulator 883, the insulator 884, and the like, and the region 885 and the region 886 are accordingly located in the semiconductor substrate 801 such that a channel formation region is provided between the region 885 and the region 886.

Since the transistor 892 includes the insulator 883, the region 885 can be distanced from the channel formation region. Owing to the insulator 883, the transistor 892 can be prevented from being broken or degraded by an electric field generated in the region 885. Since the transistor 892 includes the insulator 884, the region 886 can be distanced from the channel formation region. Owing to the insulator 884, the transistor 892 can be prevented from being broken or degraded by an electric field generated in the region 886. Note that in the transistor 892, the distance between the region 886 and a channel formation region is longer than the distance between the region 885 and a channel formation region. This structure can enable both high on-state current and high reliability in the case where a potential difference between the region 886 and a channel formation region is likely to be larger than a potential difference between the region 885 and a channel formation region in operation of the transistor 892.

The insulator 877 is located so as to cover the transistor 891 and the transistor 892 and has a function of a protective film for the transistor 891 and the transistor 892. The insulator 803, the insulator 804, and the insulator 805 have a function of separating elements. For example, the transistor 891 and the transistor 892 are isolated from each other with the insulator 803 and the insulator 804 therebetween.

Each of the conductor 851, the conductor 852, the conductor 853, the conductor 854, the conductor 855, the conductor 856, the conductor 857, the conductor 858, the conductor 859, the conductor 860, the conductor 861, and the conductor 862 has a function of electrically connecting elements, an element and a wiring, and wirings, and these conductors can be referred to as a wiring or a plug.

Each of the conductor 831, the conductor 832, the conductor 833, the conductor 834, the conductor 835, the conductor 836, the conductor 837, the conductor 838, the conductor 839, the conductor 840, the conductor 841, the conductor 842, the conductor 843, the conductor 844, the conductor 845, the conductor 846, the conductor 847, the conductor 849, and the conductor 850 has a function of a wiring, an electrode, and/or a light-blocking layer.

For example, the conductor 836 and the conductor 844 each have a function of an electrode of a capacitor including the insulator 817; the conductor 838 and the conductor 845 each have a function of an electrode of a capacitor including the insulator 818; the conductor 840 and the conductor 846 each have a function of an electrode of a capacitor including the insulator 819; and the conductor 842 and the conductor 847 each have a function of an electrode of a capacitor including the insulator 820. Note that the conductor 836 and the conductor 838 may be electrically connected to each other. The conductor 844 and the conductor 845 may be electrically connected to each other. The conductor 840 and the conductor 842 may be electrically connected to each other. The conductor 846 and the conductor 847 may be electrically connected to each other.

Each of the insulator 811, the insulator 812, the insulator 813, the insulator 814, the insulator 815, and the insulator 816 has a function of an interlayer insulator. The top surfaces of the insulator 811, the insulator 812, the insulator 813, the insulator 814, the insulator 815, and the insulator 816 are preferably flat.

The conductor 831, the conductor 832, the conductor 833, and the conductor 834 are provided over the insulator 811. The conductor 851 is provided in an opening in the insulator 811 and electrically connects the conductor 831 and the region 875. The conductor 852 is provided in an opening in the insulator 811 and electrically connects the conductor 833 and the region 885. The conductor 853 is provided in an opening in the insulator 811 and electrically connects the conductor 834 and the region 886.

The conductor 835, the conductor 836, the conductor 837, and the conductor 838 are provided over the insulator 812. The insulator 817 is provided over the conductor 836. The conductor 844 is provided over the insulator 817. The insulator 818 is provided over the conductor 838. The conductor 845 is provided over the insulator 818. The conductor 854 is provided in an opening in the insulator 812. The conductor 854 electrically connects the conductor 835 and the conductor 831. The conductor 855 is provided in an opening in the insulator 812. The conductor 855 electrically connects the conductor 837 and the conductor 833.

The conductor 839, the conductor 840, the conductor 841, and the conductor 842 are provided over the insulator 813. The insulator 819 is provided over the conductor 840. The conductor 846 is provided over the insulator 819. The insulator 820 is provided over the conductor 842. The conductor 847 is provided over the insulator 820. The conductor 856 is provided in an opening in the insulator 813. The conductor 856 electrically connects the conductor 839 and the conductor 835. The conductor 857 is provided in an opening in the insulator 813. The conductor 857 electrically connects the conductor 840 and the conductor 844. The conductor 858 is provided in an opening in the insulator 813. The conductor 858 electrically connects the conductor 841 and the conductor 837. The conductor 859 is provided in an opening in the insulator 813. The conductor 859 electrically connects the conductor 842 and the conductor 845.

The conductor 843 is provided over the insulator 814. The conductor 860 is provided in an opening in the insulator 814. The conductor 860 electrically connects the conductor 843 and the conductor 846. The conductor 861 is provided in an opening in the insulator 814. The conductor 860 electrically connects the conductor 843 and the conductor 846.

The conductor 848 is provided over the insulator 815 and may be electrically floating. Note that the conductor 848 is not limited to a conductor as long as it has a function of a light-blocking layer: for example, the conductor 848 may be an insulator or a semiconductor having a light-blocking property.

The conductor 849 is provided over the insulator 816. The insulator 821 is provided over the insulator 816 and the conductor 849. The insulator 821 includes an opening exposing the conductor 849. The light-emitting layer 893 is provided over the conductor 849 and the insulator 821. The conductor 850 is provided over the light-emitting layer 893.

The light-emitting layer 893 emits light by a potential difference between the conductor 849 and the conductor 850; thus, the conductor 849, the conductor 850, and the light-emitting layer 893 form a light-emitting element. Note that the insulator 821 has a function of a partition wall.

The insulator 878 is provided over the conductor 850. The insulator 878 covers the light-emitting element and has a function of a protective insulator. The insulator 878 may have a barrier property or may form a structure in which the light-emitting element is surrounded by insulators having barrier properties, for example.

A substrate having a light-transmitting property can be used as the substrate 802. For example, the substrate 750 can be referred to for the substrate 802. The layer 887 and the layer 888 are provided on the substrate 802. The layer 887 and the layer 888 each have a function of a light-blocking layer. A resin, a metal, or the like can be used for the light-blocking layer. The layer 887 and the layer 888 can improve the contrast and reduce color bleeding in the EL display device.

Each of the filter 807, the filter 808, and the filter 809 has a function of a color filter. The filter 2054 can be referred to for the filter 807, the filter 808, and the filter 809, for example. The filter 808 has a region overlapping with the layer 888, the substrate 802, and the layer 887. The filter 807 has a region overlapping with the filter 808 on the layer 888. The filter 809 has a region overlapping with the filter 808 on the layer 887. The filter 807, the filter 808, and the filter 809 may have different thicknesses, in which case light might be extracted more efficiently from the light-emitting element.

An adhesive layer 806 is provided between the insulator 878 and the filter 807, the filter 808, and the filter 809.

Because the EL display device in FIG. 62 has a stacked-layer structure of the transistor, the capacitor, the wiring layer, and the like, the pixel area can be reduced. A highly integrated EL display device can be provided.

So far, examples of the EL display device are described. Next, an example of a liquid crystal display device is described.

Figure 63A:
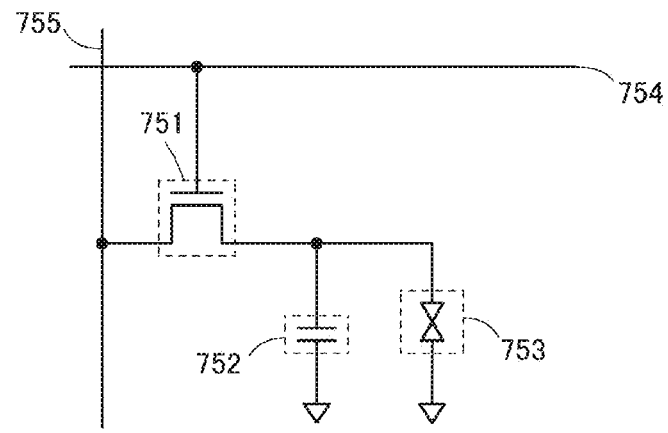
FIGS. 63A and 63B are a circuit diagram and a cross-sectional view illustrating a semiconductor device of one embodiment of the present invention.

FIG. 63A is a circuit diagram illustrating a configuration example of a pixel of a liquid crystal display device. A pixel shown in FIGS. 63A and 63B includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring for supplying a common potential.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the other electrode of the liquid crystal element 753.

Figure 63B:
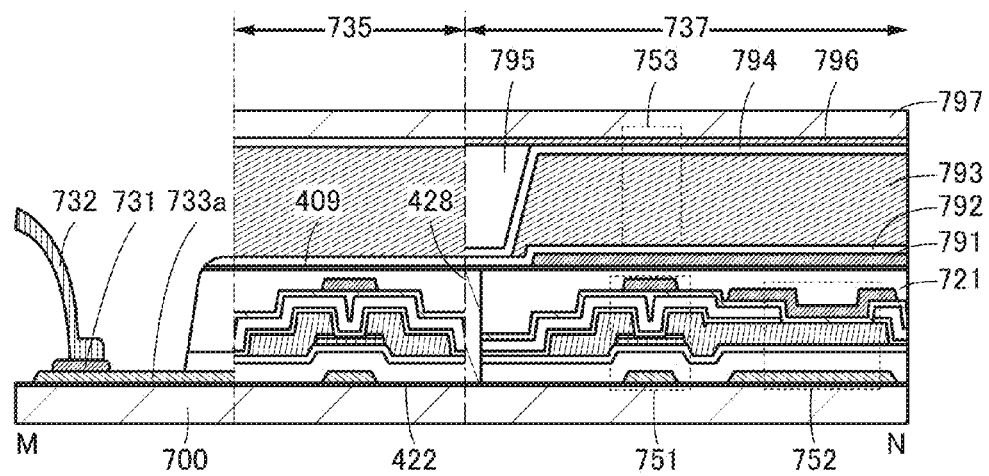

Note that the description of the liquid crystal display device is made on the assumption that the plan view of the liquid crystal display device is similar to that of the EL display device. FIG. 63B is a cross-sectional view of the liquid crystal display device taken along dashed-dotted line M-N in FIG. 61B. In FIG. 63B, the FPC 732 is connected to the wiring 733a via the terminal 731. Note that the wiring 733a may be formed using the same kind of conductor as the conductor of the transistor 751 or using the same kind of semiconductor as the semiconductor of the transistor 751.

For the transistor 751, refer to the description of the transistor 741. For the capacitor 752, refer to the description of the capacitor 742. Note that the structure of the capacitor 752 in FIG. 63B corresponds to, but is not limited to, the structure of the capacitor 742 in FIG. 61C.

Note that in the case where an oxide semiconductor is used as the semiconductor of the transistor 751, the off-state current of the transistor 751 can be extremely small. Therefore, an electric charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulator 721 is provided over the transistor 751 and the capacitor 752. The insulator 721 has an opening reaching the transistor 751. A conductor 791 is provided over the insulator 721. The conductor 791 is electrically connected to the transistor 751 through the opening in the insulator 721.

The insulator 422, the insulator 428, and the insulator 409 have barrier properties. This means that the display device illustrated in FIGS. 63A and 63B has a structure in which the transistor 751 is surrounded by insulators having barrier properties. Note that one or more of the insulator 422, the insulator 428, and the insulator 409 are not necessarily provided.

An insulator 792 serving as an alignment film is provided over the conductor 791. A liquid crystal layer 793 is provided over the insulator 792. An insulator 794 serving as an alignment film is provided over the liquid crystal layer 793. A spacer 795 is provided over the insulator 794. A conductor 796 is provided over the spacer 795 and the insulator 794. A substrate 797 is provided over the conductor 796.

Owing to the above-described structure, a display device including a capacitor occupying a small area, a display device with high display quality, or a high-resolution display device can be provided.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of an EL element; a light-emitting diode (LED) for white, red, green, blue, or the like; a transistor (a transistor that emits light depending on current); an electron emitter; a liquid crystal element; electronic ink; an electrophoretic element; a plasma display panel (PDP); a display element using micro electro mechanical systems (MEMS) such as a grating light valve (GLV), a digital micromirror device (DMD), a digital micro shutter (DMS), an interferometric modulator display (IMOD) element, a MEMS shutter display element, an optical-interference-type MEMS display element, or a piezoelectric ceramic display; an electrowetting element; a display element including a carbon nanotube; and quantum dots. Other than the above, display media whose contrast, luminance, reflectivity, transmittance, or the like is changed by electrical or magnetic effect may be included.

Examples of display devices including having EL elements include an EL display. Examples of display devices having electron emitters are a field emission display (FED) and an SED-type flat panel display (SED: surface-conduction electron-emitter display). Examples of display devices containing quantum dots in each pixel include a quantum dot display. The quantum dots are placed in a display element, in a backlight, or between the backlight and the display element. With the use of the quantum dots, a display device with high color purity can be fabricated. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device having electronic ink or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

Note that in the case of using an LED chip, graphene or graphite may be provided under an electrode or a nitride semiconductor of the LED chip. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED chip can be formed. Note that an AlN layer may be provided between the n-type GaN semiconductor including crystals and graphene or graphite. The GaN semiconductors included in the LED chip may be formed by MOCVD. Note that when the graphene is provided, the GaN semiconductors included in the LED chip can also be formed by a sputtering method.

In a display device including MEMS, a dry agent may be provided in a space where a display element is sealed (or between an element substrate over which the display element is placed and a counter substrate opposed to the element substrate, for example). The dry agent can remove moisture and thus can prevent malfunction or degradation of the MEMS or the like.

<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 64A to 64F illustrate specific examples of these electronic devices.

Figure 64A:
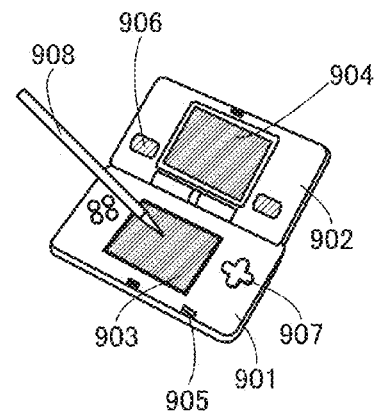
FIGS. 64A to 64F are perspective views each illustrating an electronic device of one embodiment of the present invention.

FIG. 64A illustrates a portable game console including a housing 901, a housing 902, a display portion 903, a display portion 904, a microphone 905, a speaker 906, an operation key 907, a stylus 908, and the like. Although the portable game console in FIG. 64A has the two display portions 903 and 904, the number of display portions included in a portable game console is not limited to this.

Figure 64B:
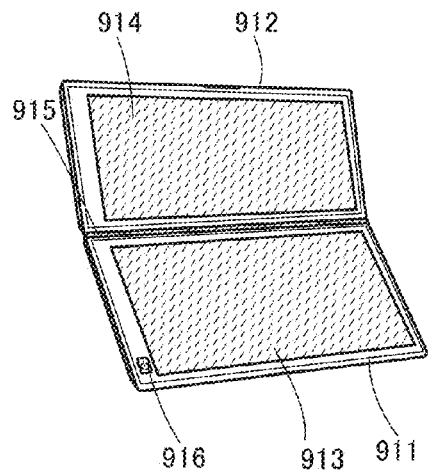

FIG. 64B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched in accordance with the angle at the joint 915 between the first housing 911 and the second housing 912. A display device with a position input function may be used as at least one of the first display portion 913 and the second display portion 914. Note that the position input function can be added by providing a touch panel in a display device. Alternatively, the position input function can be added by providing a photoelectric conversion element called a photosensor in a pixel portion of a display device.

Figure 64C:
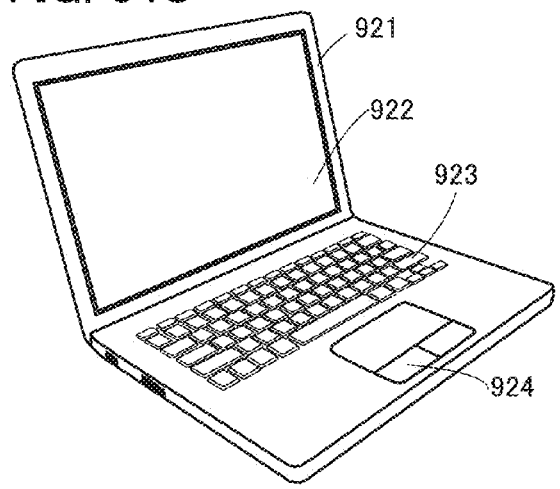

FIG. 64C illustrates a notebook personal computer, which includes a housing 921, a display portion 922, a keyboard 923, a pointing device 924, and the like.

Figure 64D:
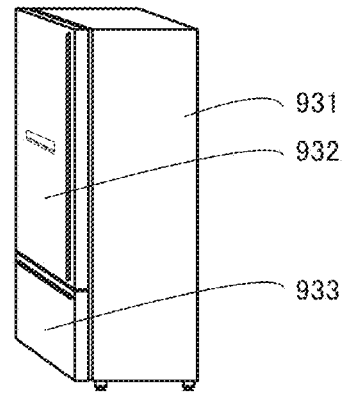

FIG. 64D illustrates an electric refrigerator-freezer, which includes a housing 931, a refrigerator door 932, a freezer door 933, and the like.

Figure 64E:
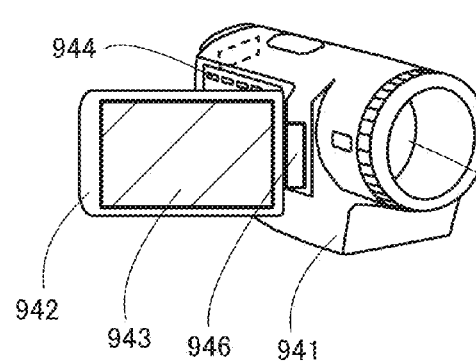

FIG. 64E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 64F:
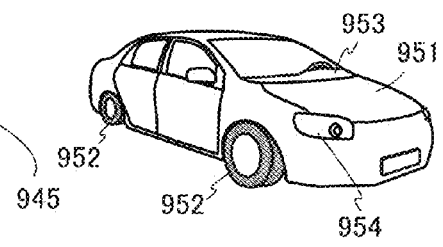

FIG. 64F illustrates a car including a car body 951, a wheel 952, a dashboard 953, a light 954, and the like.

EXPLANATION OF REFERENCE

100: target, 100a: target, 100b: target, 101: deposition chamber, 103b: magnet unit, 110: backing plate, 110a: backing plate, 110b: backing plate, 120: target holder, 120a: target holder, 120b: target holder, 122: target shield, 123: target shield, 130: magnet unit, 130a: magnet unit, 130b: magnet unit, 130N: magnet, 130N1: magnet, 130N2: magnet, 130S: magnet, 132: magnet holder, 140: plasma, 142: member, 160: substrate, 170: substrate holder, 180a: magnetic force line, 180b: magnetic force line, 190: power source, 191: power source, 200: pellet, 201: ion, 202: lateral growth portion, 203: particle, 210: backing plate, 220: substrate, 230: target, 250: magnet, 310: layer, 400: substrate, 401: insulator, 402: insulator, 404: conductor, 406a: semiconductor, 406b: semiconductor, 406c: semiconductor, 408: insulator, 409: insulator, 410a: insulator, 410b: insulator, 412: insulator, 413: conductor, 416a: conductor, 416b: conductor, 422: insulator, 428: insulator, 450: semiconductor substrate, 452: insulator, 454: conductor, 456: region, 460: region, 462: insulator, 464: insulator, 466: insulator, 468: insulator, 472a: region, 472b: region, 474a: conductor, 474b: conductor, 474c: conductor, 476a: conductor, 476b: conductor, 478a: conductor, 478b: conductor, 478c: conductor, 480a: conductor, 480b: conductor, 480c: conductor, 490: insulator, 492: insulator, 494: insulator, 496a: conductor, 496b: conductor, 496c: conductor, 496d: conductor, 498: conductor, 498a: conductor, 498b: conductor, 498c: conductor, 498d: conductor, 500: substrate, 502: insulator, 503: insulator, 504: conductor, 506a: semiconductor, 506b: semiconductor, 506c: semiconductor, 508: insulator, 512: insulator, 513: conductor, 514: conductor, 516a: conductor, 516b: conductor, 700: substrate, 704a: conductor, 704b: conductor, 706: semiconductor, 706a: semiconductor, 706b: semiconductor, 712a: insulator, 712b: insulator, 714a: conductor, 714b: conductor, 716a: conductor, 716b: conductor, 718a: insulator, 718b: insulator, 718c: insulator, 719: light-emitting element, 720: insulator, 721: insulator, 731: terminal, 732: FPC, 733a: wiring, 734: sealant, 735: driver circuit, 736: driver circuit, 737: pixel, 741: transistor, 742: capacitor, 743: switching element, 744: signal line, 751: transistor, 752: capacitor, 753: liquid crystal element, 754: scan line, 755: signal line, 781: conductor, 782: light-emitting layer, 783: conductor, 784: partition, 791: conductor, 792: insulator, 793: liquid crystal layer, 794: insulator, 795: spacer, 796: conductor, 801: semiconductor substrate, 802: substrate, 803: insulator, 804: insulator, 805: insulator, 806: adhesive layer, 807: filter, 808: filter, 809: filter, 811: insulator, 812: insulator, 813: insulator, 814: insulator, 815: insulator, 816: insulator, 817: insulator, 818: insulator, 819: insulator, 820: insulator, 821: insulator, 831: conductor, 832: conductor, 833: conductor, 834: conductor, 835: conductor, 836: conductor, 837: conductor, 838: conductor, 839: conductor, 840: conductor, 841: conductor, 842: conductor, 843: conductor, 844: conductor, 845: conductor, 846: conductor, 847: conductor, 848: conductor, 849: conductor, 850: conductor, 851: conductor, 852: conductor, 853: conductor, 854: conductor, 855: conductor, 856: conductor, 857: conductor, 858: conductor, 859: conductor, 860: conductor, 861: conductor, 862: conductor, 871: insulator, 872: conductor, 873: insulator, 874: insulator, 875: region, 876: region, 877: insulator, 878: insulator, 881: insulator, 882: conductor, 883: insulator, 884: insulator, 885: region, 886: region, 887: layer, 888: layer, 891: transistor, 892: transistor, 893: light-emitting layer, 901: housing, 902: housing, 903: display portion, 904: display portion, 905: microphone, 906: speaker, 907: operation key, 908: stylus, 911: housing, 912: housing, 913: display portion, 914: display portion, 915: connection portion, 916: operation key, 921: housing, 922: display portion, 923: keyboard, 924: pointing device, 931: housing, 932: refrigerator door, 933: freezer door, 941: housing, 942: housing, 943: display portion, 944: operation key, 945: lens, 946: connection portion, 951: car body, 952: wheel, 953: dashboard, 954: light, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 1200: memory element, 1201: circuit, 1202: circuit, 1203: switch, 1204: switch, 1206: logic element, 1207: capacitor, 1208: capacitor, 1209: transistor, 1210: transistor, 1213: transistor, 1214: transistor, 1220: circuit, 2000: imaging device, 2001: switch, 2002: switch, 2003: switch, 2010: pixel portion, 2011: pixel, 2012: subpixel, 2012B: subpixel, 2012G: subpixel, 2012R: subpixel, 2020: photoelectric conversion element, 2030: pixel circuit, 2031: wiring, 2047: wiring, 2048: wiring, 2049: wiring, 2050: wiring, 2053: wiring, 2054: filter, 2054B: filter, 2054G: filter, 2054R: filter, 2055: lens, 2056: light, 2057: wiring, 2060: peripheral circuit, 2070: peripheral circuit, 2080: peripheral circuit, 2090: peripheral circuit, 2091: light source, 2100: transistor, 2200: transistor, 2300: silicon substrate, 2310: layer, 2320: layer, 2330: layer, 2340: layer, 2351: transistor, 2352: transistor, 2353: transistor, 2354: filter, 2355: lens, 2360: photodiode, 2361: anode, 2363: low-resistance region, 2370: plug, 2371: wiring, 2372: wiring, 2373: wiring, 2409: insulator, 2418: insulator, 2422: insulator, 2700: deposition apparatus, 2701: atmosphere-side substrate supply chamber, 2702: atmosphere-side substrate transfer chamber, 2703a: load lock chamber, 2703b: unload lock chamber, 2704: transfer chamber, 2705: substrate heating chamber, 2706a: deposition chamber, 2706b: deposition chamber, 2706c: deposition chamber, 2751: cryotrap, 2752: stage, 2761: cassette port, 2762: alignment port, 2763: transfer robot, 2764: gate valve, 2765: heating stage, 2766: target, 2766a: target, 2766b: target, 2767: target shield, 2767a: target shield, 2767b: target shield, 2768: substrate holder, 2769: substrate, 2770: vacuum pump, 2771: cryopump, 2772: turbo molecular pump, 2780: mass flow controller, 2781: refiner, 2782: gas heating system, 2784: adjustment member, 2790a: magnet unit, 2790b: magnet unit, 2791: power source, 2797: substrate, 3001: wiring, 3002: wiring, 3003: wiring, 3004: wiring, 3005: wiring, 3200: transistor, 3300: transistor, and 3400: capacitor.

This application is based on Japanese Patent Application serial no. 2015-018610 filed with Japan Patent Office on Feb. 2, 2015, the entire contents of which are hereby incorporated by reference.

The invention claimed is:

1. An oxide comprising:
a homologous structure comprising indium, an element M, and zinc,
wherein the element M is one of aluminum, gallium, yttrium, and tin,
wherein the oxide includes a hexagonal atomic arrangement in the case of a single crystal,
wherein the oxide includes a lattice point group observed through an analysis of a first region in a transmission electron microscopy image of a top surface of the oxide, and
wherein a proportion of hexagonal Voronoi regions to all Voronoi regions in a Voronoi diagram obtained through a Voronoi analysis of the lattice point group is higher than or equal to 78% and lower than or equal to 100%.

2. The oxide according to claim 1,
wherein the first region is subjected to fast Fourier transform to obtain a first image,
wherein the first image is subjected to mask processing except for a range from 2.8 $nm^{-1}$ to 5.0 $nm^{-1}$ to obtain a second image,
wherein the second image is subjected to inverse fast Fourier transform to obtain a third image,
wherein noise is removed from the third image to obtain a fourth image, and
wherein lattice points included in the lattice point group are points with maximal luminance in the fourth image.

3. The oxide according to claim 2, wherein luminance within a 0.05-nm radius in the third image is averaged to remove the noise.

4. The oxide according to claim 3,
wherein a first step of extracting a second point with highest luminance within a 0.22-nm radius from a first point and a second step of extracting a third point with highest luminance within a 0.22-nm radius from the second point are repeated until a point with highest luminance is fixed as one of the points with maximal luminance, and
wherein the others of the points with maximal luminance are determined in a manner similar to that for the one of the points with maximal luminance using a point more than 0.22 nm away from the one of the points with maximal luminance as the first point.

5. An oxide comprising:
a homologous structure comprising indium, an element M, and zinc,
wherein the element M is one of aluminum, gallium, yttrium, and tin,
wherein the oxide includes a hexagonal atomic arrangement in the case of a single crystal,
wherein the oxide includes a lattice point group observed through an analysis of a first region in a transmission electron microscopy image of a top surface of the oxide,
wherein the lattice point group comprises lattice points comprising a first lattice point, and second to seventh lattice points adjacent to the first lattice point,
wherein to obtain a strain rate, a regular hexagon in which a distance between a center point and a vertex is an average distance between the first lattice point and each of the second to seventh lattice points is provided such that the center point overlaps with the first lattice point; the regular hexagon is rotated around the center point such that an average deviation amount between the vertex of the regular hexagon and each of the second to seventh lattice points becomes as small as possible; and the average deviation amount is divided by the distance between the center point and the vertex of the regular hexagon, and
wherein an average strain rate in the first region is less than 0.2.

6. The oxide according to claim 5,
wherein the first region is subjected to fast Fourier transform to obtain a first image,
wherein the first image is subjected to mask processing except for a range from 2.8 $nm^{-1}$ to 5.0 $nm^{-1}$ to obtain a second image,
wherein the second image is subjected to inverse fast Fourier transform to obtain a third image,
wherein noise is removed from the third image to obtain a fourth image, and
wherein the lattice points included in the lattice point group are points with maximal luminance in the fourth image.

7. The oxide according to claim 6, wherein luminance within a 0.05-nm radius in the third image is averaged to remove the noise.

8. The oxide according to claim 7,
wherein a first step of extracting a second point with highest luminance within a 0.22-nm radius from a first point and a second step of extracting a third point with highest luminance within a 0.22-nm radius from the second point are repeated until a point with highest luminance is fixed as one of the points with maximal luminance, and
wherein the others of the points with maximal luminance are determined in a manner similar to that for the one of the points with maximal luminance using a point more than 0.22 nm away from the one of the points with maximal luminance as the first point.

9. An oxide comprising:
indium, an element M, and zinc,
wherein the element M is one of aluminum, gallium, yttrium, and tin,
wherein a crystal structure in the oxide is capable of having a homologous structure,
wherein the oxide includes a plurality of flat-plate-like crystal regions,
wherein c-axes of the plurality of flat-plate-like crystal regions are approximately parallel to a normal vector of a top surface of the oxide,
wherein an average size of the plurality of flat-plate-like crystal regions in a direction parallel to the top surface of the oxide is larger than 3 nm in a transmission electron microscopy image of a cross section of the oxide taken along a plane perpendicular to the top surface, and
wherein no clear grain boundary is observed between the plurality of flat-plate-like crystal regions.

* * * * *